US 012414461B2

(12) United States Patent
Park et al.

(10) Patent No.: US 12,414,461 B2
(45) Date of Patent: Sep. 9, 2025

(54) METHOD OF MANUFACTURING ORGANIC OPTOELECTRONIC DEVICE, AND ORGANIC OPTOELECTRONIC DEVICE AND DISPLAY DEVICE

(71) Applicant: SAMSUNG SDI CO., LTD., Yongin-si (KR)

(72) Inventors: Sun-Ha Park, Suwon-si (KR); Gi-Wook Kang, Suwon-si (KR); Eui-Su Kang, Suwon-si (KR); Hun Kim, Suwon-si (KR); Jae-Jin Oh, Suwon-si (KR); Dong-Kyu Ryu, Suwon-si (KR); Sang-Shin Lee, Suwon-si (KR); Han-Ill Lee, Suwon-si (KR); Soo-Hyun Min, Suwon-si (KR); Min-Jee Park, Suwon-si (KR); Eun-Sun Yu, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 1170 days.

(21) Appl. No.: 17/163,861

(22) Filed: Feb. 1, 2021

(65) Prior Publication Data
US 2021/0175428 A1     Jun. 10, 2021

Related U.S. Application Data

(63) Continuation of application No. 14/903,197, filed as application No. PCT/KR2014/005306 on Jun. 17, 2014, now abandoned.

(30) Foreign Application Priority Data

Oct. 11, 2013    (KR) .................. 10-2013-0121569

(51) Int. Cl.
*H10K 85/60*     (2023.01)
*C09K 11/02*     (2006.01)
(Continued)

(52) U.S. Cl.
CPC ............ *H10K 85/622* (2023.02); *C09K 11/02* (2013.01); *C09K 11/06* (2013.01); *C23C 14/02* (2013.01);
(Continued)

(58) Field of Classification Search
None
See application file for complete search history.

(56) References Cited

U.S. PATENT DOCUMENTS 5,853,905 A     12/1998   So et al.
2004/0016907 A1*  1/2004  Shi .................. H10K 71/30
                                                    428/917
(Continued)

FOREIGN PATENT DOCUMENTS

CN    101355140 A    1/2009
CN    103155201 A    6/2013
(Continued)

OTHER PUBLICATIONS

EP Third Party Observations received in EP 22159528.3 and EP 22159531.7 dated Apr. 5, 2023.
(Continued)

*Primary Examiner* — Michael P. Rodriguez
(74) *Attorney, Agent, or Firm* — Lee IP Law, P.C.

(57) ABSTRACT

Disclosed are an organic alloy for an organic optoelectric device that is an organic alloy of at least two kinds of organic compounds, the at least two kinds of organic compounds includes a first organic compound and a second organic compound, a difference between evaporation temperatures of the first organic compound and the second organic compound is less than or equal to about 20° C. at less than or equal to about $10^{-3}$ torr, and a light emitting wavelength of the organic alloy is different from light emitting wavelengths of the first organic compound, the second organic (Continued)

compound, and a simple mixture of the first organic compound and the second organic compound, and an organic optoelectric device and a display device including the organic alloy.

19 Claims, 3 Drawing Sheets

(51) Int. Cl.
    *C09K 11/06*     (2006.01)
    *C23C 14/02*     (2006.01)
    *H10K 50/11*     (2023.01)
    *H10K 101/10*     (2023.01)

(52) U.S. Cl.
    CPC ......... *H10K 85/615* (2023.02); *H10K 85/654* (2023.02); *H10K 85/6572* (2023.02); *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/1088* (2013.01); *C09K 2211/1092* (2013.01); *H10K 50/11* (2023.02); *H10K 2101/10* (2023.02); *Y02E 10/549* (2013.01)

(56) References Cited

U.S. PATENT DOCUMENTS

| | | | |
|---|---|---|---|
| 2005/0056960 A1* | 3/2005 | Ghosh .............. | C23C 14/12 |
| | | | 264/102 |
| 2006/0103298 A1 | 5/2006 | Lee | |
| 2006/0134464 A1† | 6/2006 | Nariyuki | |
| 2008/0017852 A1 | 1/2008 | Huh et al. | |
| 2011/0233457 A1 | 9/2011 | Hyuga | |
| 2012/0205632 A1 | 8/2012 | Shitagaki et al. | |
| 2012/0211736 A1 | 8/2012 | Kim et al. | |
| 2013/0112952 A1* | 5/2013 | Adamovich ......... | H10K 85/622 |
| | | | 252/500 |
| 2013/0221278 A1 | 8/2013 | Inoue et al. | |
| 2014/0284584 A1 | 9/2014 | Zheng | |
| 2014/0367645 A1* | 12/2014 | Seo .............. | H10K 85/649 |
| | | | 257/40 |
| 2015/0214489 A1 | 7/2015 | Parham et al. | |
| 2016/0141505 A1 | 5/2016 | Park et al. | |

FOREIGN PATENT DOCUMENTS

| | | |
|---|---|---|
| CN | 105378028 A | 3/2016 |
| EP | 1156536 A2 | 11/2001 |
| JP | 2000-223268 A | 8/2000 |
| JP | 3139321 B2 | 2/2001 |
| JP | 2002-25770 A | 1/2002 |
| JP | 2002-025770 A | 1/2002 |
| JP | 2002-146516 A | 5/2002 |
| JP | 2003-045650 A | 2/2003 |
| JP | 2003-347059 A | 12/2003 |
| JP | 2004-152698 A | 5/2004 |
| JP | 2005-276801 A | 10/2005 |
| JP | 2006-203172 A | 8/2006 |
| JP | 2007-266046 A | 10/2007 |
| JP | 2007-270280 A | 10/2007 |
| JP | 2010-206191 A | 9/2010 |
| JP | 2011-199174 A | 10/2011 |
| JP | 2012-059904 A | 3/2012 |
| JP | 2012-186461 A | 9/2012 |
| JP | 2012-195140 A | 10/2012 |
| JP | 2012-212879 A | 11/2012 |
| JP | 2013-530515 A | 7/2013 |
| JP | 2013-199473 A | 10/2013 |
| JP | 2016-535942 A | 11/2016 |
| KR | 10-2010-0063713 A | 6/2010 |
| KR | 10-2011-0041729 A | 4/2011 |
| KR | 10-2011-0122051 A | 11/2011 |
| KR | 10-2012-0012431 A | 2/2012 |
| KR | 10-2012-0116282 A | 10/2012 |
| KR | 10-2013-0073023 A | 7/2013 |
| KR | 10-2014-0135524 A | 11/2014 |
| KR | 10-2015-0028579 A | 3/2015 |
| TW | 201326121 A1 | 7/2013 |
| TW | 201331340 A1 | 8/2013 |
| TW | 201332970 A1 | 8/2013 |
| TW | 201335155 A1 | 9/2013 |
| TW | 201336836 A | 9/2013 |
| WO | WO 2010/035446 A1 | 4/2010 |
| WO | WO 2010/116759 A1 | 10/2010 |
| WO | WO 2011/136755 A1 | 11/2011 |
| WO | WO 2011/162162 A1 | 12/2011 |
| WO | WO 2012/098927 A1 | 7/2012 |

OTHER PUBLICATIONS

Decision on U.S. Appl. No. 14/903,197, cited in EP Party Observations.
European Search Report issued in EP No. 22159531.7 dated Jun. 1, 2022.
European Search Report issued in EP No. 22159528.3 dated Jun. 2, 2022.
Japanese Office action dated Apr. 2, 2024.
European Office action dated Dec. 4, 2020.
Japanese Office action dated Jan. 26, 2021.
Vi-En Choong, "Efficient and durable organic alloys for electroluminescent displays", J. Phys. D: Appl, Phys. Dec. 31, 2000.
Examiner's Answer received in Co Pending U.S. Appl. No. 14/903,197 dated Aug. 4, 2021.
Ali et al. "Photoluminescence Quenching, and Photoconductivity in Devices Using 3,6-Diaryl-N-Hexylcarbazole", J. Phys. Chem., 116, 1298-1306. (2012).
CAS Registry Entries 65181-78-4, 1227931-42-1, 1227931-43-2, SciFinder®. Web, Apr. 3, 2018.
Choong, Vi-En, et al., "Efficient and Durable Organic Alloys for Electroluminescent Displays", J. Phys. D: Appl. Phys. 33, 760-763 (2000).
Kishore, V.V.N. Ravi, et al., "Transient Electroluminescence in Organic Alloy Light-Emitting Diodes", Synthetic Metals 146, 347-350 (2004).
Kishore, V.V.N. Ravi, et al., "Transient Electroluminescence in Alloy-Based Organic Light Emitting Diodes", Synthetic Metals 143, 295-303 (2004).
Kwon, et al., Machine Translation—WO 2011/162162 A1, pp. 1-29, (2011).
Larranaga, et al., Hawley's Condensed Chemical Dictionary (16$^{th}$ Edition), John Wiley & Sons, "Evaporation" on p. 601 (2016).
"Liqefy, V." Oxford English Dictionary Online, Oxford University Press, Web.11 (Apr. 2018).
Mattox, Handbook of Physical Vapor Deposition (PVD) Processing ($2^{nd}$ Edition), Elsevier, Chapter 1, pp. 2-3, pp. 221-222 (2010).
Murata, et al., Turning of Multi-Instabilities in Organic Alloy, [(EDO-TTF)$_{1-x}$ (MEEDO-TTF)$_x$]$_2$PF$_6$, 1.Chemistry of Materials, vol. 22, No. 10, pp. 3121-3132 (2010).
Nayak, et al., Red Shifted Electroluminescence in OLEDs Using Organic Alloy of Hole Transport Materials, IEEE, Piscataway, NJ, USA, pp. 567-568 (Dec. 16, 2007).
Nayak, et al. Pure Exciplex Electroluminexcence in Flended Film of Small Organic Molecules, Synthetic Metals 160, 722-727, (Feb. 2, 2010).
Popovic, et al., OLEDs With Enhanced High Temperature Operational Stability, SPIE,—International Society for Optical Engineering. Proceedings, vol. 4800, p. 87-92, (Mar. 3, 2003).
Shen, Jun, et al., "Carrier Transport in Organic Alloy Light Emitting Diodes", Journal of Applied Physics, vol. 87, No. 8, 3891-3895, (Apr. 15, 2000).
Taiwanese Search Report dated Feb. 15, 2016 in Corresponding Taiwanese Patent Application No. 103128224.

(56) References Cited

OTHER PUBLICATIONS

Extended European search report of EP 14852613.0, issued on Apr. 18, 2017.
European Office action dated Sep. 30, 2020.
Search Report dated Dec. 5, 2016, attached to tOffice Action dated Dec. 20, 2016, of corresponding Chinese Patent Application No. 201480050831.8.
U.S. Office action received in co-pending U.S. Appl. No. 18/108,805, dated Aug. 15, 2024.

\* cited by examiner
† cited by third party

METHOD OF MANUFACTURING ORGANIC OPTOELECTRONIC DEVICE, AND ORGANIC OPTOELECTRONIC DEVICE AND DISPLAY DEVICE

CROSS REFERENCE TO RELATED APPLICATIONS

This is a continuation application based on pending application Ser. No. 14/903,197, filed Jan. 6, 2016. Ser. No. 14/903,197 is the U.S. national phase application based on PCT Application No. PCT/KR2014/005306, filed Jun. 17, 2014, which is based on Korean Patent Application No. 10-2013-0121569, filed Oct. 11, 2013, the entire contents of all of which are hereby incorporated by reference.

TECHNICAL FIELD

An organic alloy for an organic optoelectric device, an organic optoelectric device, and a display device are disclosed.

BACKGROUND ART

An organic optoelectric device is a device that converts electrical energy into photoenergy, and vice versa.

An organic optoelectric device may be classified as follows in accordance with its driving principles. One is a photoelectric device where excitons generated by photoenergy are separated into electrons and holes and the electrons and holes are transferred to different electrodes respectively and electrical energy is generated, and the other is a light emitting device to generate photoenergy from electrical energy by supplying a voltage or a current to electrodes.

Examples of the organic optoelectric device include an organic photoelectric device, an organic light emitting diode, an organic solar cell, and an organic photo-conductor drum, and the like.

Among them, the organic light emitting diode (OLED) has recently drawn attention due to an increase in demand for flat panel displays. The organic light emitting diode converts electrical energy into light by applying current to an organic light emitting material, and has a structure in which an organic layer is interposed between an anode and a cathode. Herein, the organic layer may include an emission layer and optionally an auxiliary layer, and the auxiliary layer may include at least one layer selected from, for example a hole injection layer, a hole transport layer, an electron blocking layer, an electron transport layer, an electron injection layer, and a hole blocking layer in order to improve efficiency and stability of an organic light emitting diode.

Performance of an organic light emitting diode may be affected by characteristics of the organic layer, and among them, may be mainly affected by an organic material of the organic layer.

Particularly, development for an organic material being capable of increasing hole and electron mobility and simultaneously increasing electrochemical stability is needed so that the organic light emitting diode may be applied to a large-size flat panel display.

DISCLOSURE

Technical Problem

One embodiment provides an organic alloy applicable for an organic optoelectric device.

Another embodiment provides organic optoelectric device including the organic alloy.

Yet another embodiment provides a display device including the organic optoelectric device.

Technical Solution

According to one embodiment, provided is an organic alloy for an organic optoelectric device that is an organic alloy of at least two kinds of organic compounds, the at least two kinds of organic compounds includes a first organic compound and a second organic compound, a difference between evaporation temperatures of the first organic compound and the second organic compound is less than or equal to about 20° C. at less than or equal to about $10^{-3}$ torr, and a light emitting wavelength of the organic alloy is different from light emitting wavelengths of the first organic compound, the second organic compound, and a simple mixture of the first organic compound and the second organic compound.

According to another embodiment, provided is an organic optoelectric device including an anode and a cathode facing each other, at least one organic layer interposed between the anode and the cathode, wherein the organic layer includes the organic alloy.

According to yet another embodiment, a display device including the organic optoelectric device is provided.

Advantageous Effects

The present invention may provide an organic alloy having different characteristics from those of a conventional single organic compound and a simple mixture thereof and realize an organic optoelectric device having high efficiency and long life-span by applying the organic alloy to the organic optoelectric device.

BEST MODE

Figure 1:
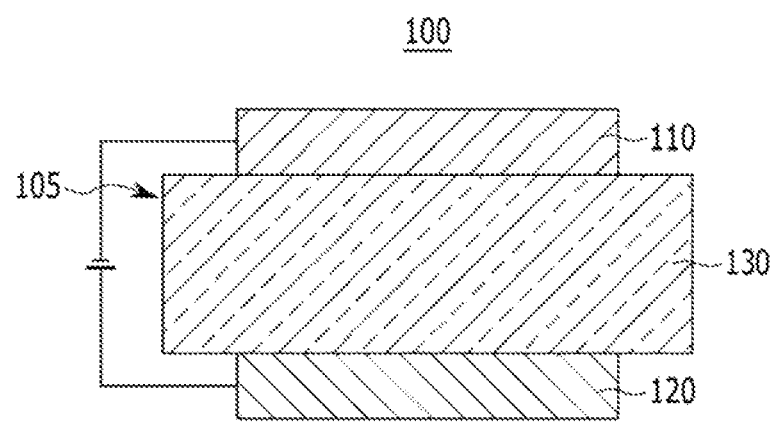
FIGS. 1 and 2 are cross-sectional views showing organic light emitting diodes according to each embodiment the present invention.

Hereinafter, embodiments of the present invention are described in detail. However, these embodiments are exemplary, and this disclosure is not limited thereto.

As used herein, when a definition is not otherwise provided, the term "substituted" refers to one substituted with deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C3 to C30 cycloalkyl group, a C2 to C30 heterocycloalkyl group, a C6 to C30 aryl group, a C2 to C30 heterocyclic group, a C1 to C20 alkoxy group, a fluoro group, a C1 to C10 trifluoroalkyl group such as a trifluoromethyl group and the like, or a cyano group, instead of at least one hydrogen of a substituent or a compound.

In addition, two adjacent substituents of the substituted halogen, hydroxy group, amino group, substituted or unsubstituted C1 to C20 amine group, nitro group, substituted or unsubstituted C3 to C40 silyl group, C1 to C30 alkyl group, C1 to C10 alkylsilyl group, C3 to C30 cycloalkyl group, C2 to C30 heterocycloalkyl group, C6 to C30 aryl group, C2 to C30 heterocyclic group, C1 to C20 alkoxy group, fluoro group, C1 to C10 trifluoroalkyl group such as trifluoromethyl group and the like, or cyano group may be fused to each other to form a ring. For example, the substituted C6 to C30 aryl group may be fused with another adjacent substituted C6 to C30 aryl group to form a substituted or unsubstituted fluorene ring.

In the present specification, when specific definition is not otherwise provided, the term "hetero" refers to one including 1 to 3 hetero atoms selected from N, O, S, P and Si, and remaining carbons in one compound or substituent.

In the present specification, when a definition is not otherwise provided, the term "alkyl group" may refer to an aliphatic hydrocarbon group. The alkyl group may refer to "a saturated alkyl" without any double bond or triple bond.

The alkyl group may be a C1 to C30 alkyl group. More specifically, the alkyl group may be a C1 to C20 alkyl group or a C1 to C10 alkyl group. For example, a C1 to C4 alkyl group includes 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification, the term "aryl group" refers to a substituent including all element of the cycle having p-orbitals which form conjugation, and may be monocyclic or fused ring polycyclic (i.e., rings sharing adjacent pairs of carbon atoms) functional group.

As used herein, the term "heterocyclic group" may refer to cyclic group including 1 to 3 hetero atoms selected from N, O, S, P and Si, and remaining carbons in a cyclic group. The heterocyclic group may be a fused ring where each ring may include the 1 to 3 heteroatoms.

More specifically, the substituted or unsubstituted C6 to C30 aryl group and/or the substituted or unsubstituted C2 to C30 heterocyclic group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuranyl group, a substituted or unsubstituted dibenzothiophenyl group, a substituted or unsubstituted carbazole group, a combination thereof, or a fused group of the combination, but are limited thereto.

In the specification, hole characteristics refer to characteristics capable of donating an electron to form a hole when electric field is applied, and characteristics that hole formed in the anode is easily injected into the emission layer and transported in the emission layer due to conductive characteristics according to HOMO level.

In addition, electron characteristics refer to characteristics capable of accepting an electron when electric field is applied, and characteristics that electron formed in the cathode is easily injected into the emission layer and transported in the emission layer due to conductive characteristics according to LUMO level.

Hereinafter, an organic alloy for an organic optoelectric device according to one embodiment is described.

The organic alloy is a material obtained by pre-treating more than two single organic compounds and a chemical interaction among the single organic compounds may be provided due to the pre-treatment. The pre-treating may be a heat treatment such as heating and sublimation followed by cooling, but is not limited thereto.

When the more than two single organic compounds include first and second organic compounds, the first and second organic compounds may have an evaporation temperature within the same or a predetermined range. Herein, the evaporation temperature indicates a temperature at which the first and second organic compounds may be deposited on a substrate at a predetermined rate under high vacuum of less than or equal to about $10^{-3}$ Torr, for example, an average temperature when the first and second organic compounds are thermally evaporated to be about 300 nm to about 800 nm thick at a rate of about 0.5 to about 2 Å/sec under high vacuum of less than or equal to about $10^{-3}$ Torr.

For example, the difference between evaporation temperatures of the first organic compound and the second organic compound may be less than or equal to about 20° C. at less than or equal to about $10^{-3}$ torr. Within the range, a difference between evaporation temperatures of the first organic compound and the second organic compound may be about 0° C. to 10° C. and specifically about 0° C. to about 5° C.

The organic alloy has a chemical interaction among more than two single organic compounds as described above and thus, different intrinsic characteristics from the single organic compounds and their simple mixture having no chemical interaction among single organic compounds. Herein, the simple mixture is obtained by physically mixing single organic compounds without any pre-treatment. In other words, when the more than two single organic compounds include the first and second organic compounds, the organic alloy of the first and second organic compounds may have different intrinsic characteristics from those of the first organic compound, the second organic compound, and a simple mixture thereof, while the single mixture of the first and second organic compounds show characteristics of the first organic compound, the second organic compound, or a combination thereof.

For example, the light emitting wavelength of the organic alloy may be different from light emitting wavelengths of the first organic compound, the second organic compound, and a simple mixture thereof.

The organic alloy may release new energy and emit light by a new energy bandgap between a high HOMO energy level and a low LUMO energy level of the first and second organic compounds due to intermolecular electron transfer system of the two organic compounds. For example, the energy bandgap of the organic alloy may be an energy difference between LUMO energy level of the first organic compound and HOMO energy level of the second organic compound or between LUMO energy level of the second organic compound and HOMO energy level of the first organic compound. On the other hand, the simple mixture of the first and second organic compounds may have either an energy bandgap between LUMO energy and HOMO energy of the first organic compound or a bandgap between LUMO energy and HOMO energy of the second organic compound. Herein, the organic alloy may have a smaller or larger bandgap than that of the first organic compound, the second organic compound, and the simple mixture thereof. Accordingly, the light emitting wavelength of the organic alloy may be different from light emitting wavelengths of the first organic compound, the second organic compound, and a simple mixture thereof.

A maximum light emitting wavelength (λmax) of the organic alloy may be shifted greater than or equal to about 20 nm compared with a maximum light emitting wavelength of the simple mixture of the first and second organic compounds, for example, shifted greater than or equal to about 20 nm toward a long wavelength region.

In addition, the organic alloy may have a different color from those of the first organic compound, the second organic compound, and the simple mixture thereof. For example, the organic alloy may have a color with a longer wavelength region than those of the first organic compound, the second organic compound, and the simple mixture thereof.

Furthermore, the organic alloy may have a different glass transition temperature (Tg) from that of the first organic compound, the second organic compound, and the simple mixture thereof. In addition, the organic alloy may have a different crystallization temperature (Tc) from that of the first organic compound, the second organic compound, and the simple mixture thereof. In addition, the organic alloy may have a different melting point (Tm) from that of the first organic compound, the second organic compound, and the simple mixture thereof. Since the glass transition temperature (Tg), the crystallization temperature (Tc), and the melting point (Tm) show inherent thermodynamic characteristics of a molecule, the compounds having the different glass transition temperature (Tg), the different crystallization temperature (Tc) and the different melting point (Tm) may be different compounds.

The organic alloy may have inherent thermodynamic characteristics such as the glass transition temperature (Tg), the crystallization temperature (Tc), and the melting point (Tm), which may be substantially constant within an error range. The error range may vary depending on a measurement condition, for example, may be within about ±5° C. and specifically, within about ±2° C. These thermodynamic characteristics may be different from those of the simple mixture of the first and second organic compounds having no inherent thermodynamic characteristics.

The organic alloy may be pre-treated in various methods, for example, in a method of heat-treating the first and second organic compounds at greater than or equal to an evaporation temperature and liquidating or gasifying the first and second organic compounds and then, cooling and solidifying the heat-treated compounds. The first and second organic compounds may be melted liquid or gasified vapor at the evaporation temperature, and the pre-treated organic alloy may be a solid like a mass or powder. In addition, the organic alloy obtained as a solid mass may be additionally physically ground with a blender and the like.

The organic alloy is a resulting material obtained through the aforementioned pre-treatment and may be supplied by using one source to form a thin film. Accordingly, the deposition process may become simple without a control process required when more than two organic compounds are respectively supplied by using separate sources.

In addition, the organic alloy is a resulting material obtained through the aforementioned pre-treatment and thus, may secure uniformity and consistency for deposition compared with the more than two single organic compounds supplied by using more than two separate sources or their simple mixture of supplied by using one single source. Accordingly, when a plurality of thin films are formed through a continuous process, the organic alloy may be used to continuously produce the thin films including components in a substantially equivalent ratio and thus, increase reproducibility and reliability of the thin films.

The first and second organic compounds may include any material having an evaporation temperature for pre-treatment at a predetermined temperature without a particular limit, for example, a compound having electron characteristics and a compound having hole characteristics to improve mobility of electrons and holes. For example, the first organic compound may be a compound having relatively strong electron characteristics, and the second organic compound may be a compound having relatively strong hole characteristics, and thus, the organic alloy of the first organic compound having relatively strong electron characteristics and the second organic compound having relatively strong hole characteristics may have bipolar characteristics.

The first organic compound is a compound having relatively strong electron characteristics, for example a compound represented by the following Chemical Formula 1.

[Chemical Formula 1]

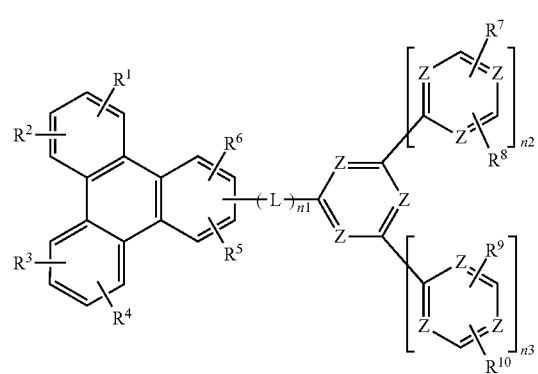

In the above Chemical Formula 1,

Z is independently N or CR$^a$, at least one of Z is N,

R$^1$ to R$^{10}$ and R$^a$ are independently hydrogen, deuterium, a substituted or unsubstituted C1 to C10 alkyl group, a substituted or unsubstituted C6 to C12 aryl group, or a combination thereof, In the above Chemical Formula 1, the total number of 6-membered rings substituting the triphenylene group is less than or equal to 6, L is a substituted or unsubstituted phenylene group, a substituted or unsubstituted biphenylene group or a substituted or unsubstituted terphenylene group, n1 to n3 are independently 0 or 1, and n1+n2+n3≥1.

Herein, the 6-membered rings substituting the triphenylene group indicate all the 6-membered rings directly or indirectly linked to the triphenylene group and include 6-membered rings including a carbon atom, a nitrogen atom, or a combination thereof.

The first organic compound may be represented by for example the following Chemical Formula 1-I or 1-II, depending on the bonding position of the triphenylene group.

[Chemical Formula 1-I]

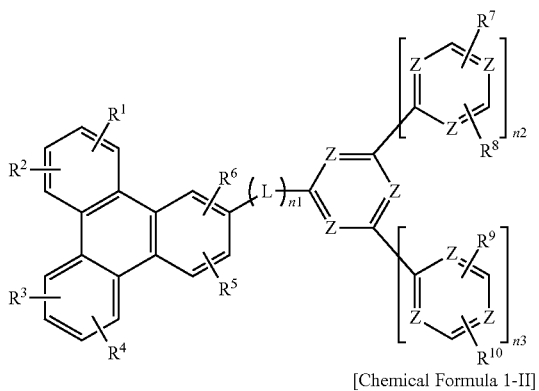

[Chemical Formula 1-II]

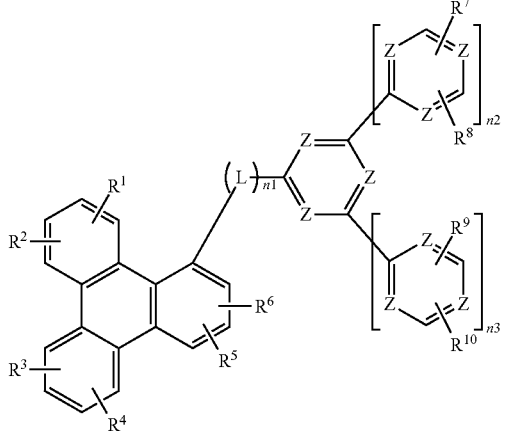

In the above Chemical Formula 1-I or 1-II, Z, R$^1$ to R$^{10}$, L and n1 to n3 are the same as described above.

The first organic compound includes the triphenylene group and at least one nitrogen-containing heterocyclic group.

The first organic compound includes at least one nitrogen-containing ring and thereby, may have a structure of easily accepting electrons when an electric field is applied thereto and thus, decrease a driving voltage of an organic optoelectric device including the first organic compound.

In addition, the first organic compound has a bipolar structure by including both a triphenylene structure of easily accepting holes and a nitrogen-containing ring moiety of easily accepting electrons and may appropriately balance a flow of the holes and the electrons, and accordingly, improve efficiency of an organic optoelectric device when applied thereto.

The first organic compound represented by the above Chemical Formula 1 has at least one kink structure as a center of an arylene group and/or a heterocyclic group.

The kink structure is a structure that a linking moiety of the arylene group and/or the heterocyclic group is not a linear structure. For example, as for phenylene, ortho phenylene (o-phenylene) and meta phenylene (m-phenylene) have the kink structure where a linking moiety does not form a linear structure, while para phenylene (p-phenylene) has no kink structure because where a linking moiety forms a linear structure.

In the above Chemical Formula 1, the kink structure may be formed as a center of a linking group (L) and/or an arylene group/a heterocyclic group.

For example, when n1 in the above Chemical Formula 1 is 0, that is, there is no linking group (L), a kink structure may be formed as a center of an arylene group/a heterocyclic group, and for example, the compound may be represented by the following Chemical Formula 1a or 1b.

[Chemical Formula 1a]

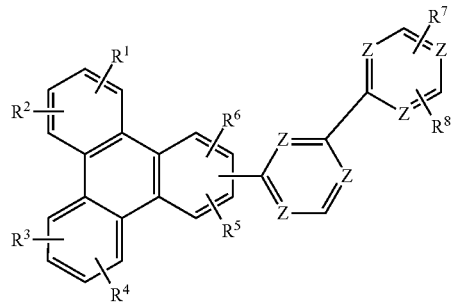

[Chemical Formula 1b]

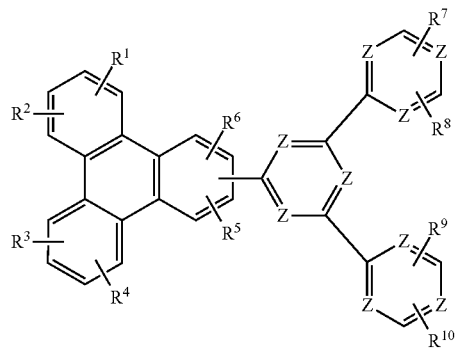

In the above Chemical Formula 1a or 1 b, Z, R$^1$ to R$^{10}$ and L are the same as described above.

For example, when n1 in the above Chemical Formula 1 is 1, a kink structure is formed as a center of a linking group (L), and for example, the L is may be a substituted or unsubstituted phenylene having the kink structure, a substituted or unsubstituted biphenylene group having the kink structure, or a substituted or unsubstituted terphenylene group having the kink structure. The L may be selected from, for example substituted or unsubstituted groups listed in the following Group 1.

[Group 1]

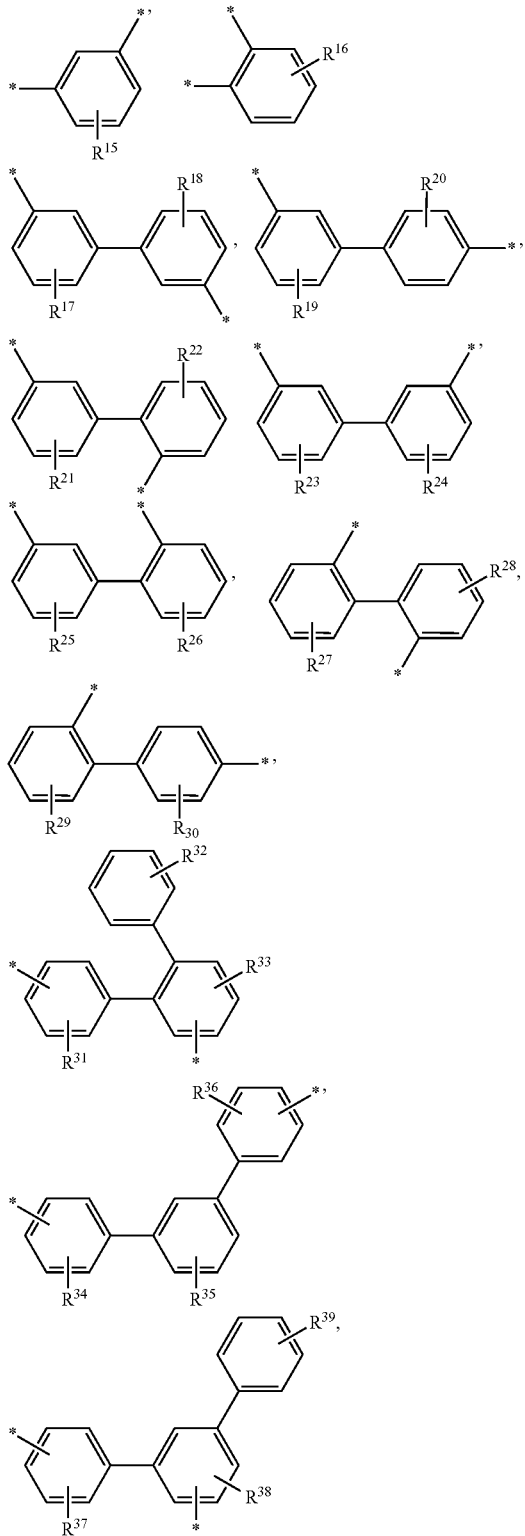

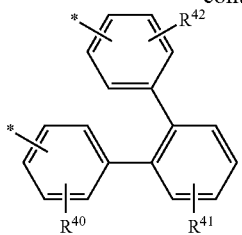

In the Group 1, $R^{15}$ to $R^{42}$ are independently hydrogen, deuterium, a substituted or unsubstituted C1 to C10 alkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C2 to C30 heterocyclic group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a halogen, a halogen-containing group, a cyano group, a hydroxyl group, an amino group, a nitro group, a carboxyl group, a ferrocenyl group, or a combination thereof.

The first organic compound may have at least two kink structures and for example, two to four kink structures.

The first organic compound may appropriately localize charges and control a conjugation-system flow due to the above kink structure, and thus improve a life-span of an organic optoelectric device to which the composition is applied.

In addition, in Chemical Formula 1, the number of $R^1$ to $R^6$, that is the total number of 6-membered rings substituting the triphenylene group is limited to be less than or equal to 6, and thereby thermal decomposition of the compound by a high temperature during a deposition process may be decreased.

In addition, the first organic compound may be effectively prevented from stacking depending on the structure and decrease process stability and simultaneously, a deposition temperature. This stacking prevention effect may be further increased when the compound includes the linking group (L) of the above Chemical Formula 1.

The first organic compound may be, for example represented by one of the following Chemical Formulae 1c to 1t.

[Chemical Formula 1c]

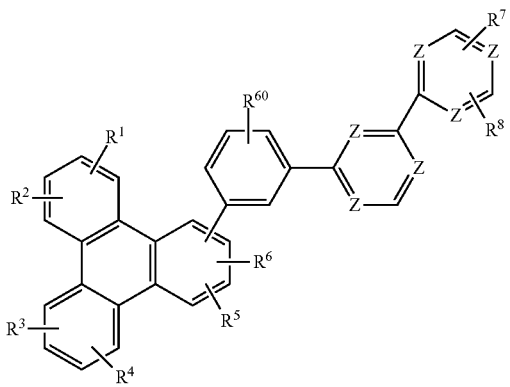

[Chemical Formula 1d]
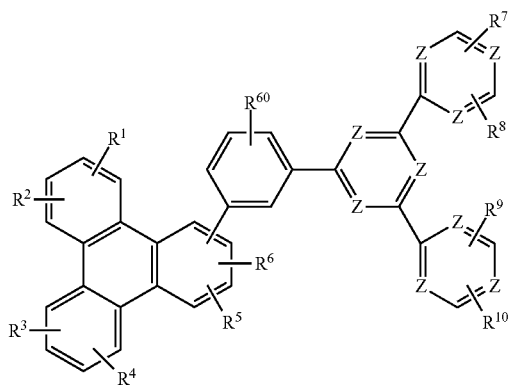
[Chemical Formula 1e]
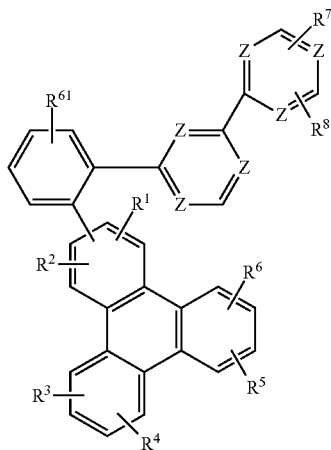
[Chemical Formula 1f]
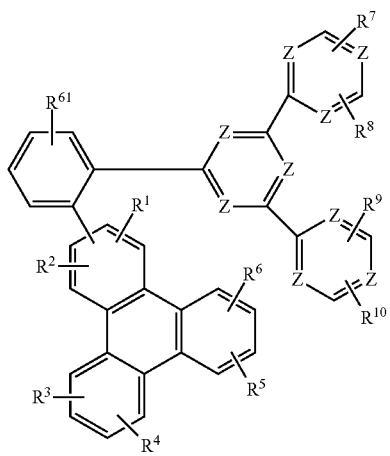
[Chemical 1g]
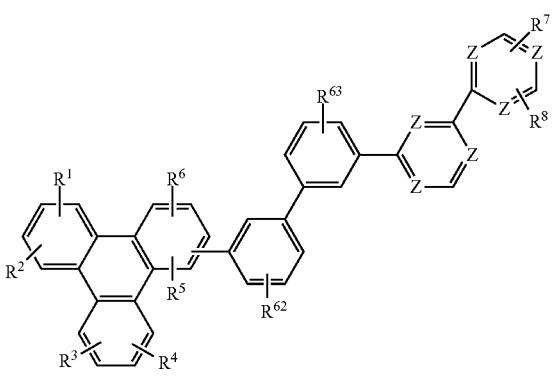
[Chemical Formula 1h]
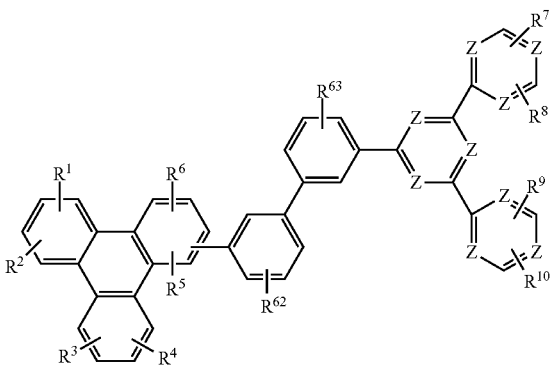
[Chemical Formula 1i]
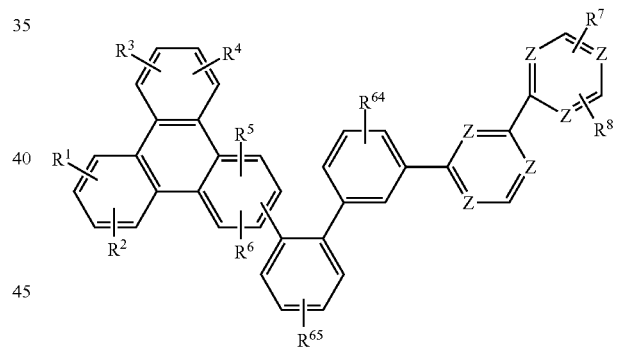
[Chemical 1j]
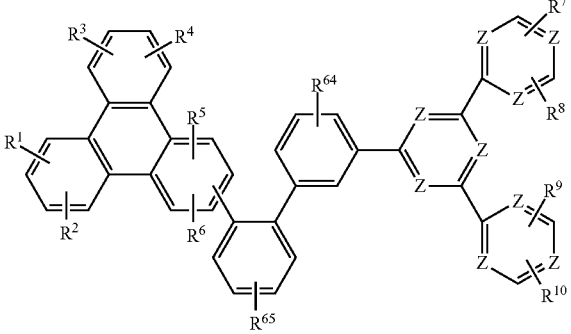

[Chemical Formula 1k]
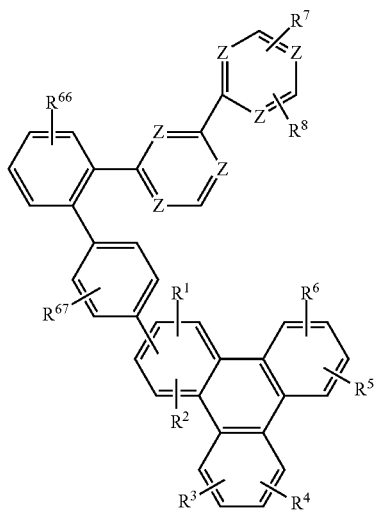
[Chemical Formula 1l]
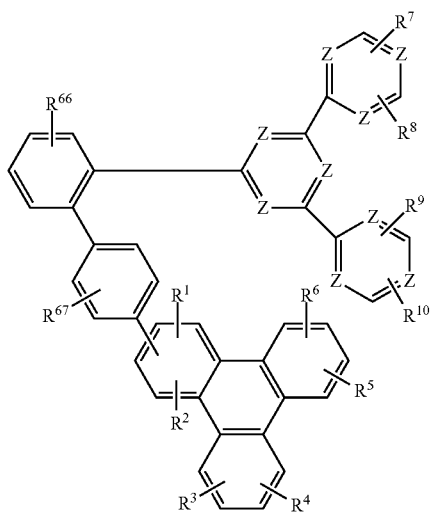
[Chemical Formula 1m]
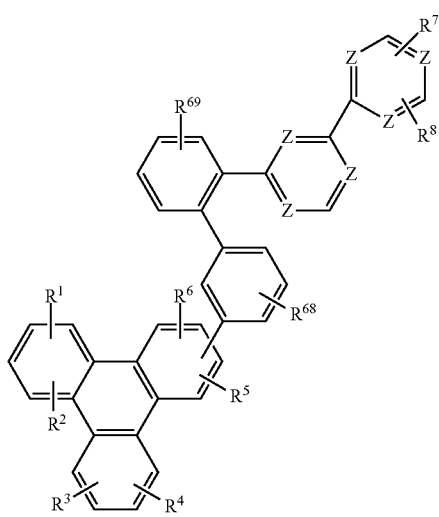
[Chemical Formula 1n]
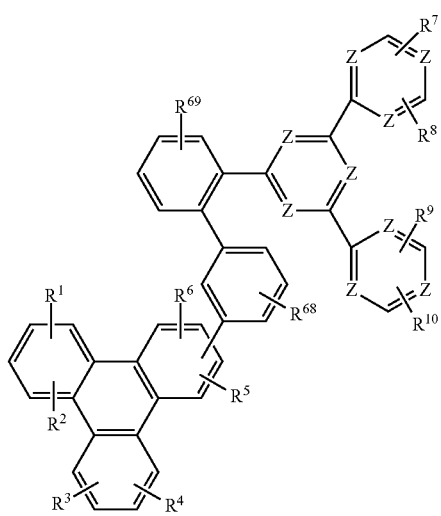
[Chemical Formula 1o]
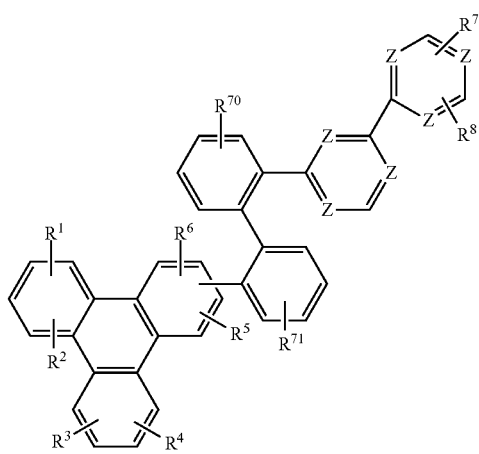
[Chemical Formula 1p]
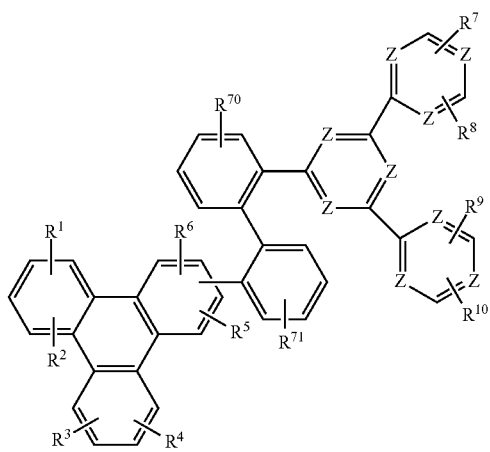

[Chemical Formula 1q]

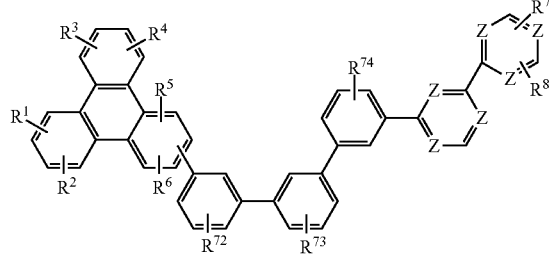

[Chemical Formula 1r]

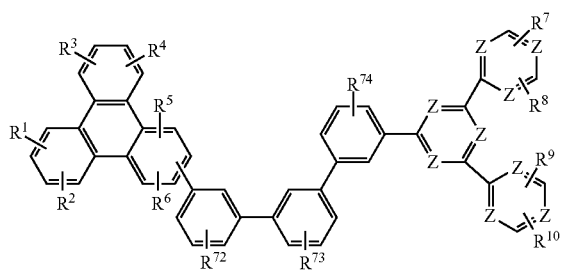

[Chemical Formula 1s]

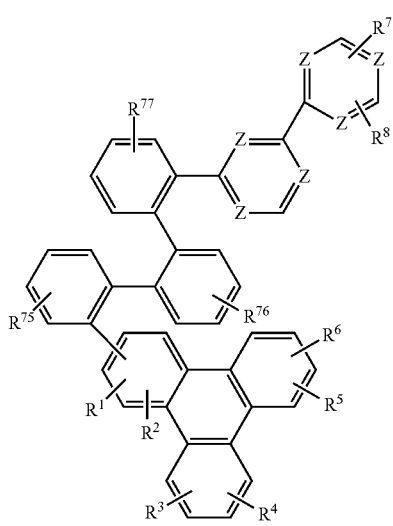

[Chemical Formula 1t]

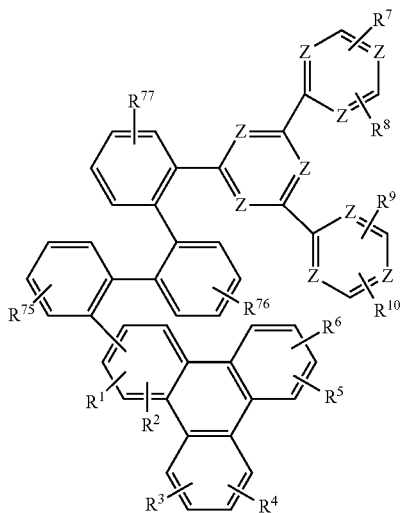

In the above Chemical Formulae 1c to 1t,

Z and $R^1$ to $R^{10}$ are independently the same as described above, and $R^{60}$ to $R^{77}$ are independently hydrogen, deuterium, a substituted or unsubstituted C1 to C10 alkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C2 to C30 heterocyclic group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a halogen, a halogen-containing group, a cyano group, a hydroxyl group, an amino group, a nitro group, a carboxyl group, a ferrocenyl group, or a combination thereof.

The first organic compound may be, for example, a compound listed in the following Group 2 but is not limited thereto.

[Group 2]

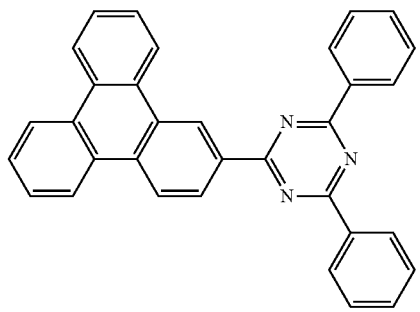

A-1

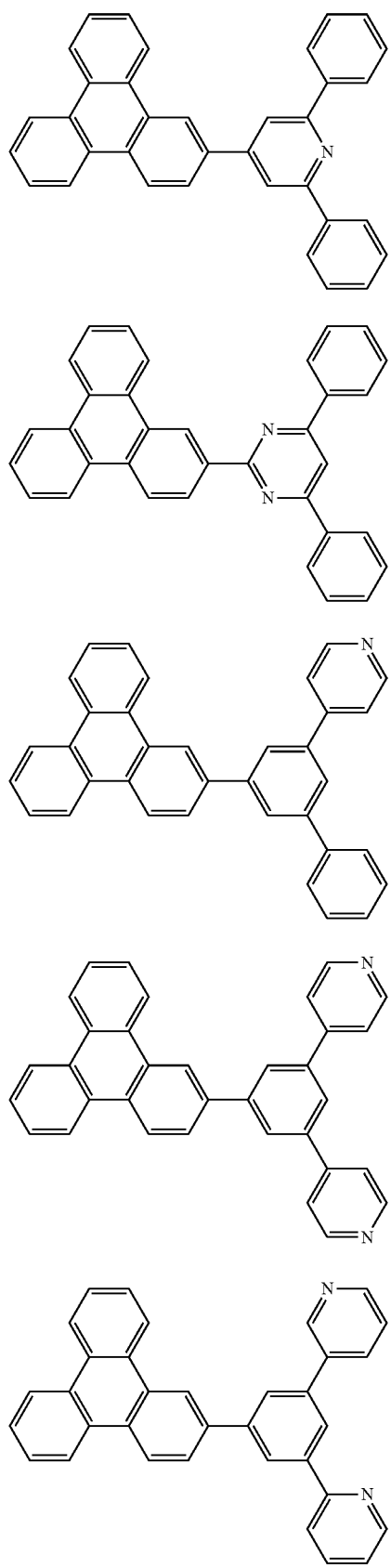
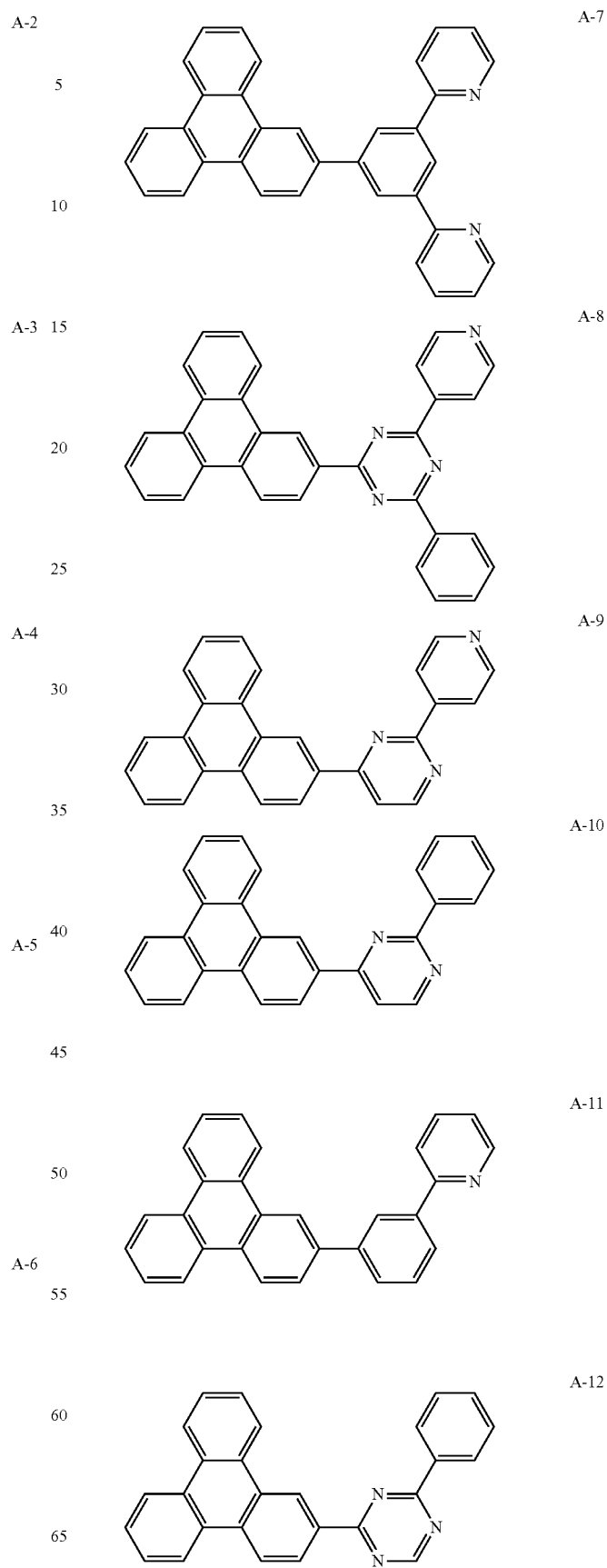

A-13
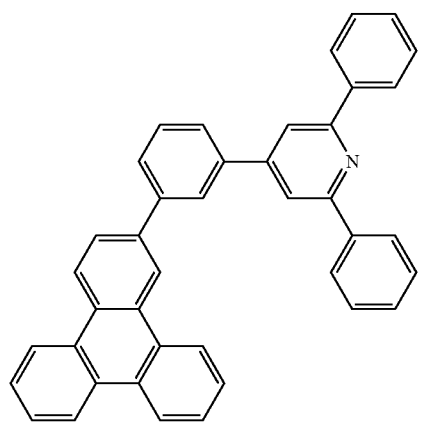
A-14
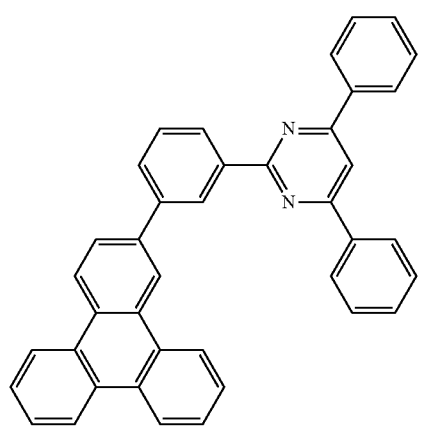
A-15
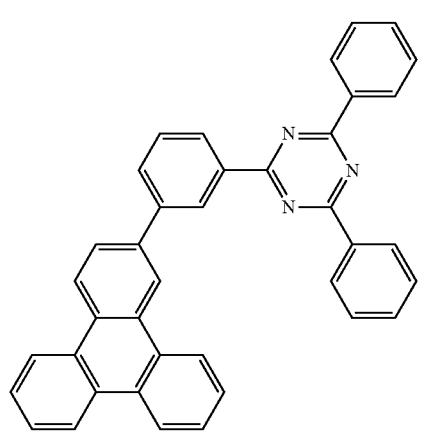
A-16
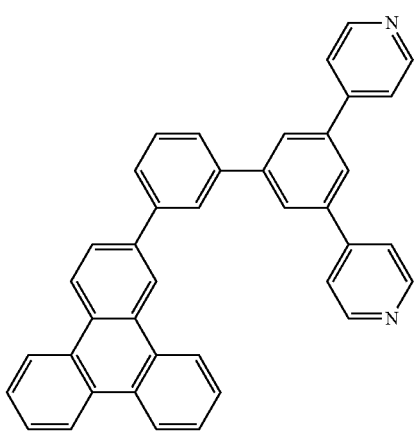
A-17
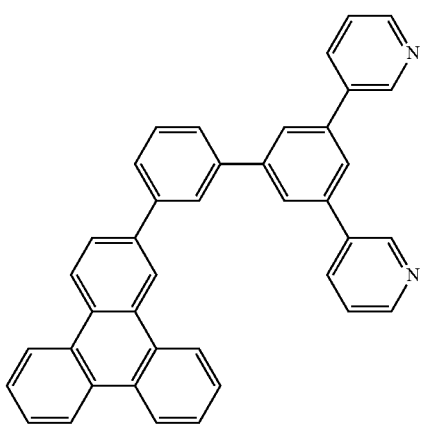
A-18
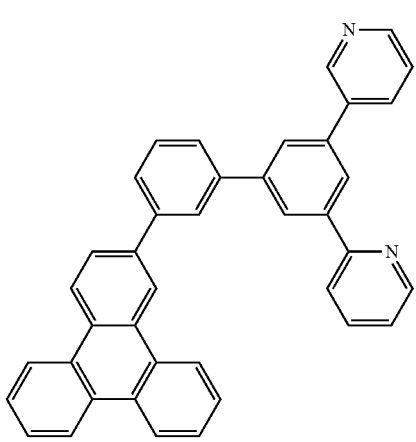

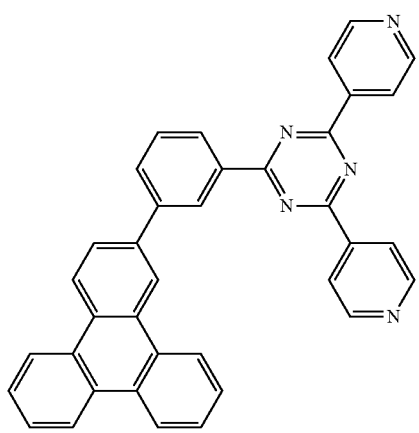
A-19
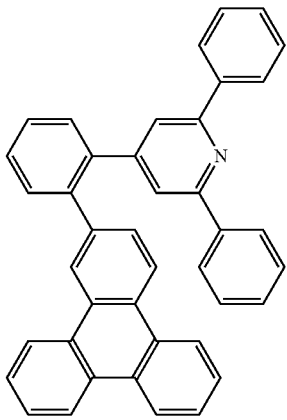
A-22
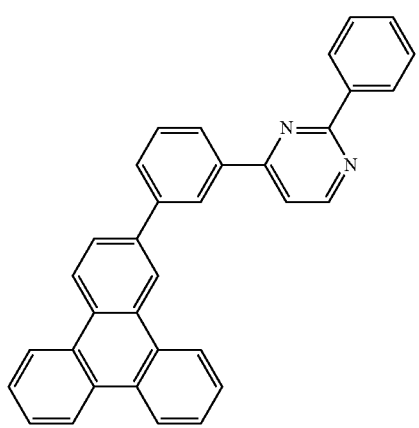
A-20
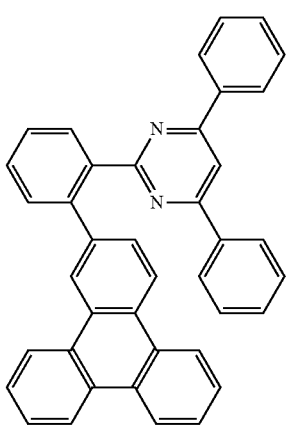
A-23
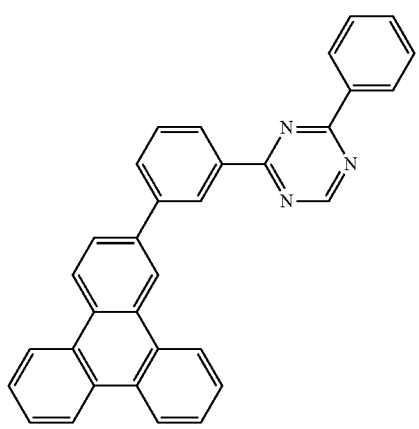
A-21
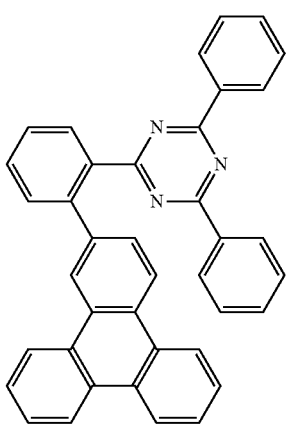
A-24

A-25
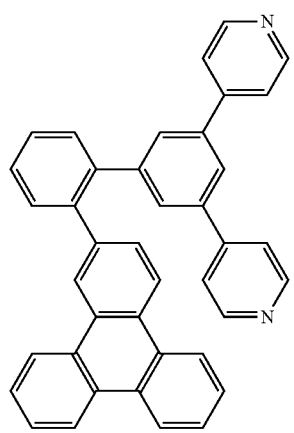
A-26
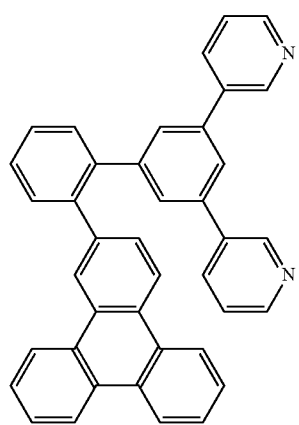
A-27
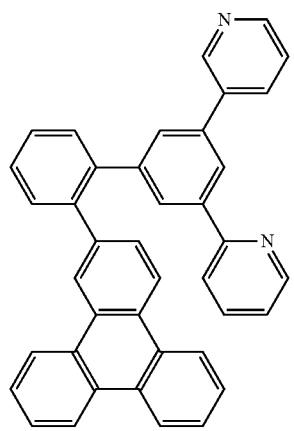
A-28
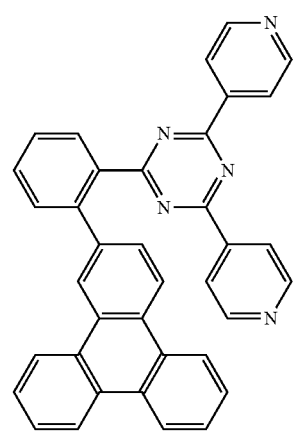
A-29
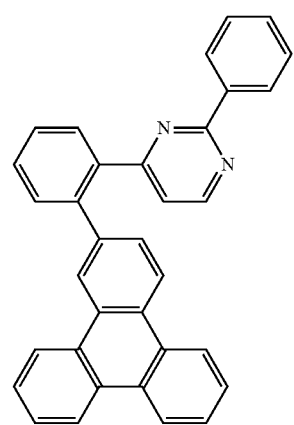
A-30
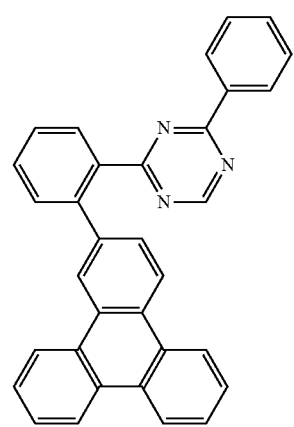

A-31
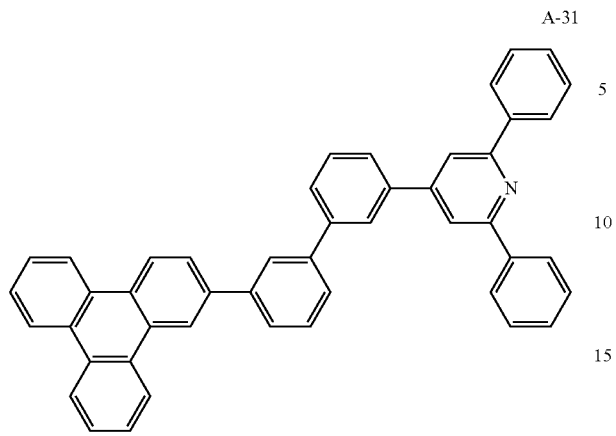
A-32
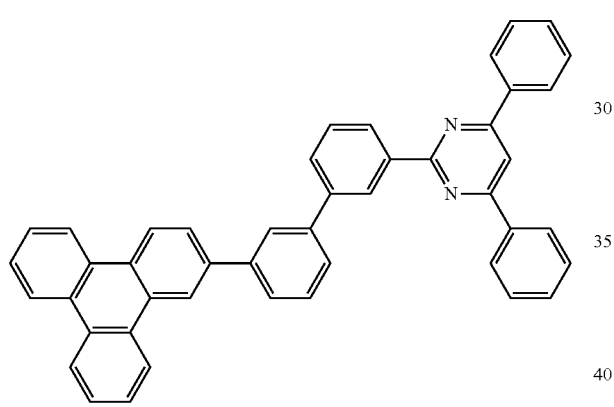
A-33
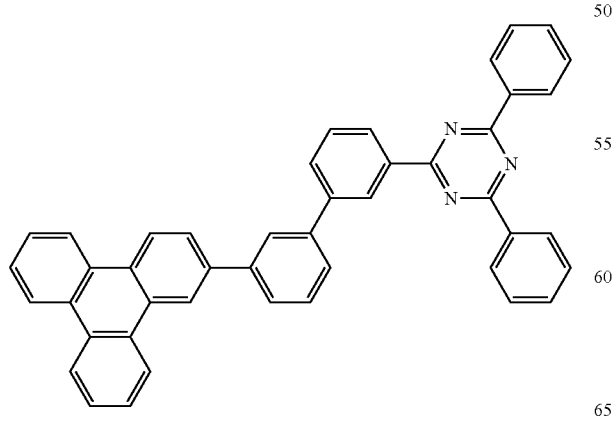
A-34
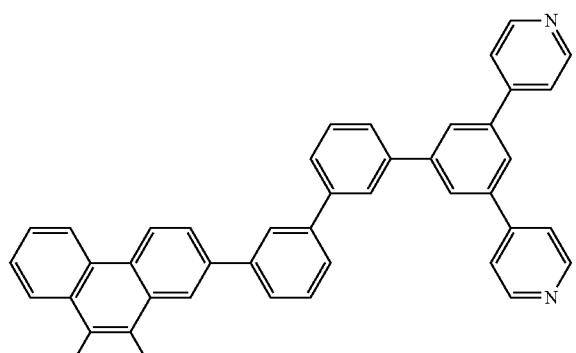
A-35
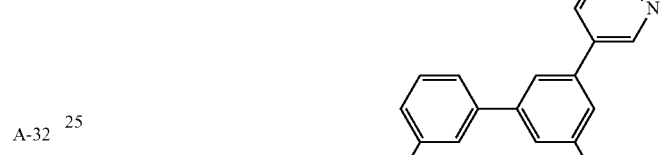
A-36
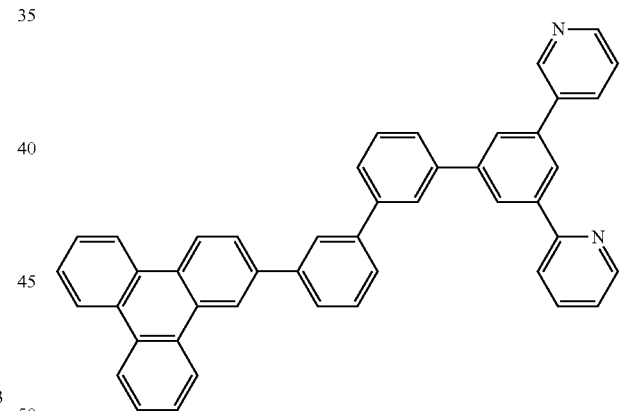
A-37
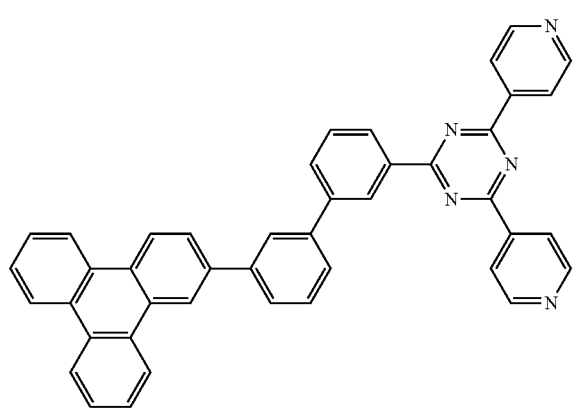

A-38
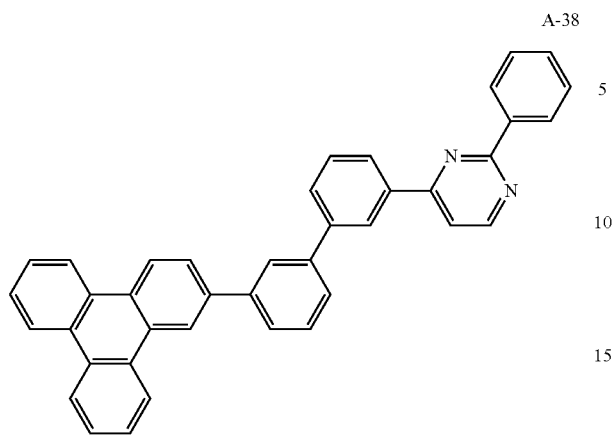
A-42
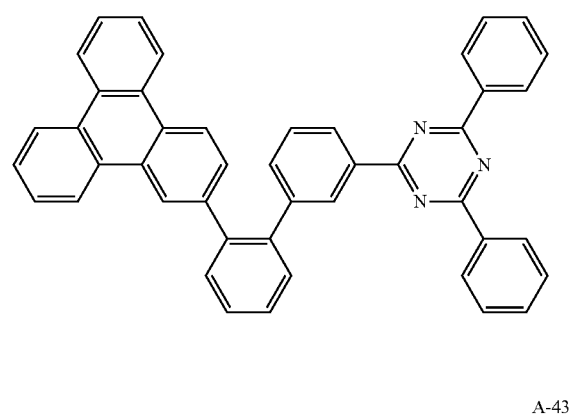
A-39
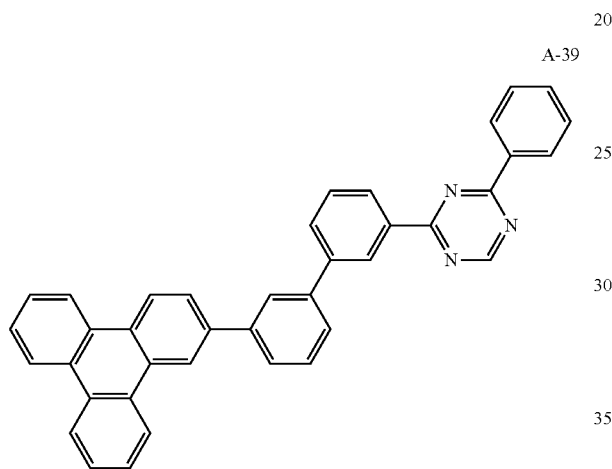
A-43
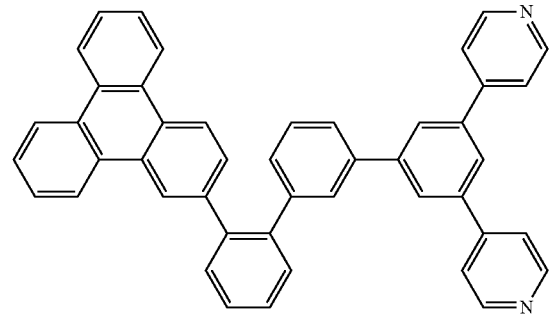
A-40
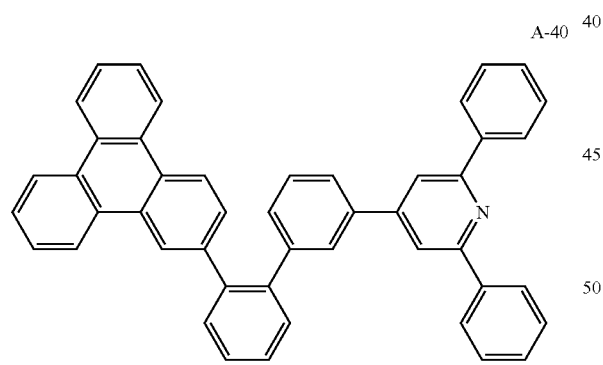
A-44
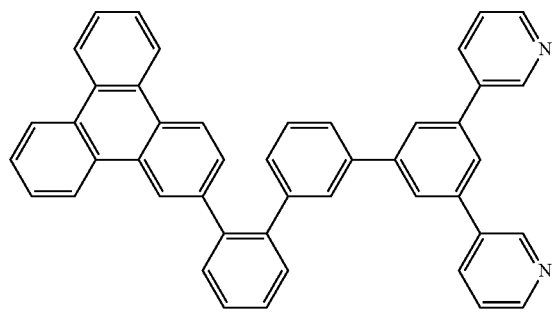
A-41
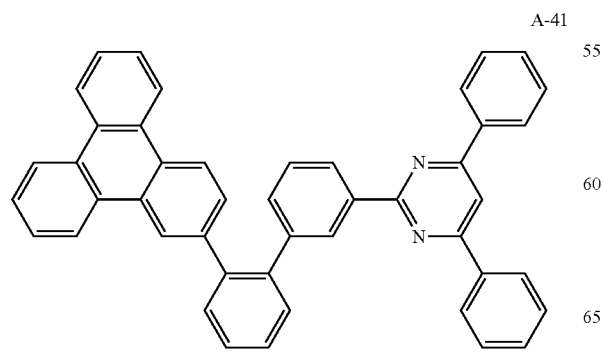
A-45
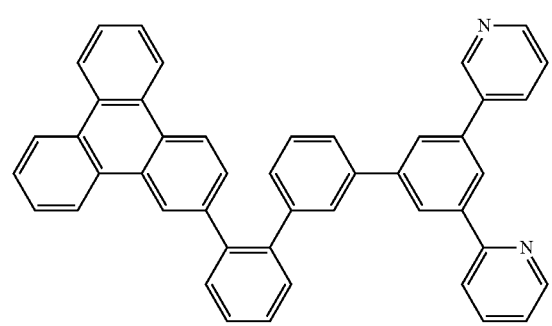

A-46
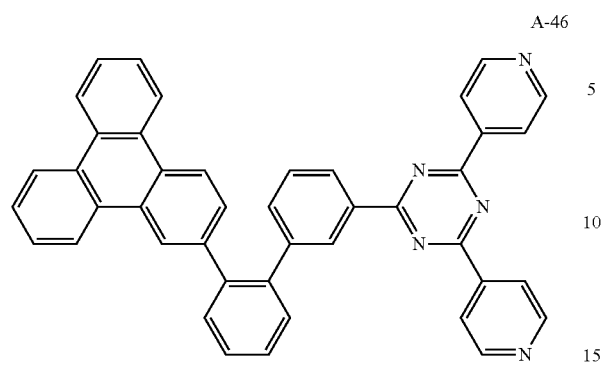
A-50
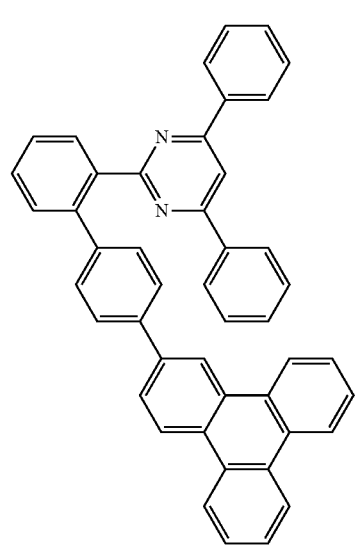
A-47
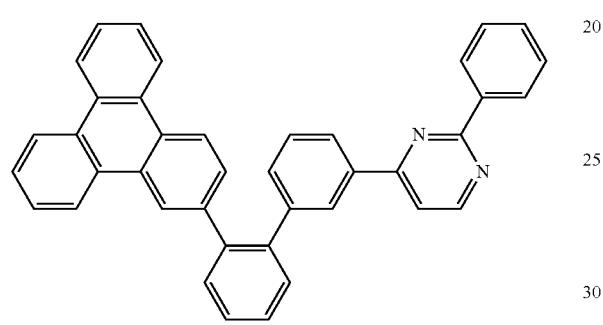
A-51
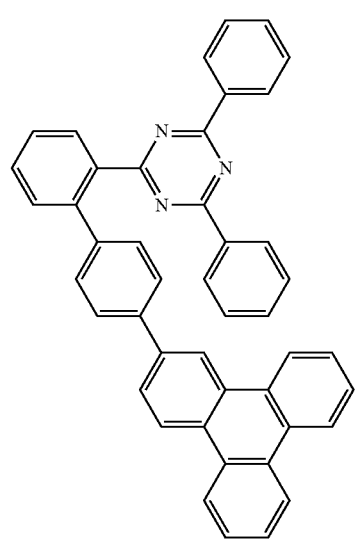
A-48
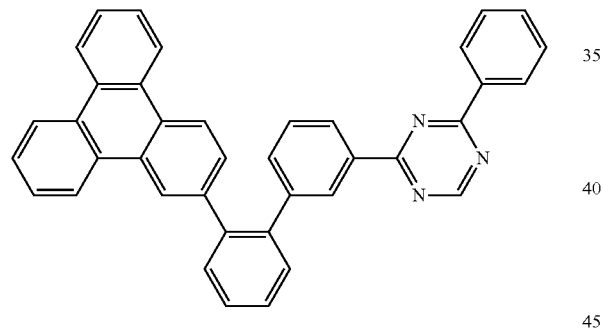
A-49
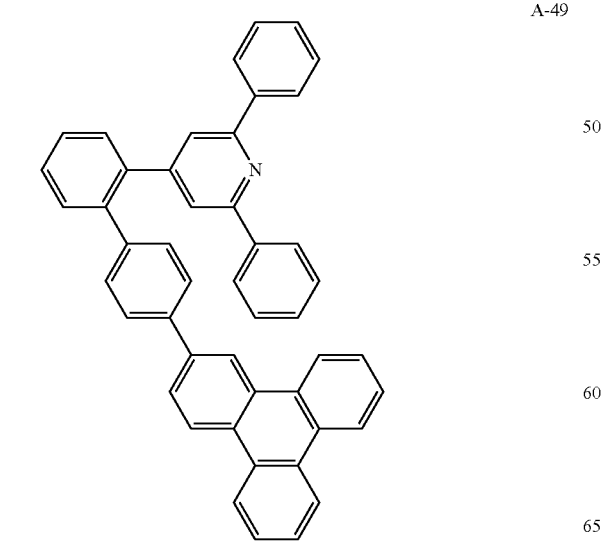
A-52
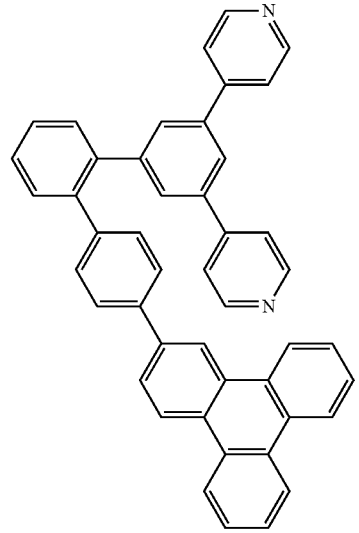

-continued
A-53
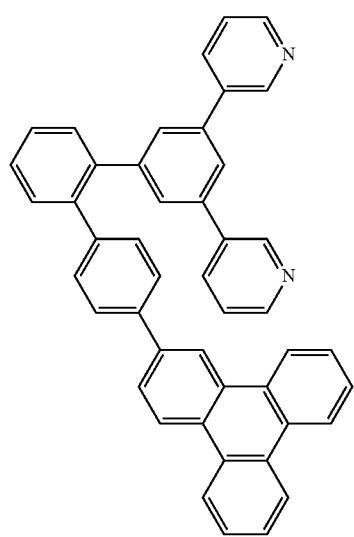
A-54
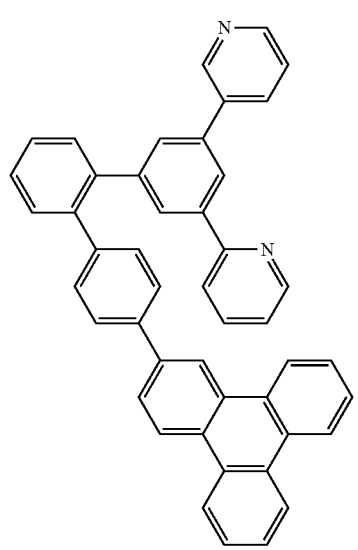
A-55
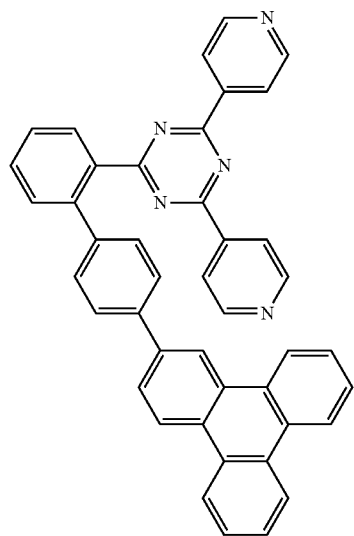
-continued
A-56
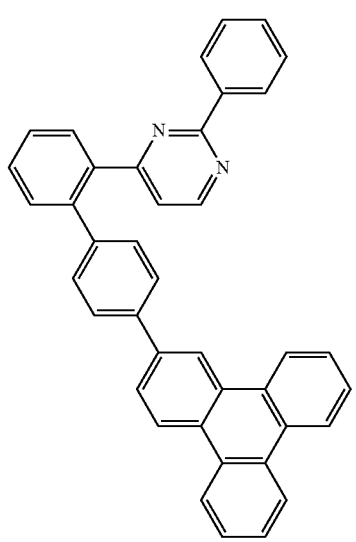
A-57
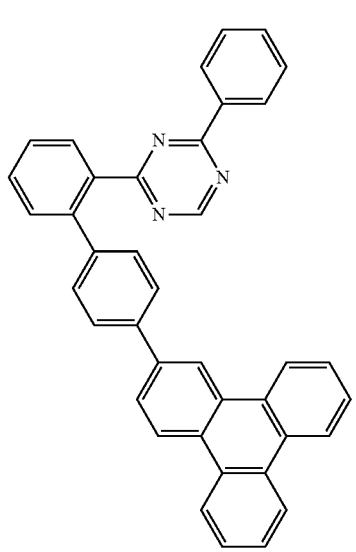
A-58
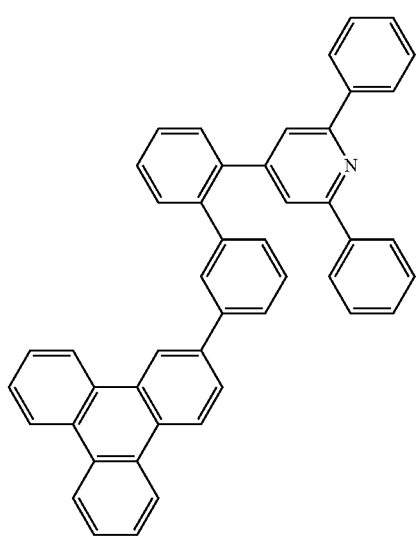

-continued
A-59
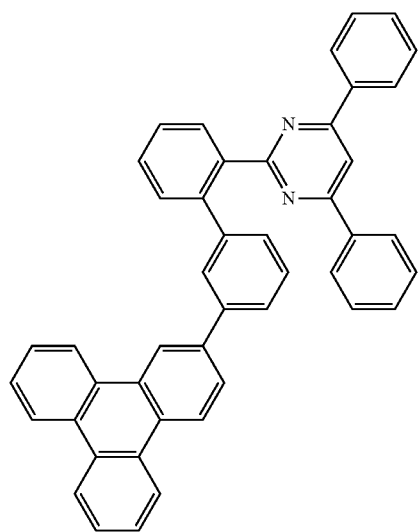
A-60
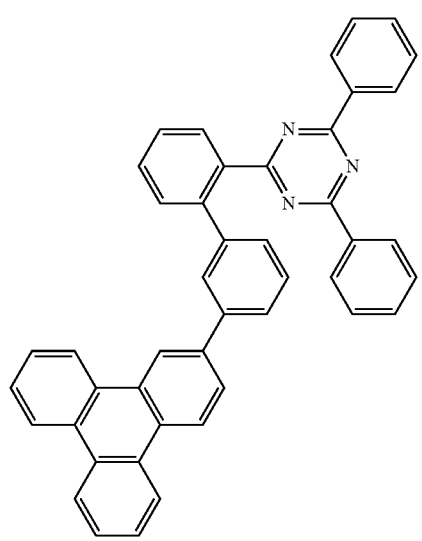
A-61
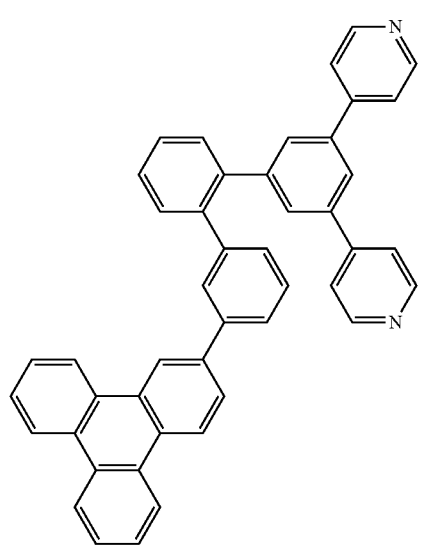
-continued
A-62
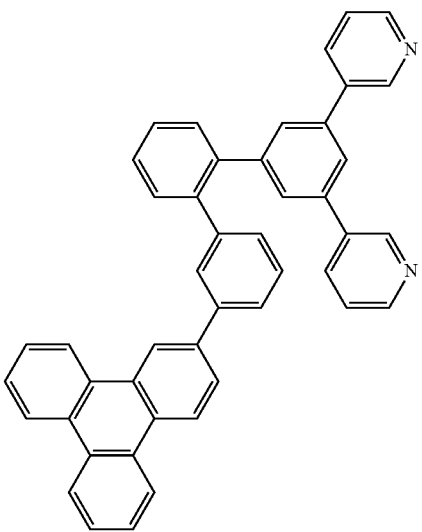
A-63
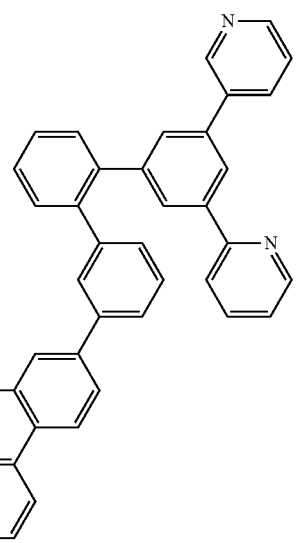
A-64
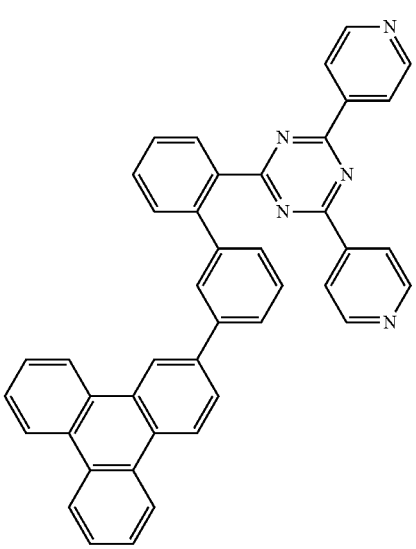

A-65
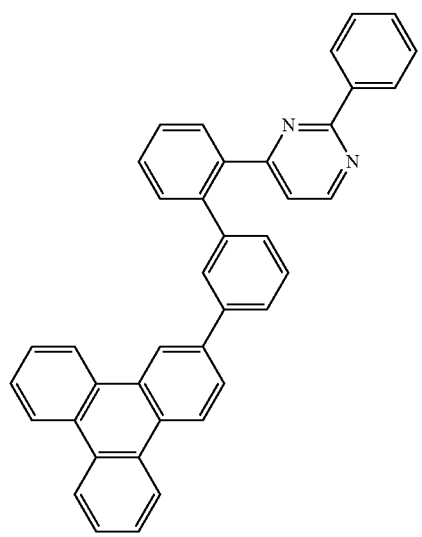
A-68
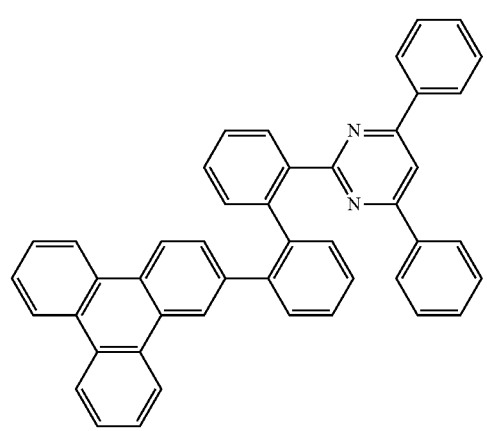
A-66
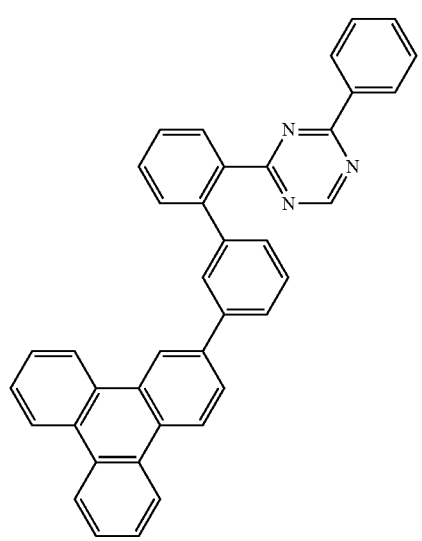
A-69
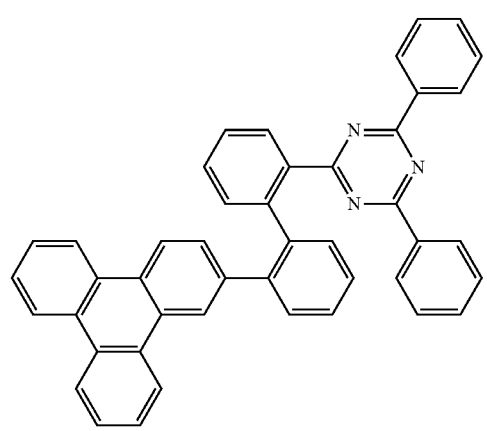
A-67
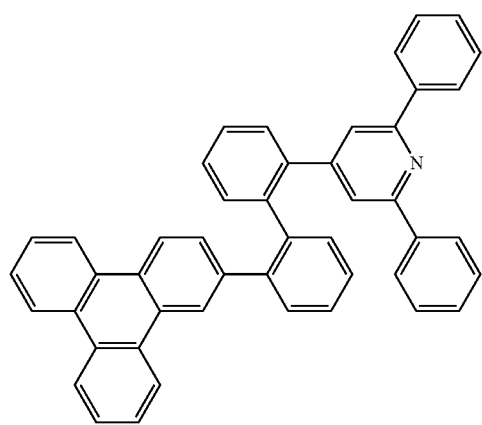
A-70
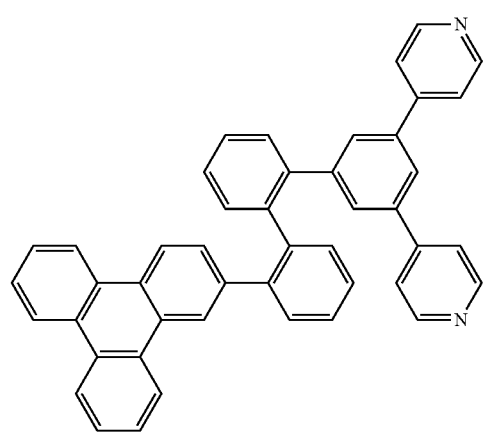

-continued
A-71
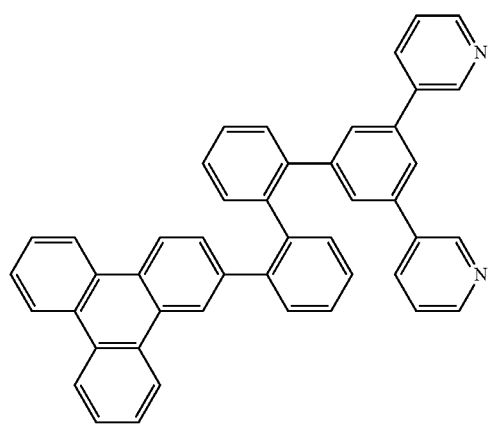
A-72
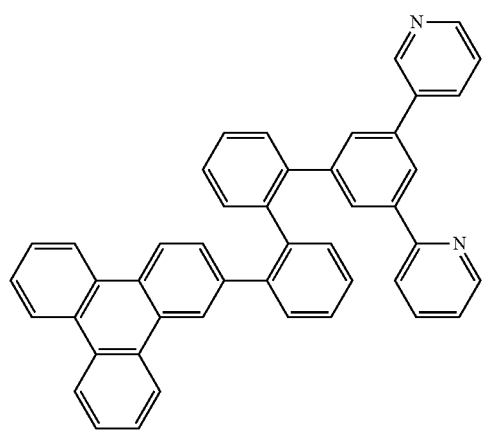
A-73
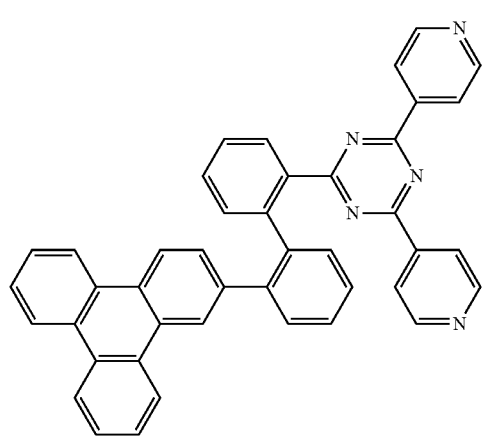
-continued
A-74
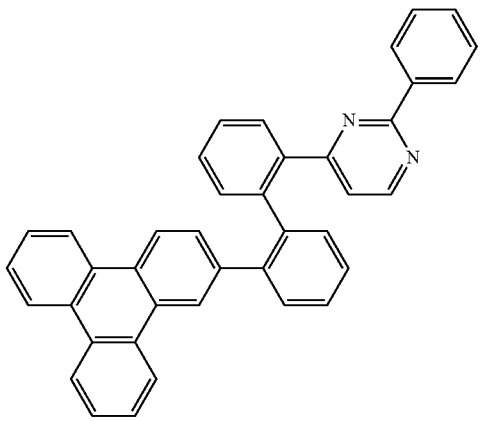
A-75
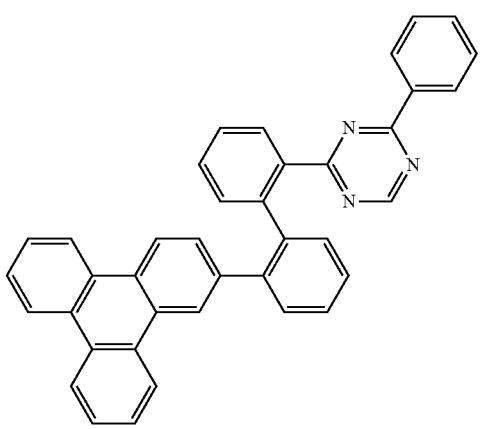
A-76
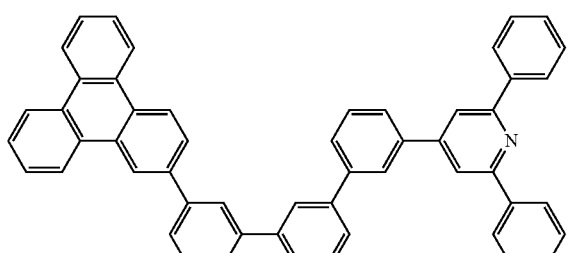
A-77
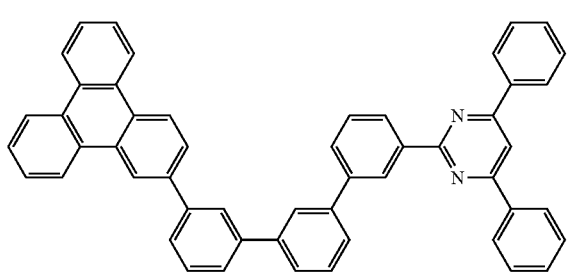

A-78
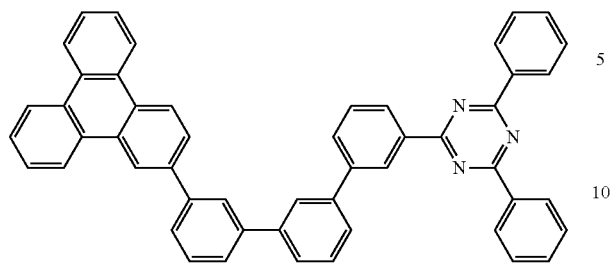
A-79
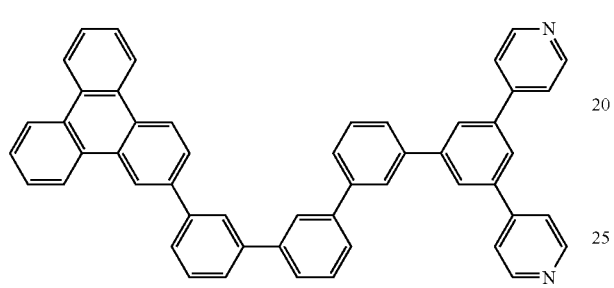
A-80
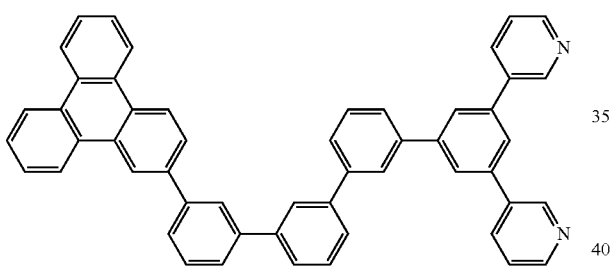
A-81
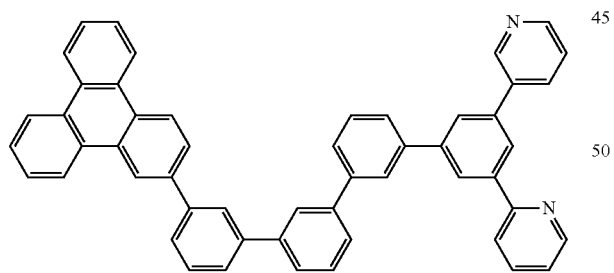
A-82
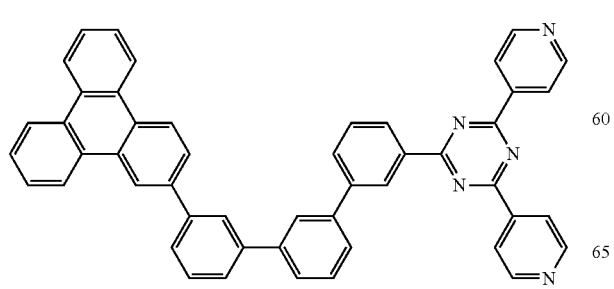
A-83
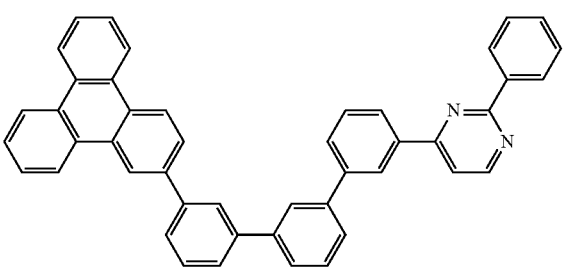
A-84
A-85
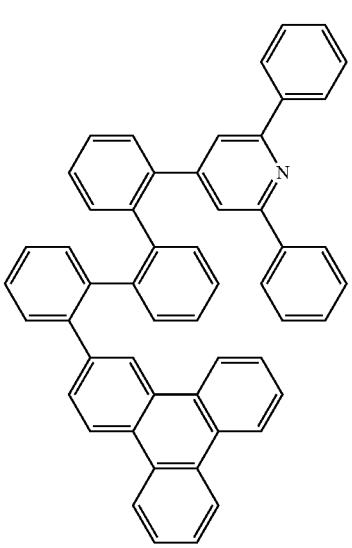
A-86
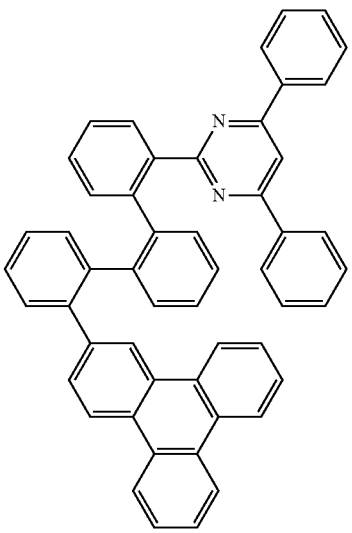

A-87
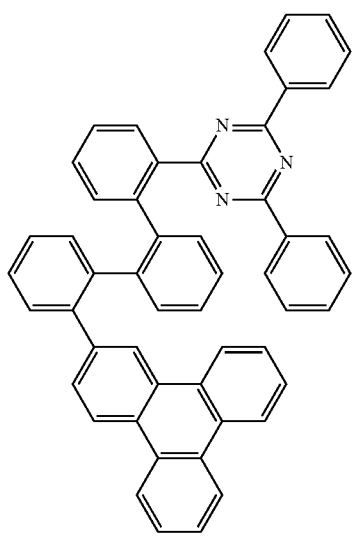
A-88
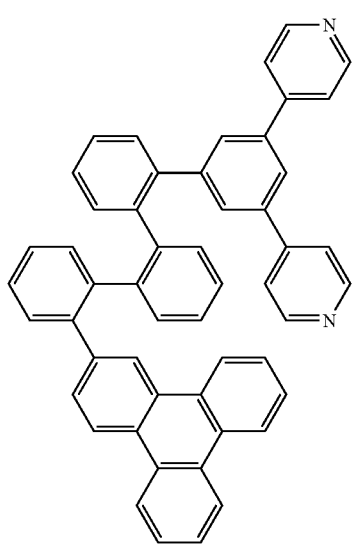
A-89
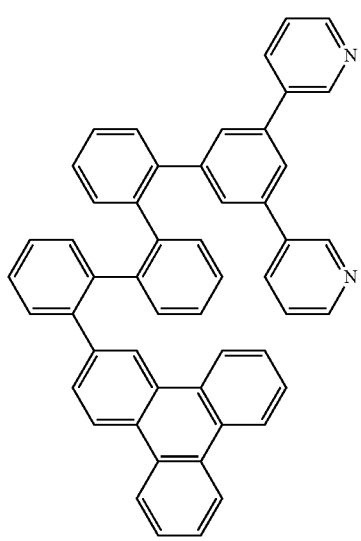
A-90
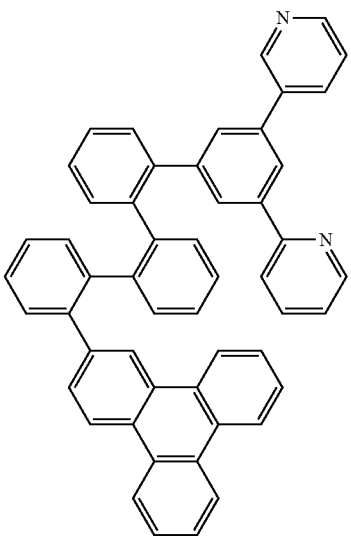
A-91
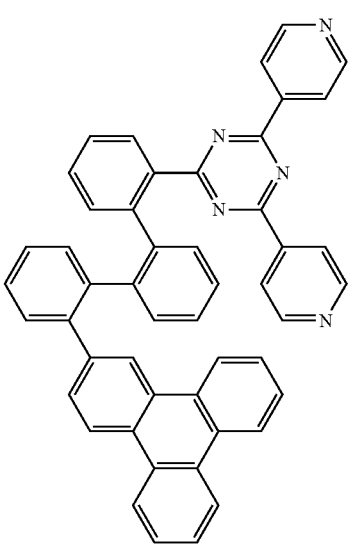
A-92
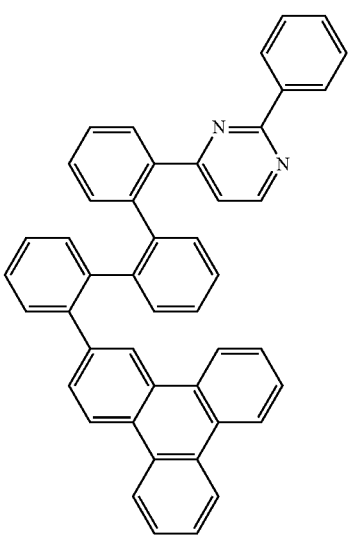

A-93
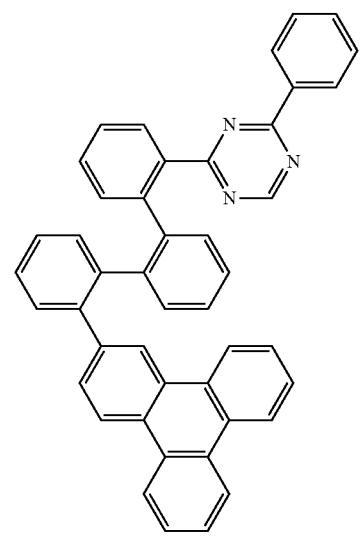
A-94
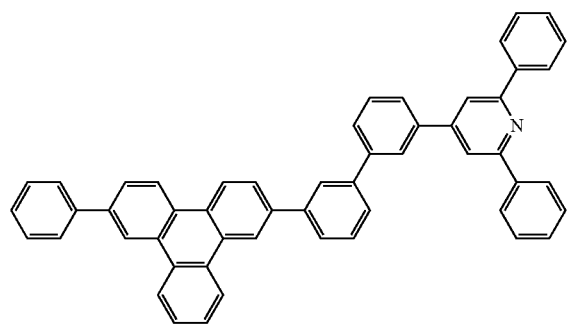
A-95
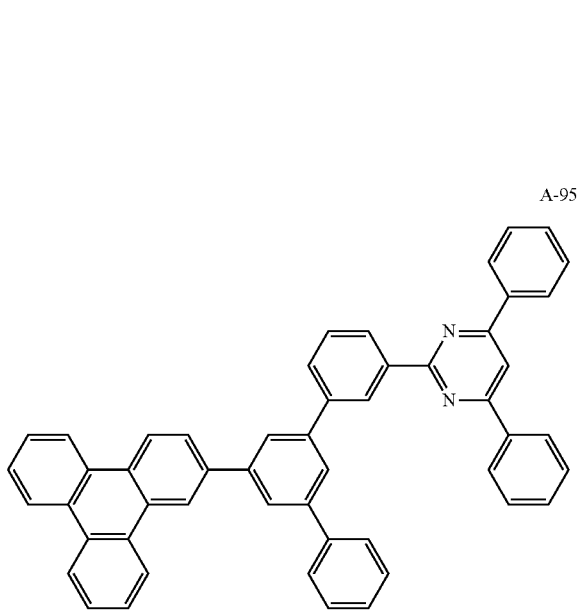
A-96
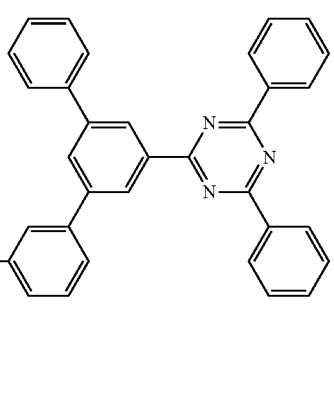
A-97
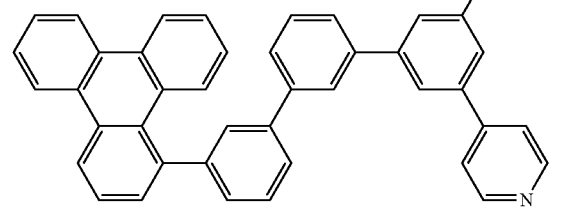
A-98
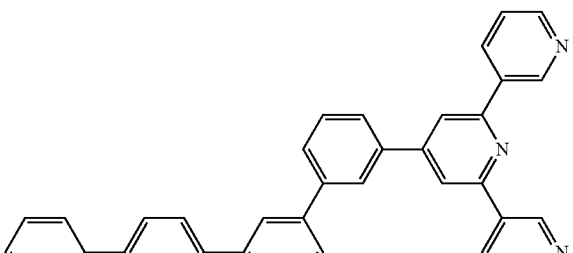
A-99
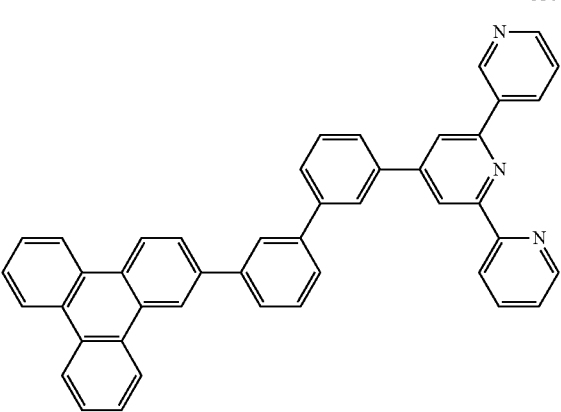

A-100
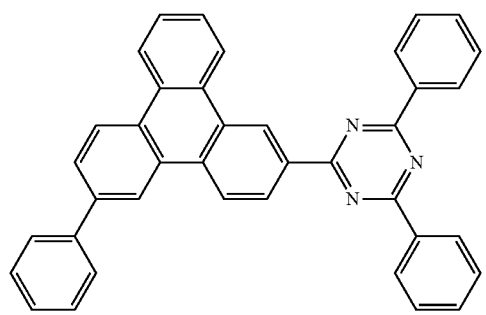
A-101
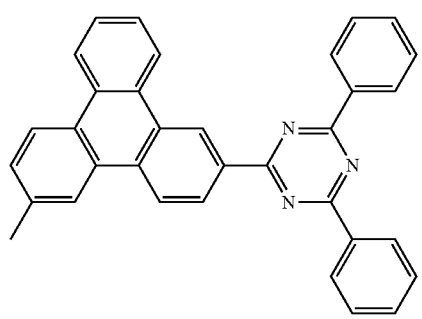
A-102
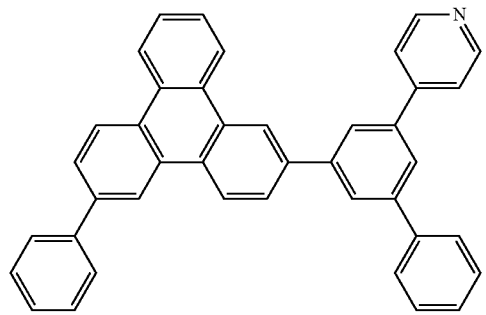
A-103
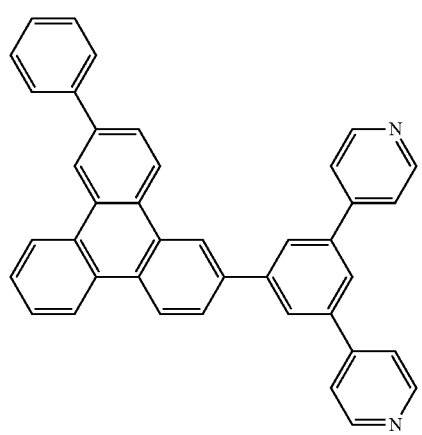
A-104
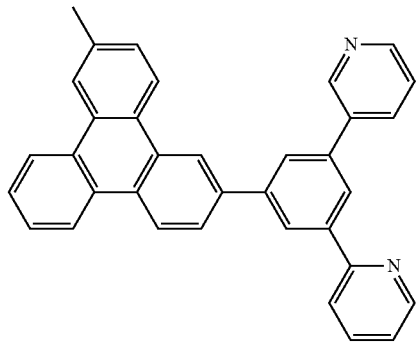
A-105
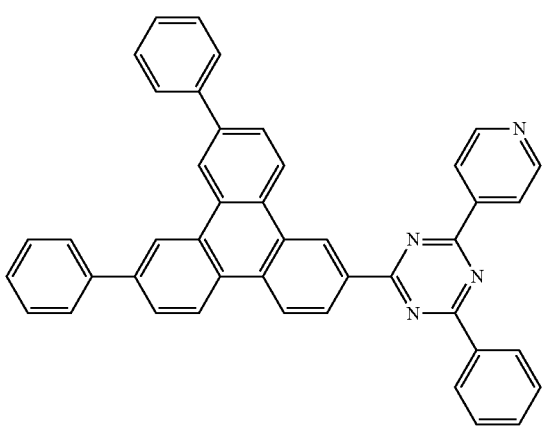
A-106
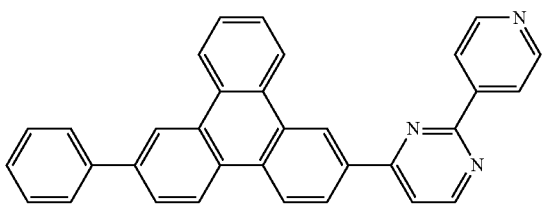
A-107
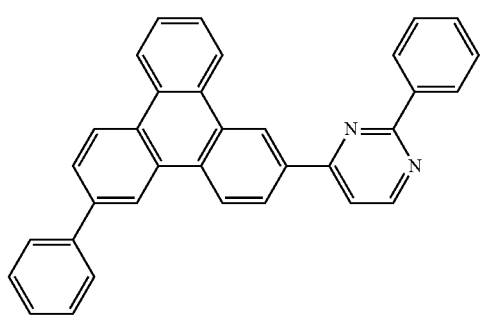

A-108
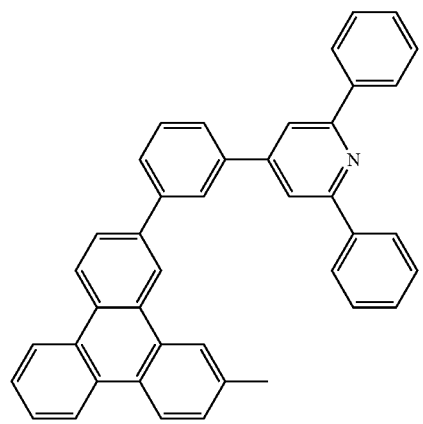
A-109
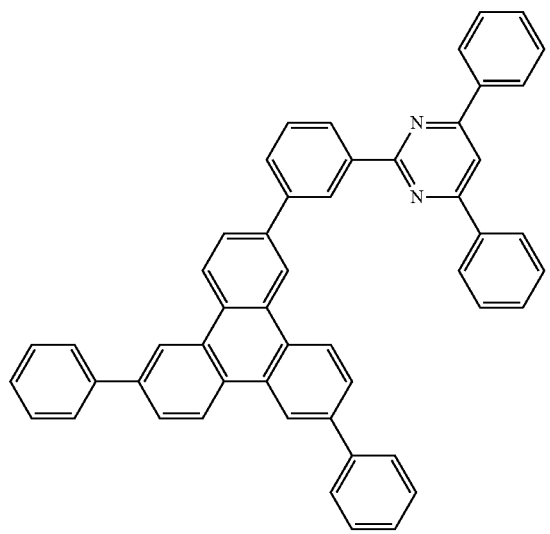
A-110
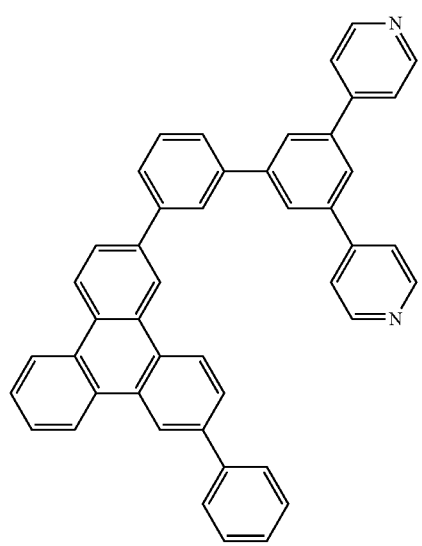
A-111
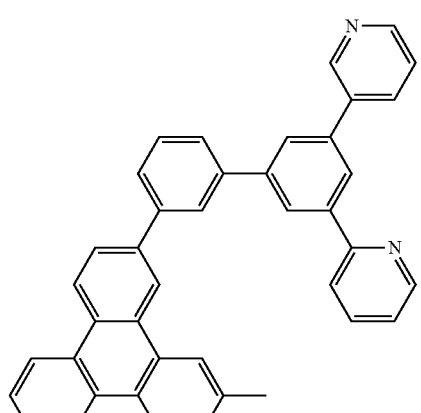
A-112
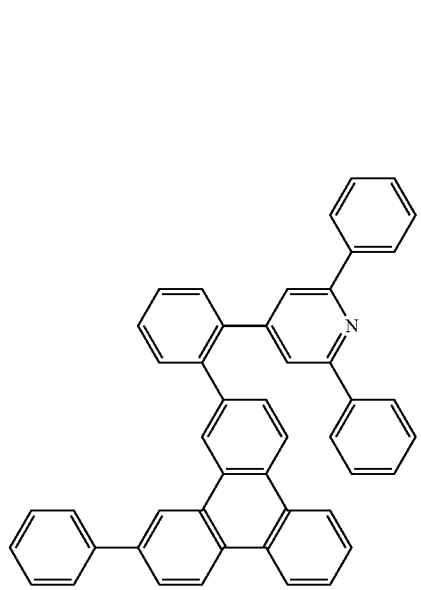
A-113
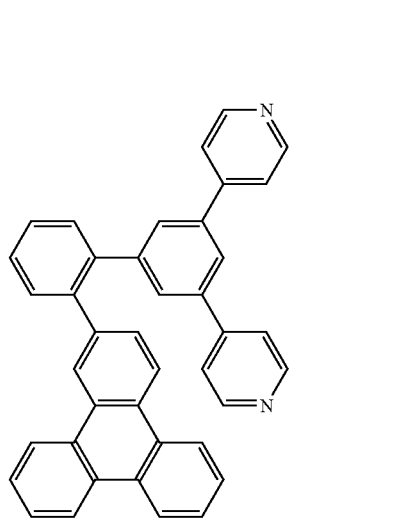

A-114
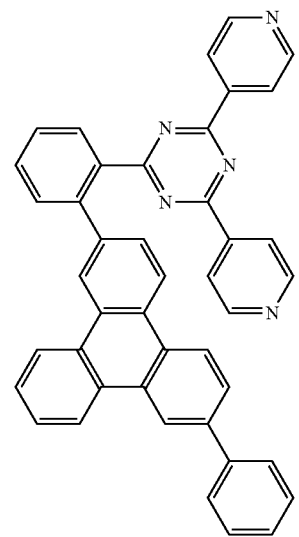
A-115
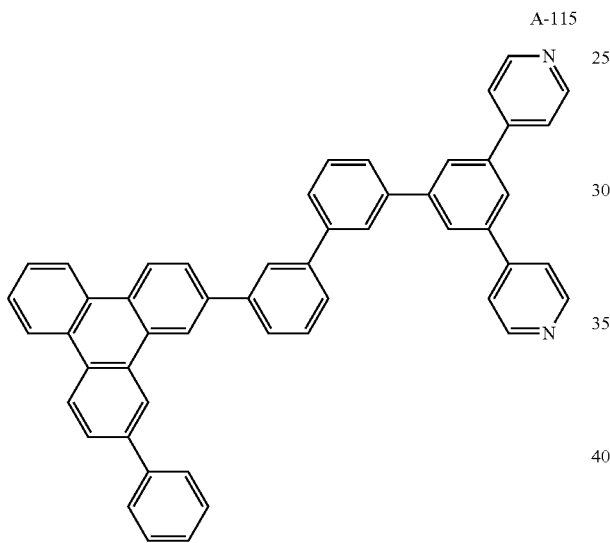
A-116
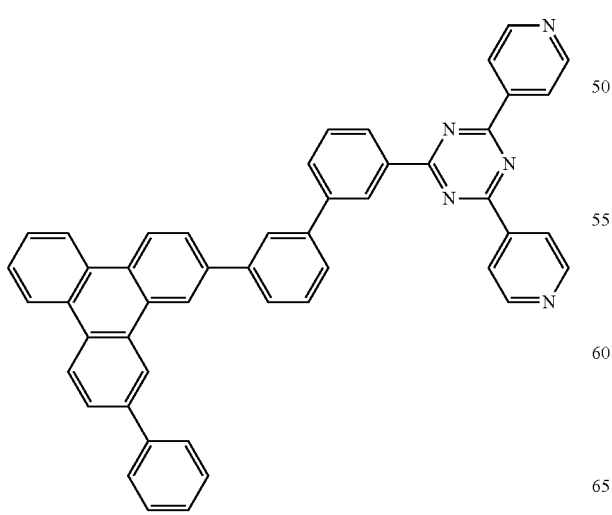
A-117
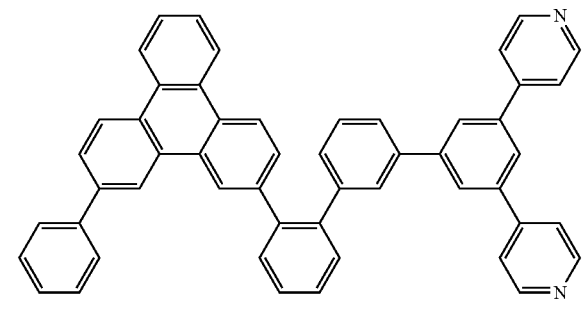
A-118
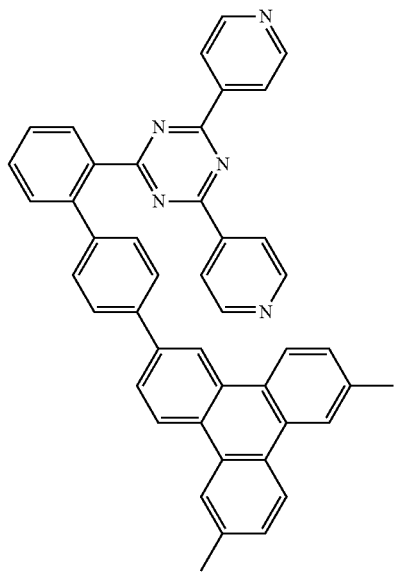
A-119
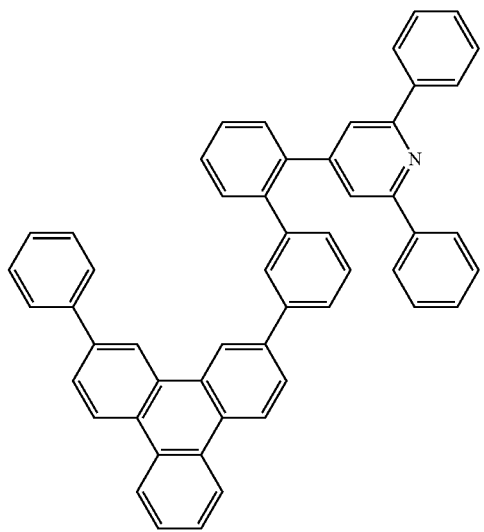

A-120
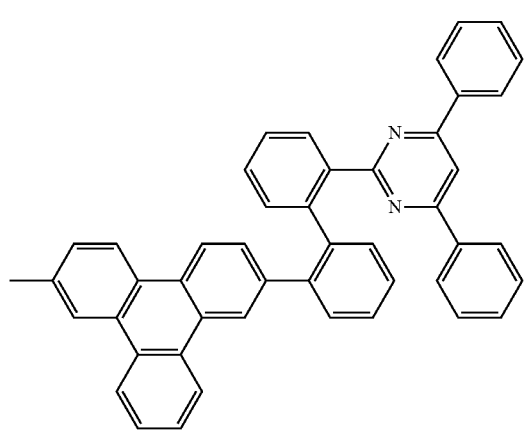
A-121
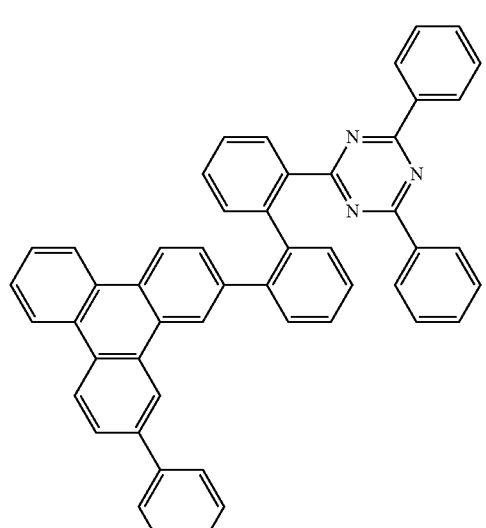
A-122
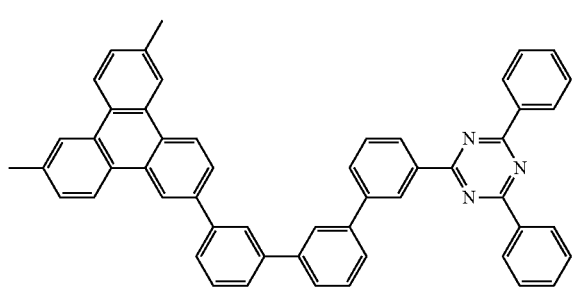
A-123
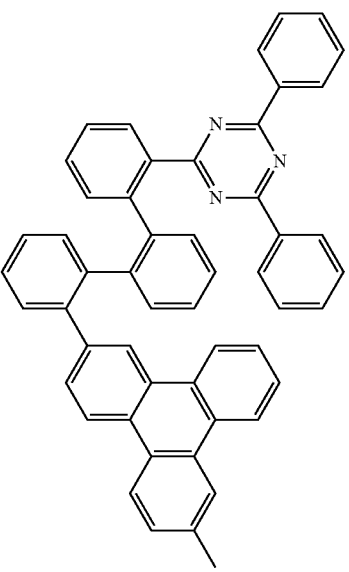
A-124
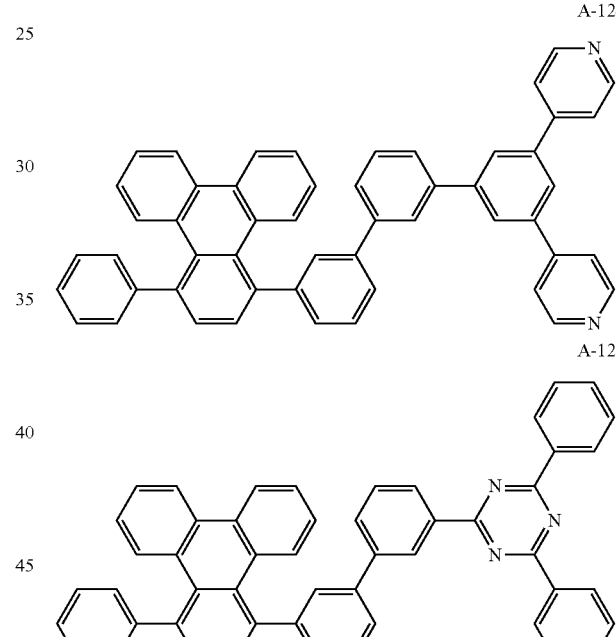
A-125
A-126
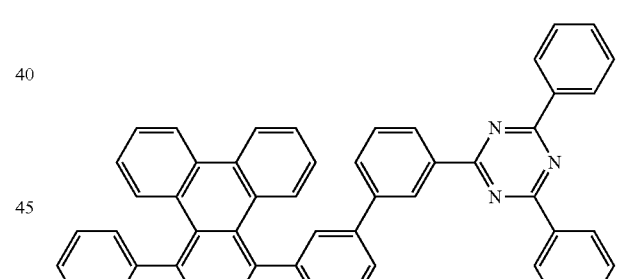
At least one or more kinds of the first organic compound may be used.

The second organic compound may be a compound having relatively strong hole characteristics, for example, a compound represented by the following Chemical Formula 2.

[Chemical Formula 2]

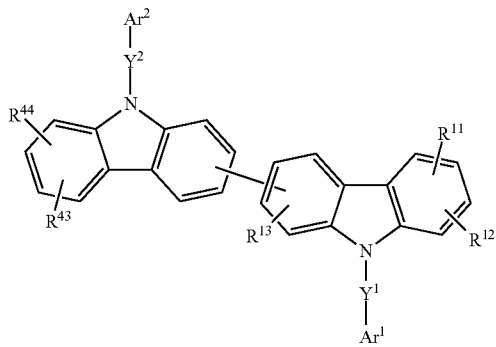

In the above Chemical Formula 2, $Y^1$ and $Y^2$ are independently a single bond, a substituted or unsubstituted C1 to C20 alkylene group, a substituted or unsubstituted C2 to C20 alkenylene group, a substituted or unsubstituted C6 to C30 arylene group, a substituted or unsubstituted C2 to C30 heterocyclic group, or a combination thereof, $Ar^1$ and $Ar^2$ are a substituted or unsubstituted C6 to C30 aryl group, a substituted or unsubstituted C2 to C30 heterocyclic group, or a combination thereof, and $R^{11}$ to $R^{13}$, $R^{43}$ and $R^{44}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof.

The second organic compound is a compound having bipolar characteristics in which hole characteristics are relatively stronger than electron characteristics and thus, increases charge mobility and stability by forming an organic alloy with the first organic compound and resultantly, may improve luminous efficiency and life-span characteristics.

$Ar^1$ and $Ar^2$ of the above Chemical Formula 2 are substitutents having hole or electron characteristics, and may be independently for example a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted triphenylenyl group, a substituted or unsubstituted carbazolyl group, a substituted or unsubstituted benzofuranyl group, a substituted or unsubstituted benzothiophenyl group, a substituted or unsubstituted fluorenyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted dibenzofuranyl group, a substituted or unsubstituted dibenzothiophenyl group, or a combination thereof.

At least one of $Ar^1$ and $Ar^2$ of the above Chemical Formula 2 may be for example substituents having electron characteristics, and may be for example substituents represented by the following Chemical Formula A.

[Chemical Formula A]

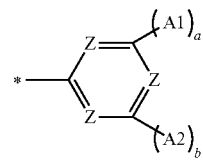

In the above Chemical Formula A,

Z is independently N or $CR^b$,

A1 and A2 are independently a substituted or unsubstituted C6 to C30 aryl group, a substituted or unsubstituted C2 to C30 heterocyclic group, or a combination thereof, at least one of the Z, A1 and A2 includes N, and a and b are independently 0 or 1.

The substituent represented by the above Chemical Formula A may be for example one of functional groups listed in the following Group 3.

[Group 3]

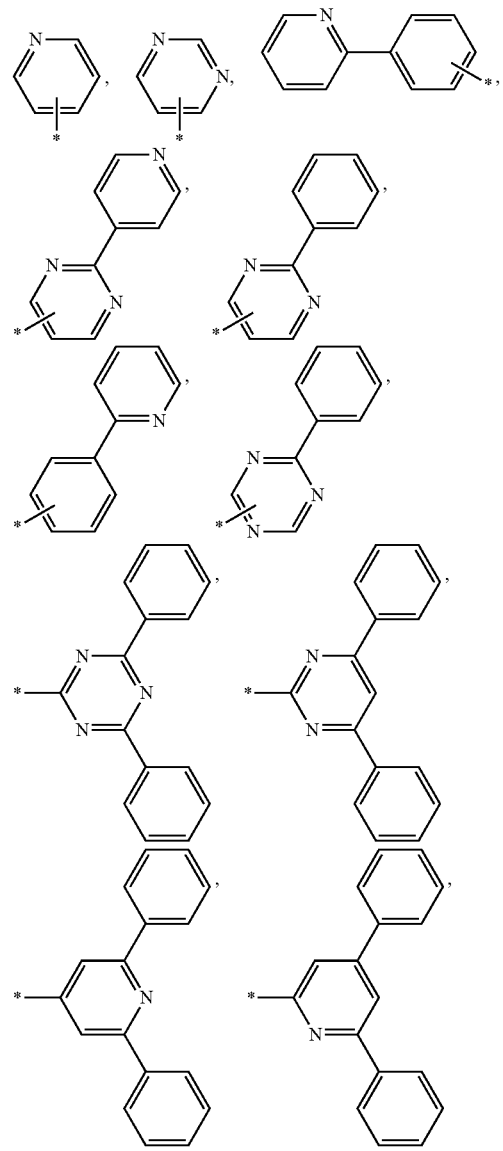

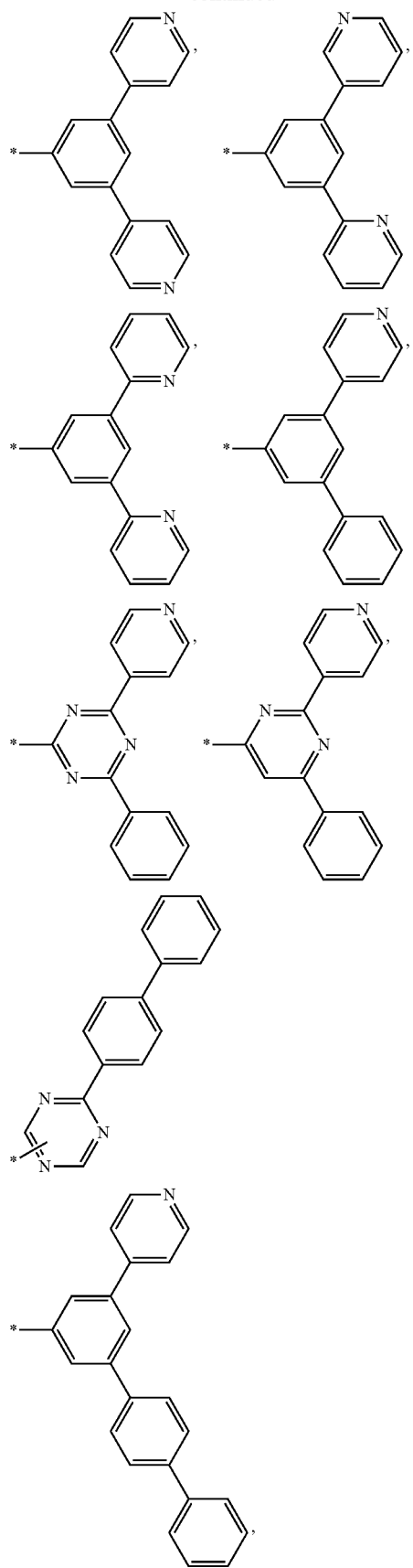
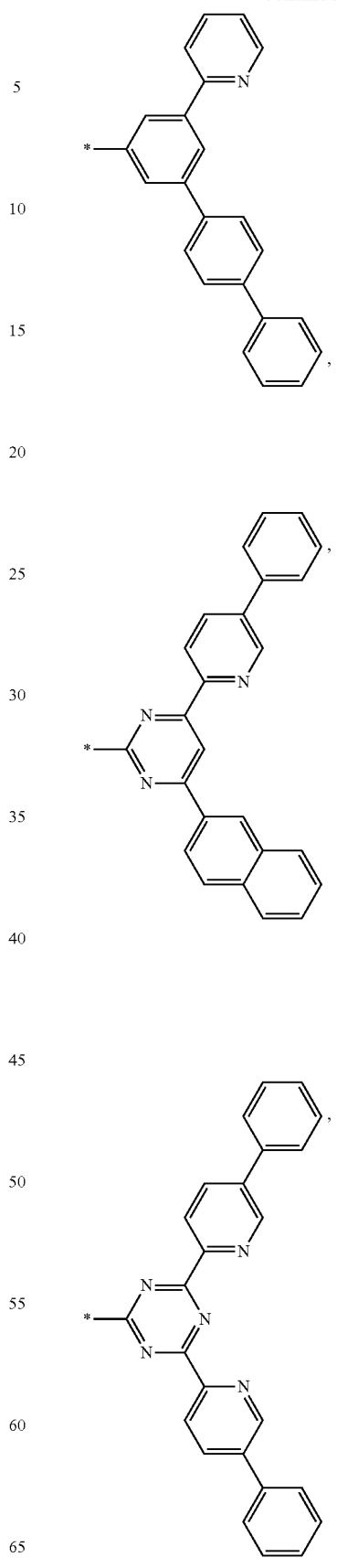

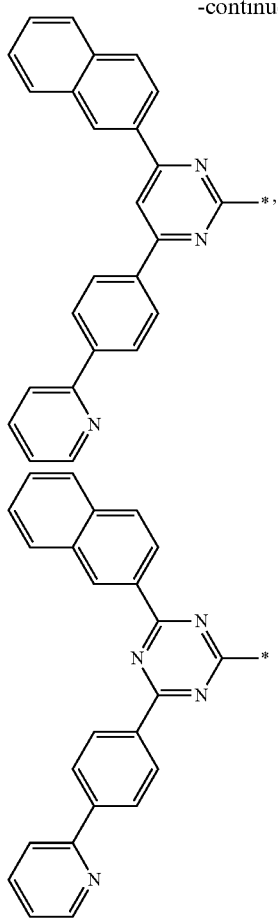

In addition, at least one of Ar$^1$ and Ar$^2$ of the above Chemical Formula 2 may be, for example a substituent having hole characteristics, and may be, for example substituents listed in the following Group 4.

[Group 4]

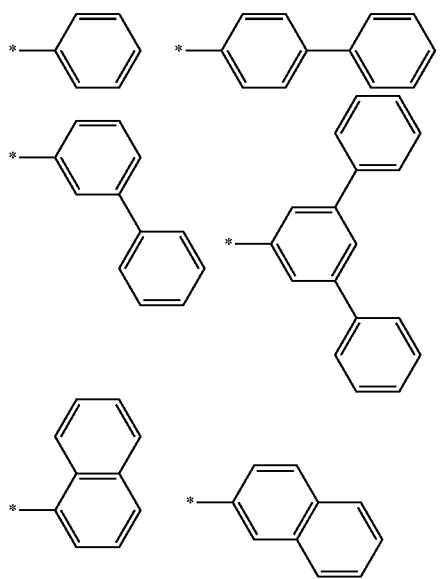

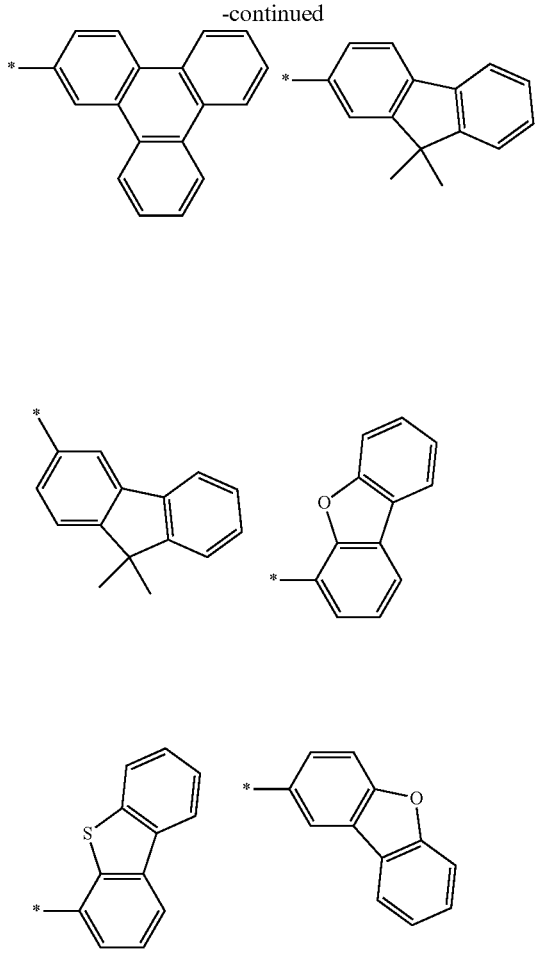

The compound represented by the above Chemical Formula 2 may be, for example selected from compounds listed in the following Group 5, but is not limited thereto.

[Group 5]
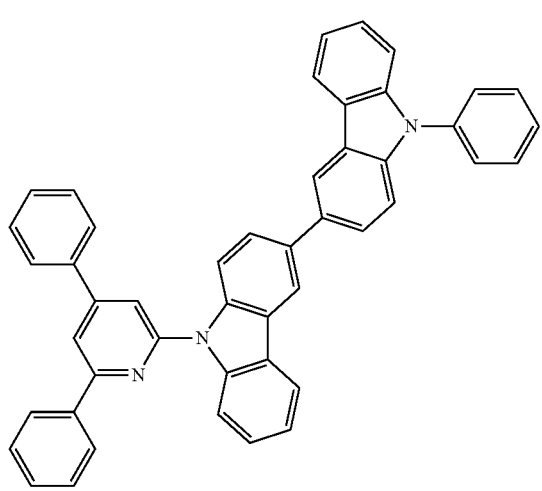
B-10
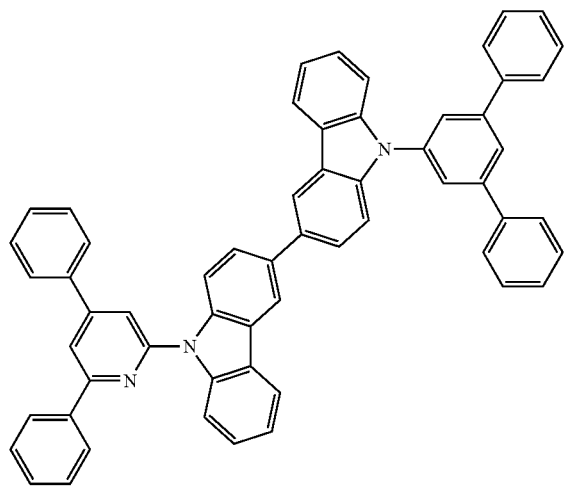
B-13
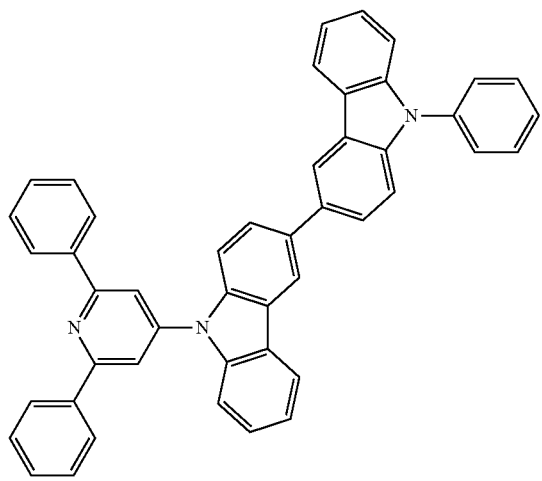
B-11
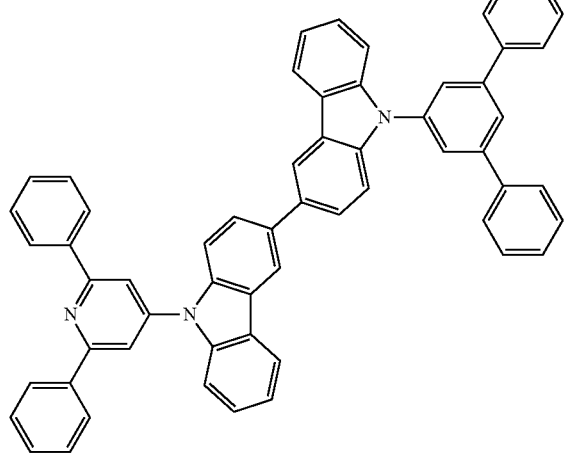
B-14
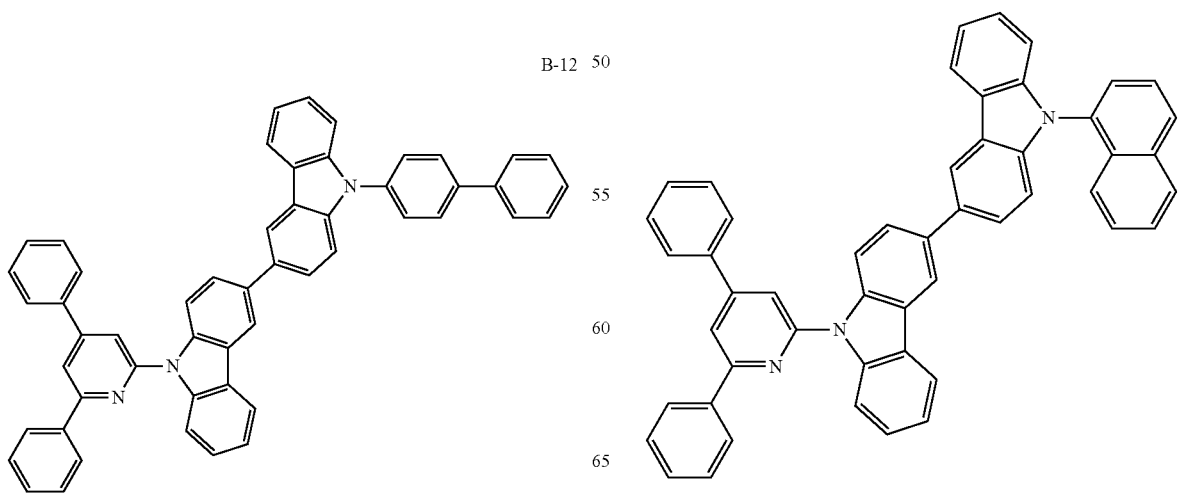
B-12
B-15

B-16
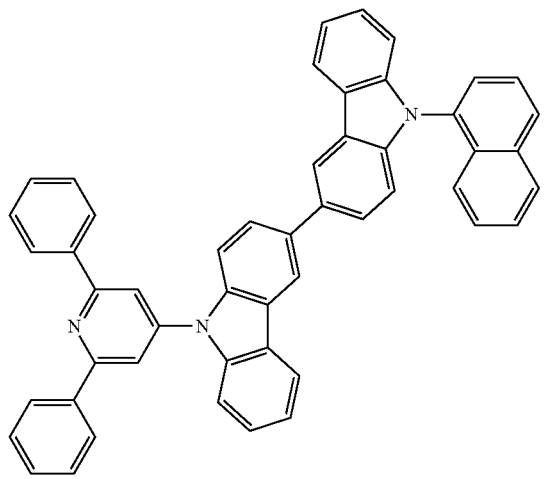
B-17
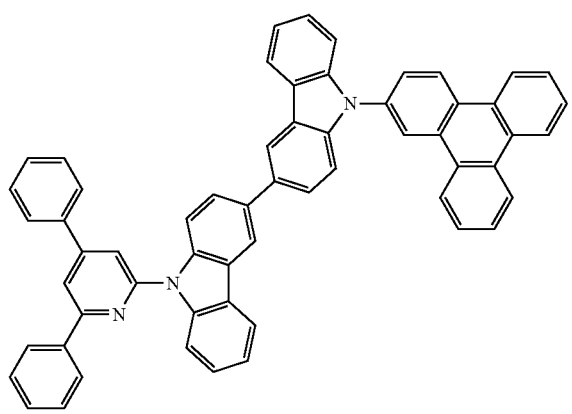
B-18
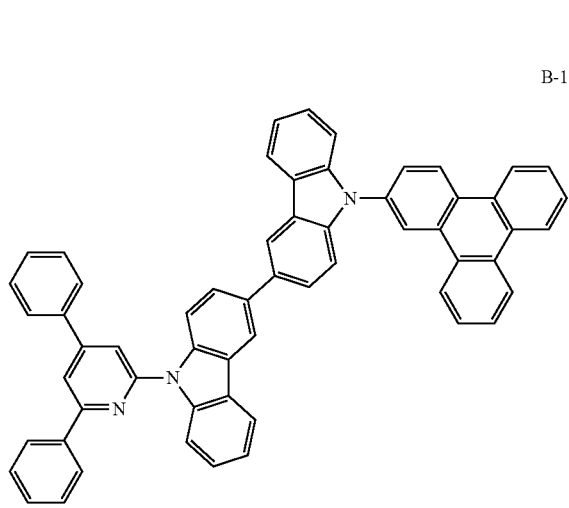
B-19
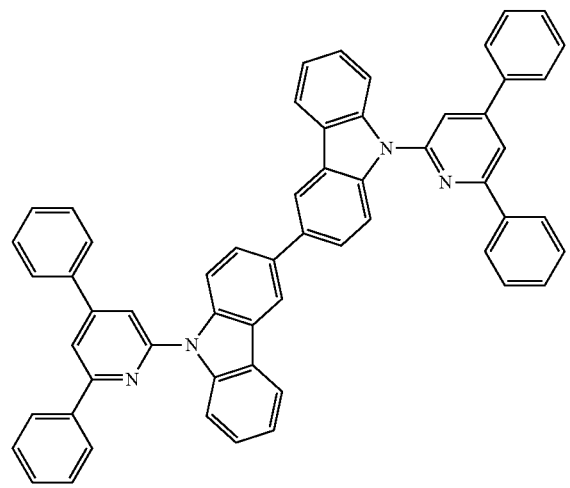
B-20
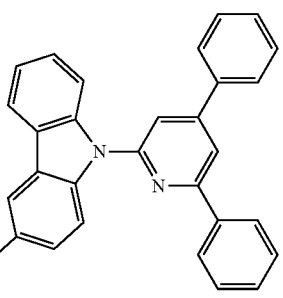
B-21
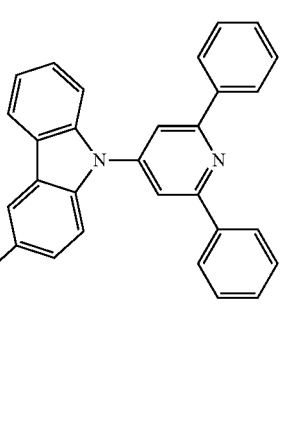

B-22
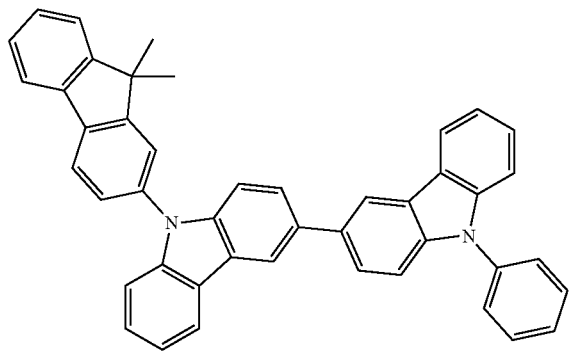
B-23
B-26
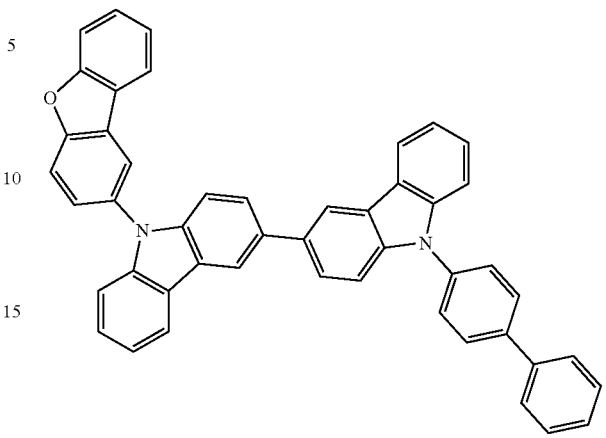
B-24
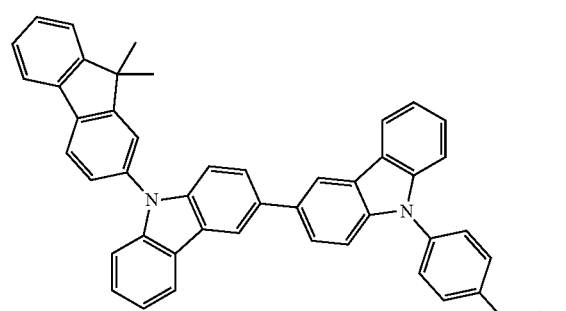
B-27
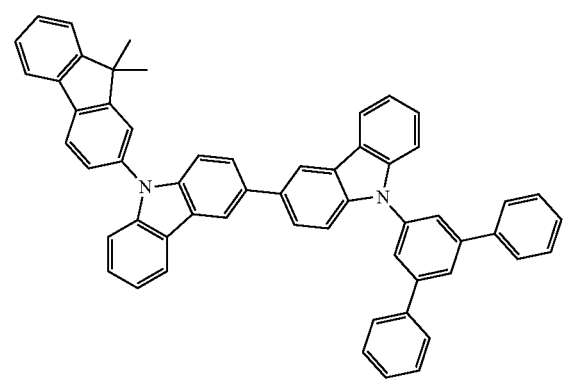
B-25
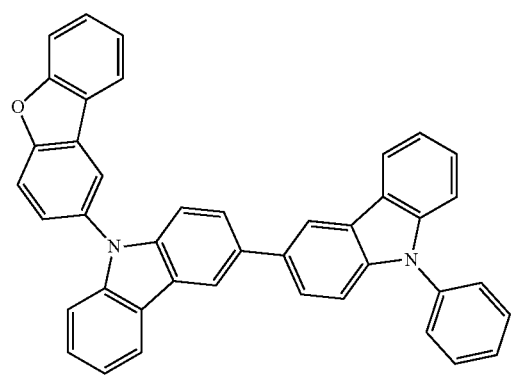
B-28
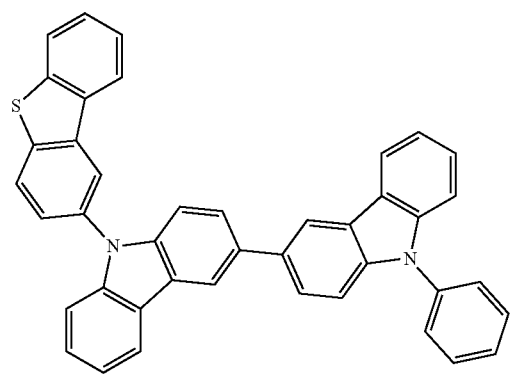

B-29
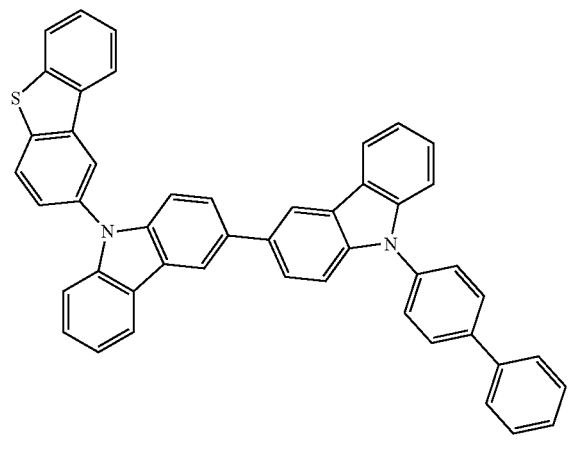
B-30
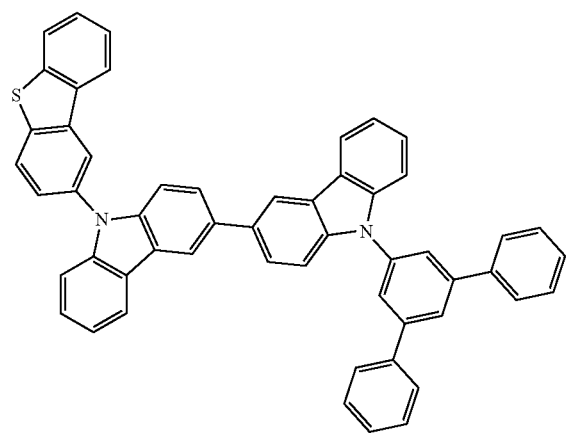
B-31
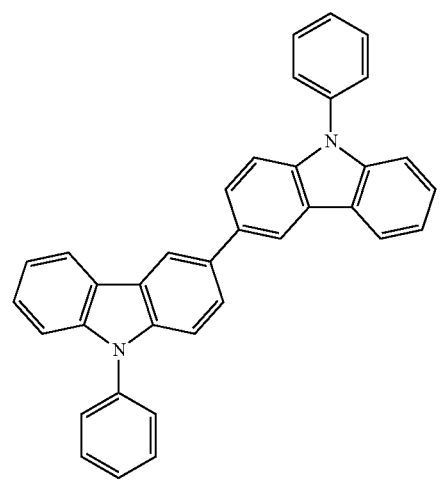
B-32
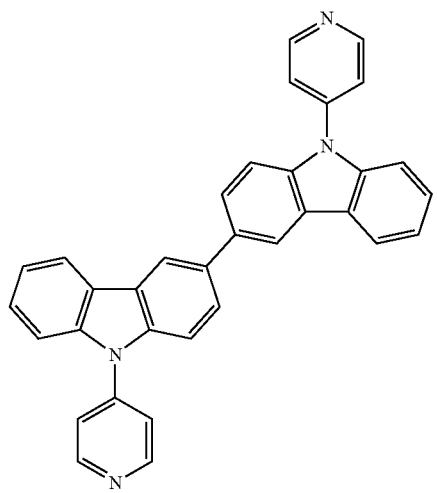
B-33
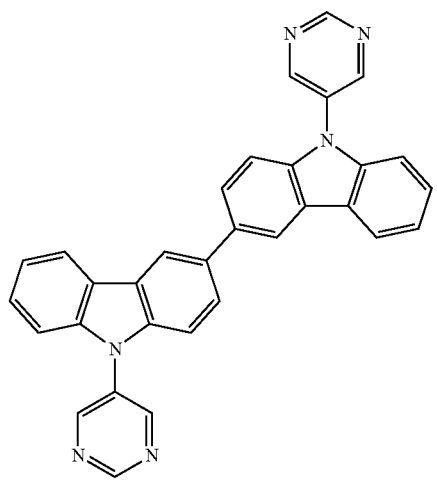
B-34
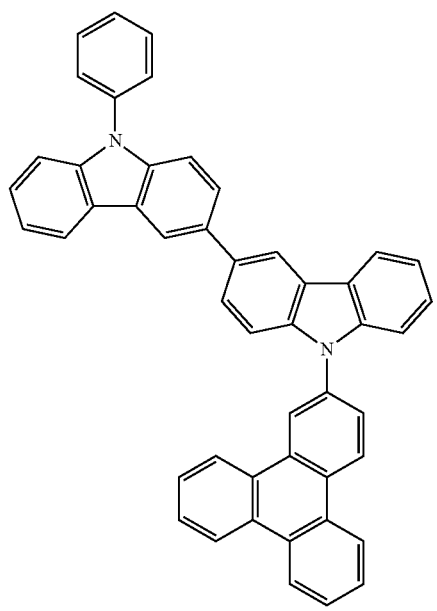

B-35
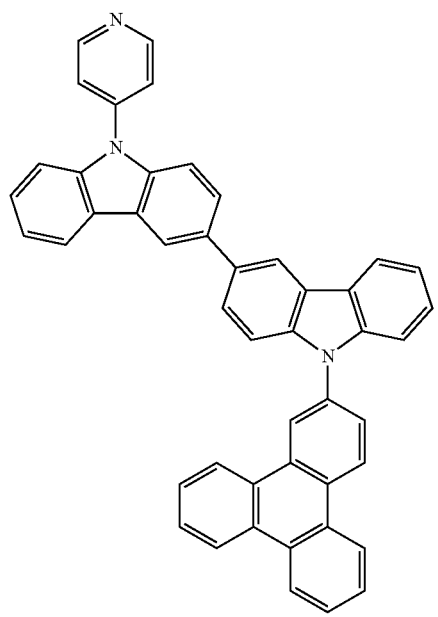
B-40
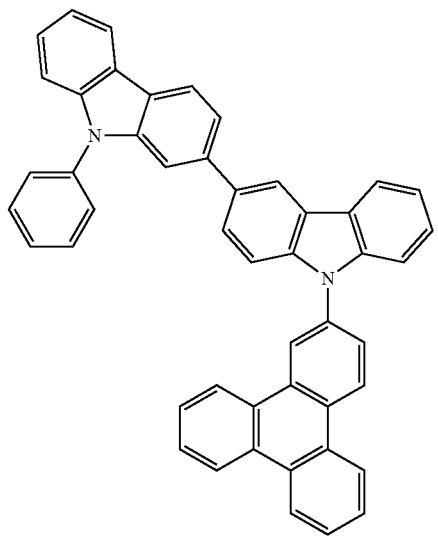
B-37
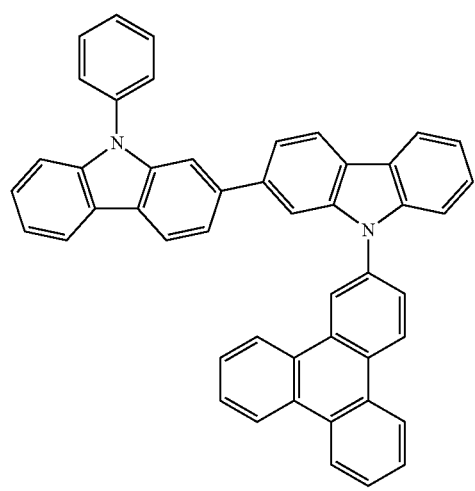
B-38
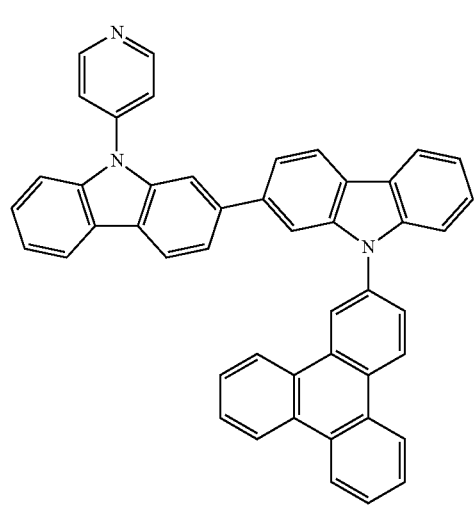
B-41
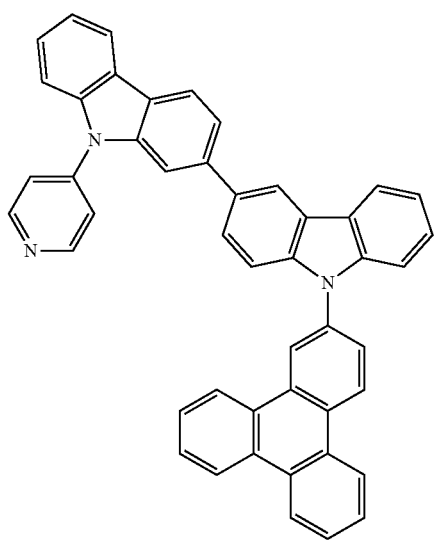

-continued
B-43
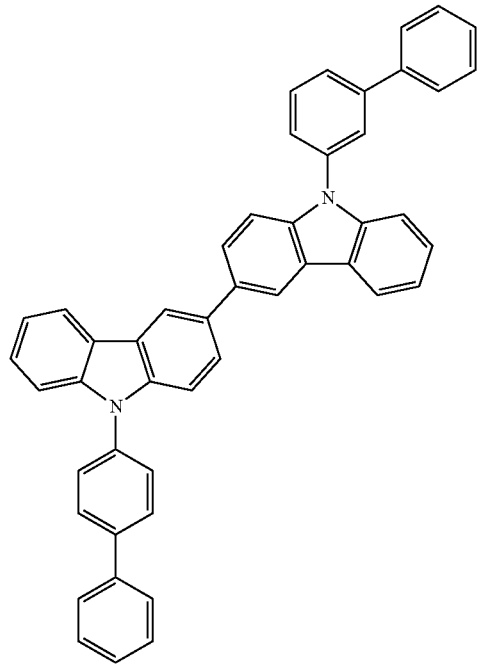
B-45
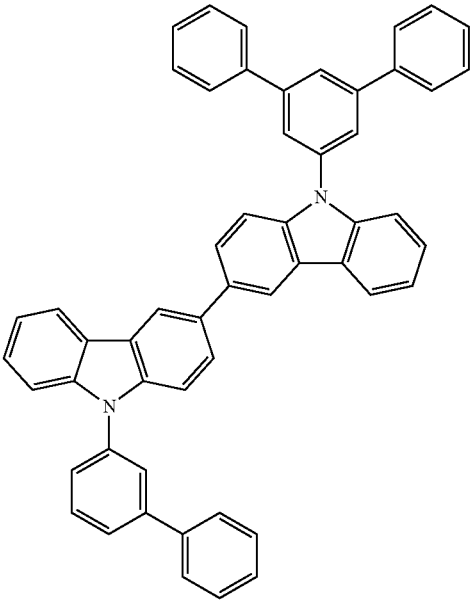
B-44
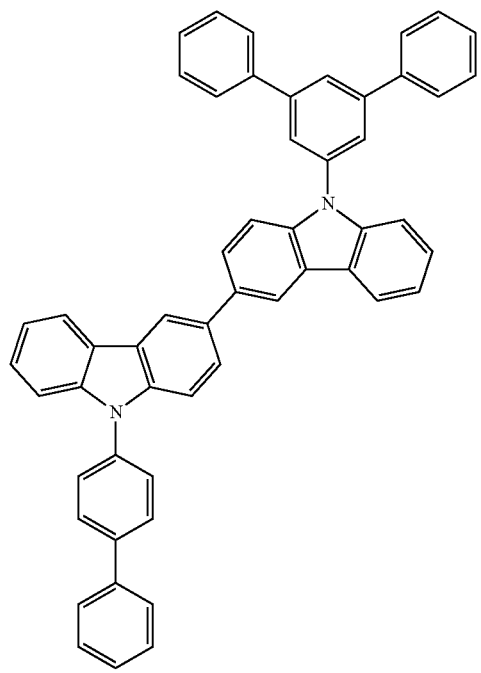
B-46
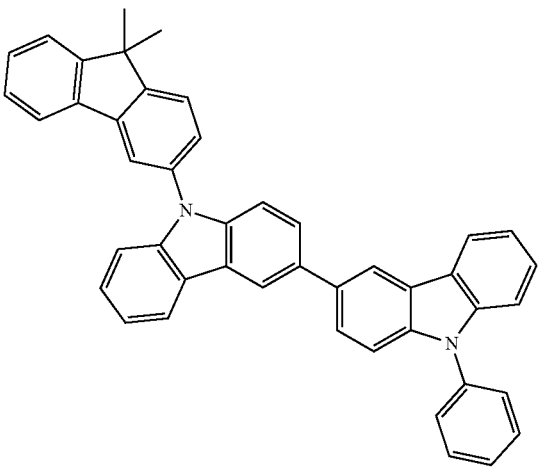

B47
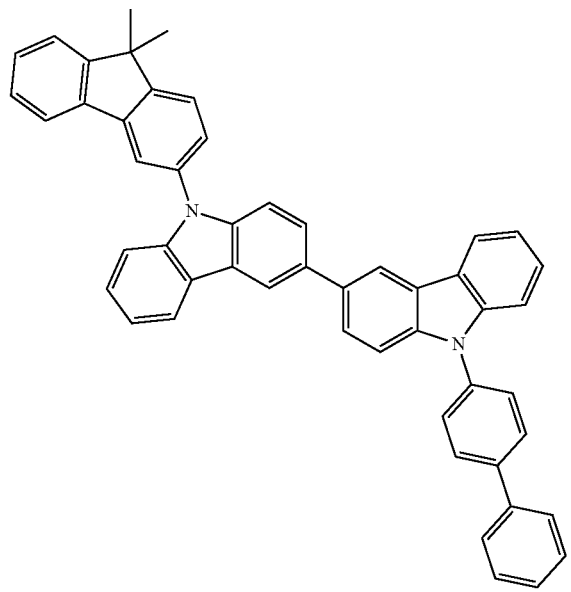
B-48
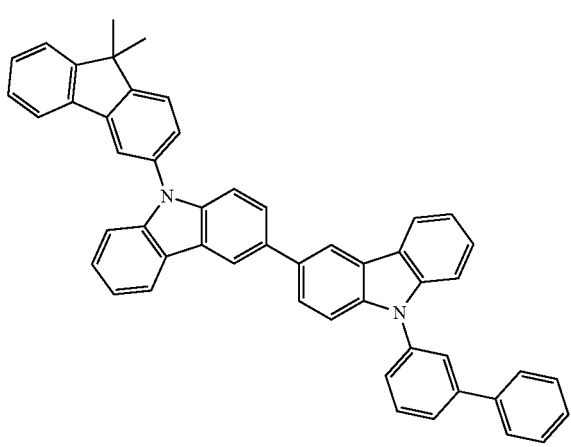
B-49
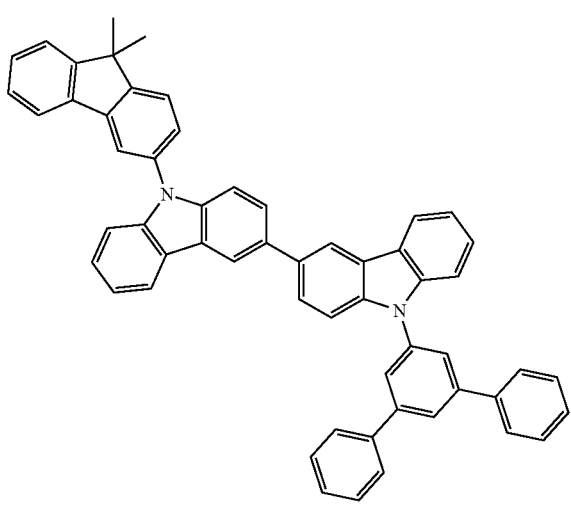
B-50
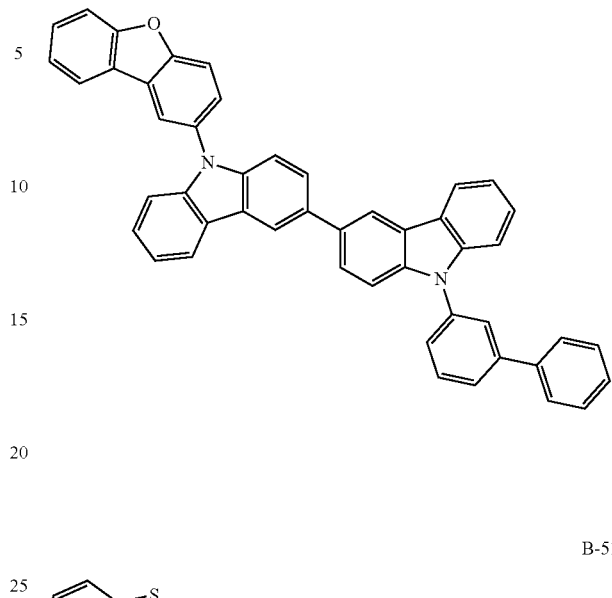
B-51
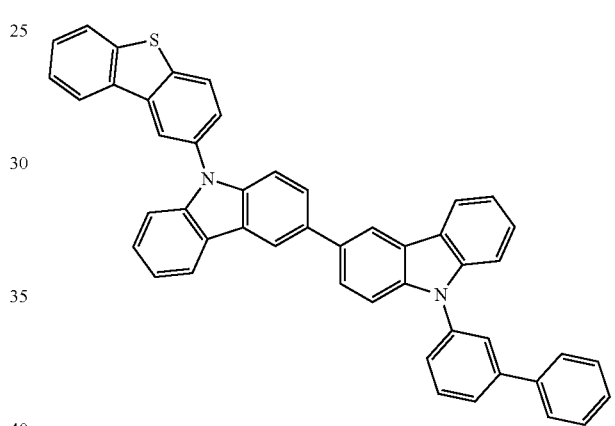
B-52
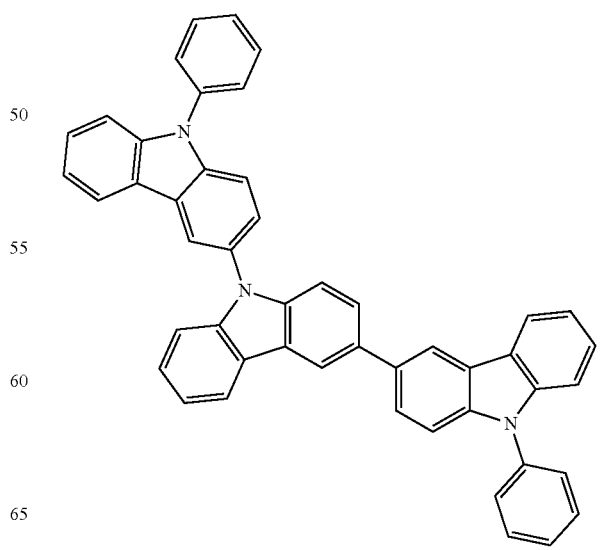

B-53
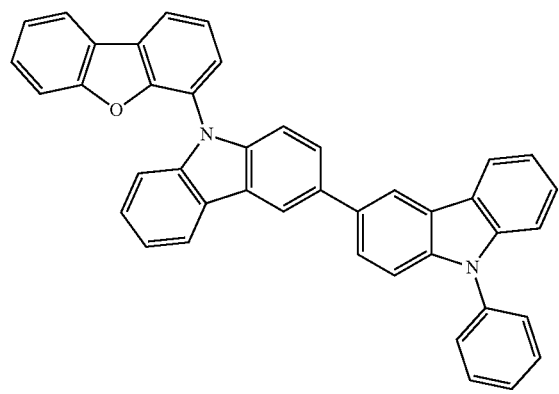
B-54
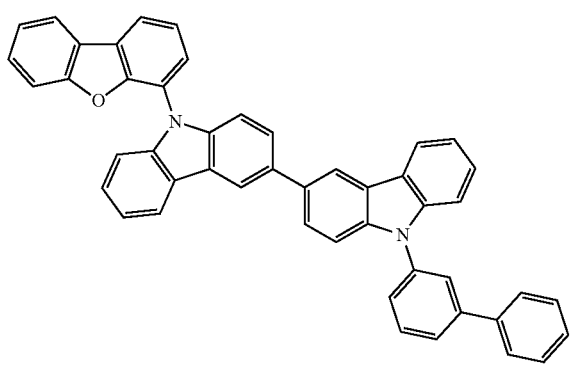
B-55
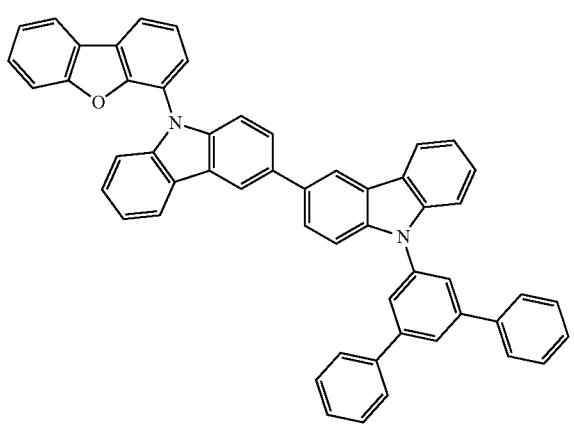
B-56
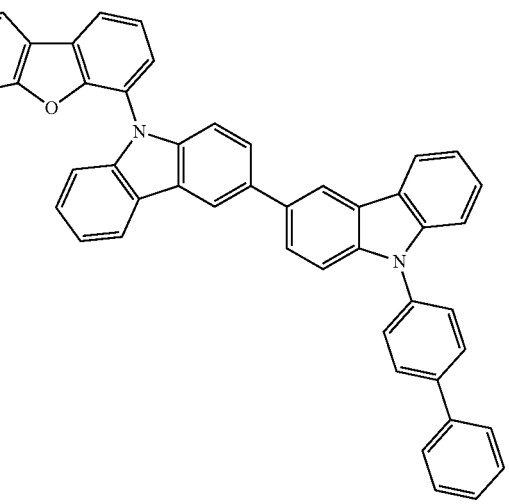
B-57
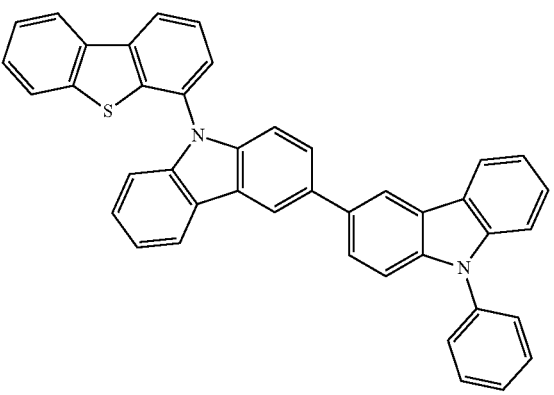
B-58
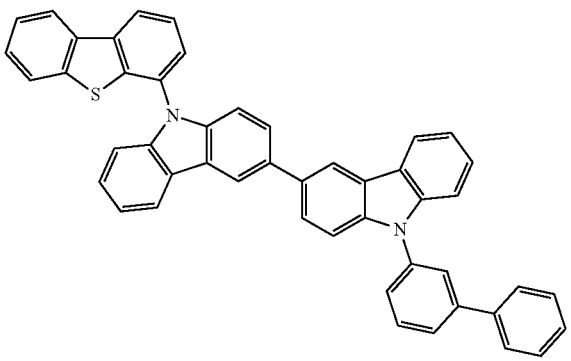

B-59
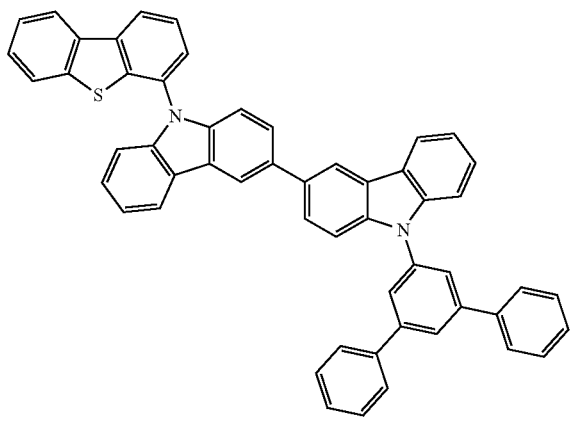
B-60
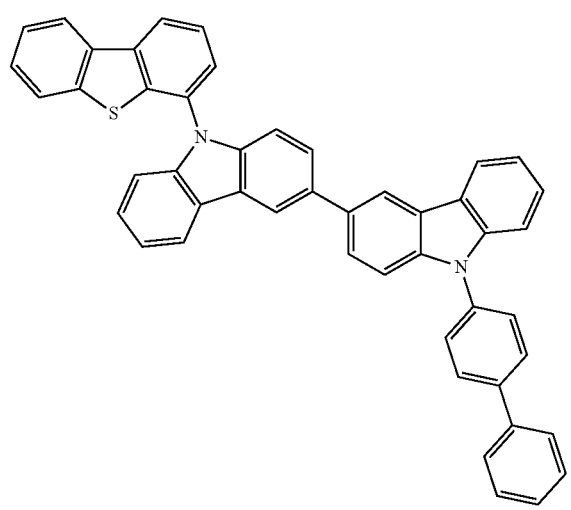
B-61
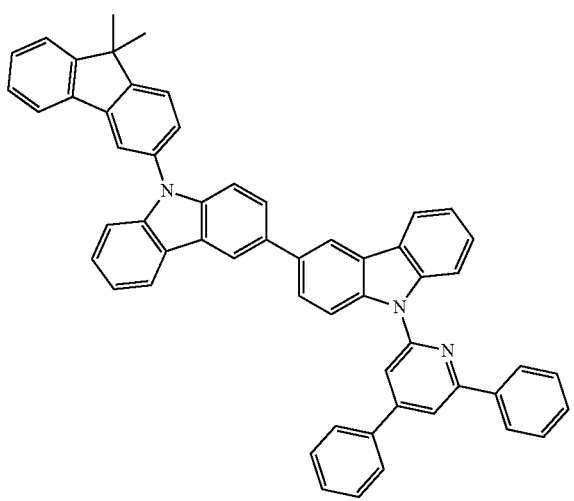
B-62
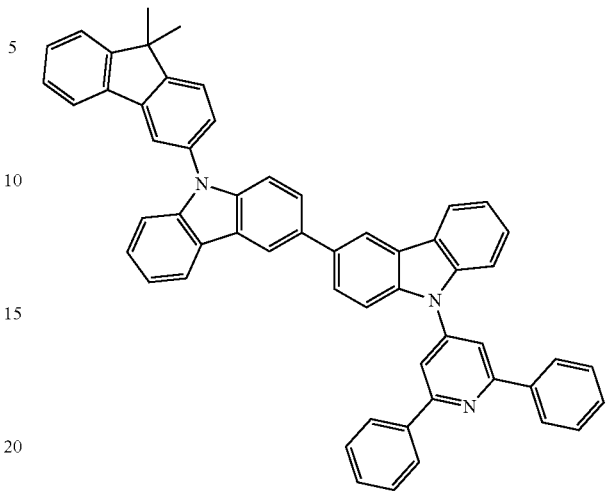
B-63
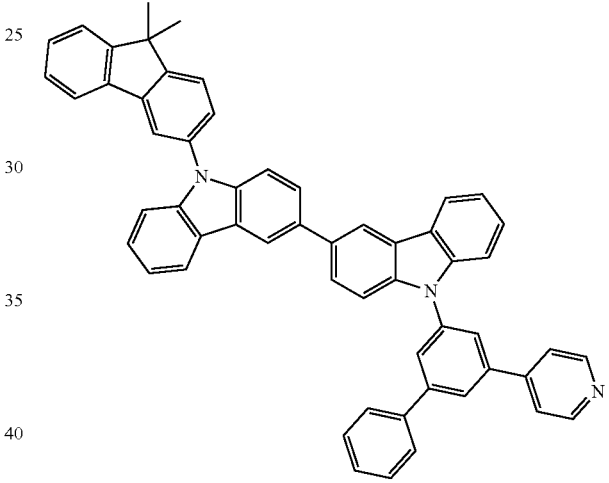
B-64
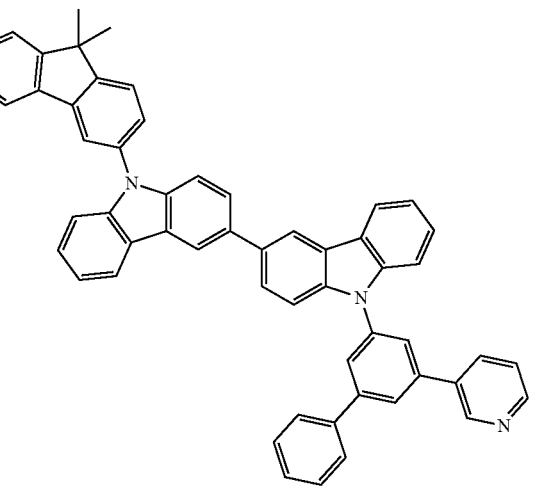

-continued
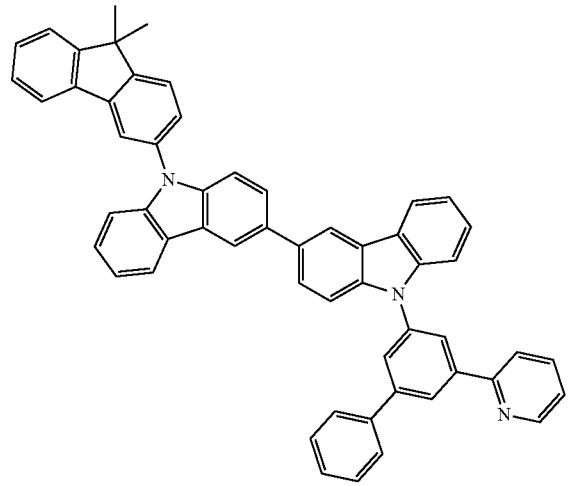
B-65
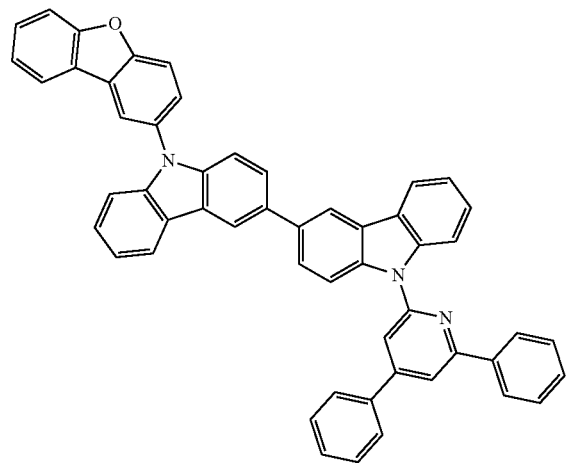
B-66
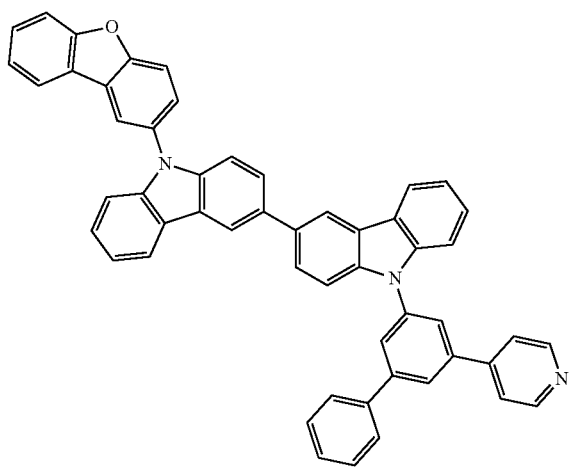
B-67
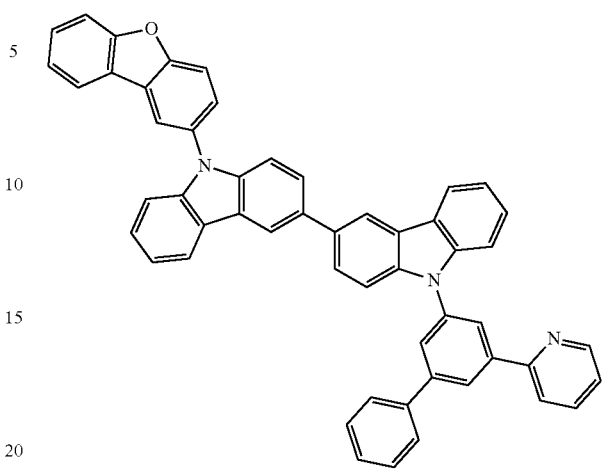
B-68, B-69, B-70

B-71
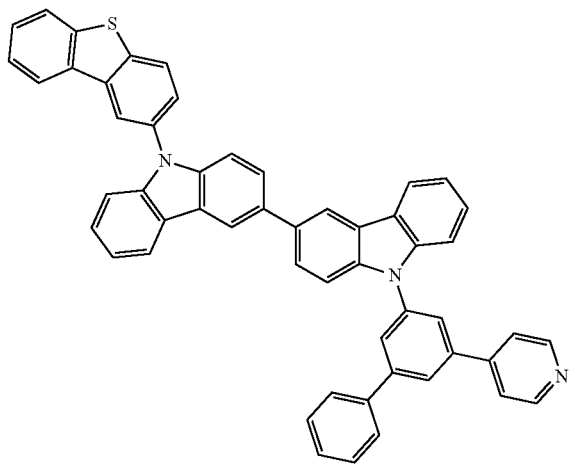
B-72
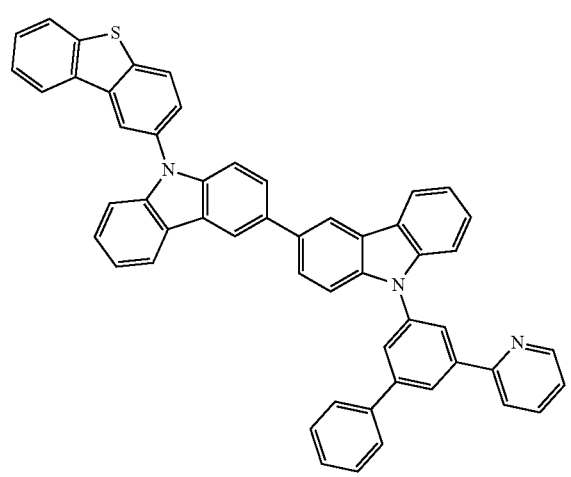
B-73
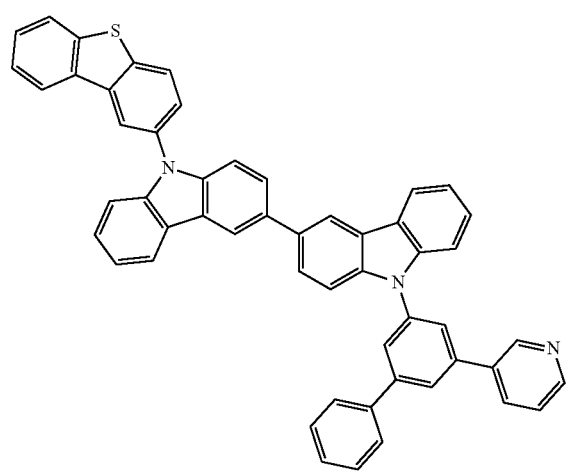
B-74
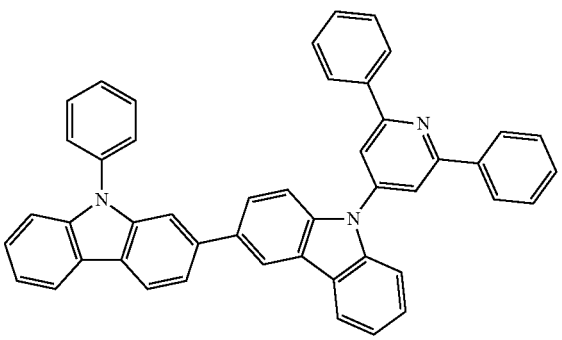
B-75
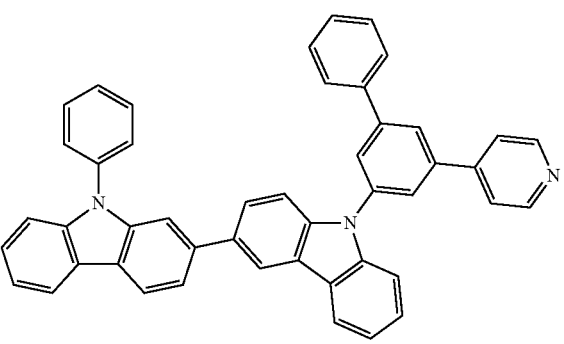
B-76
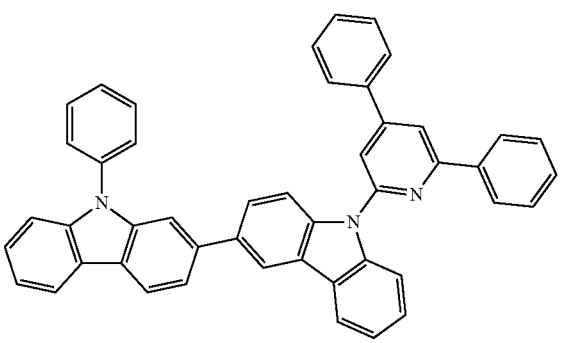
B-77
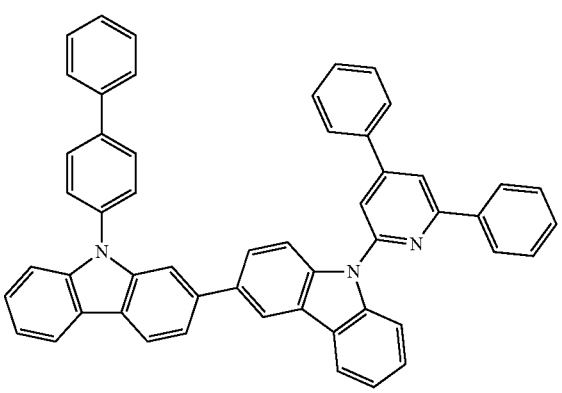

B-78
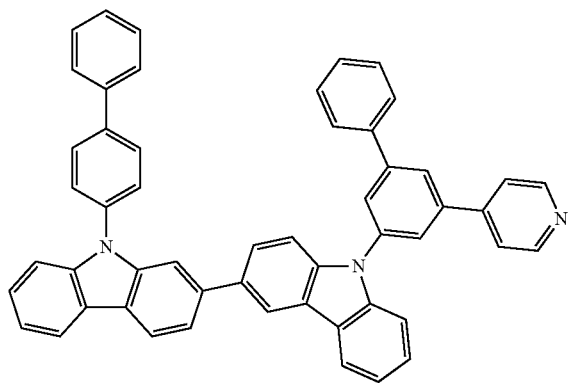
B-79
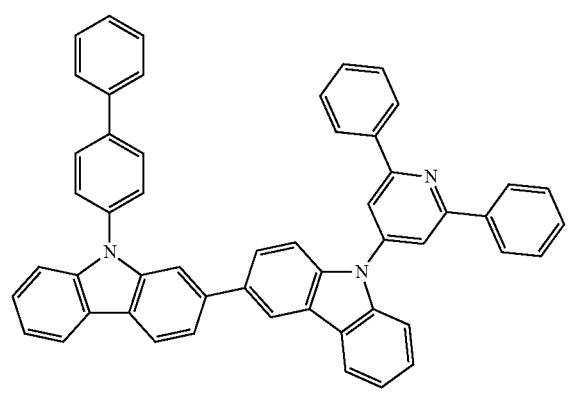
B-80
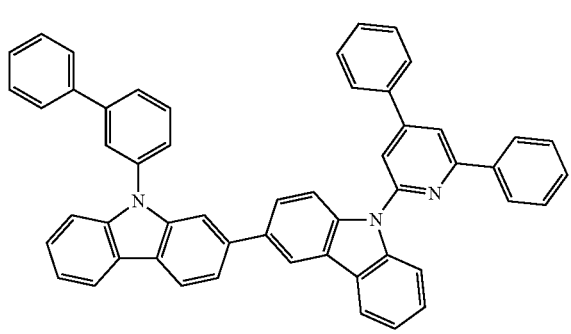
B-81
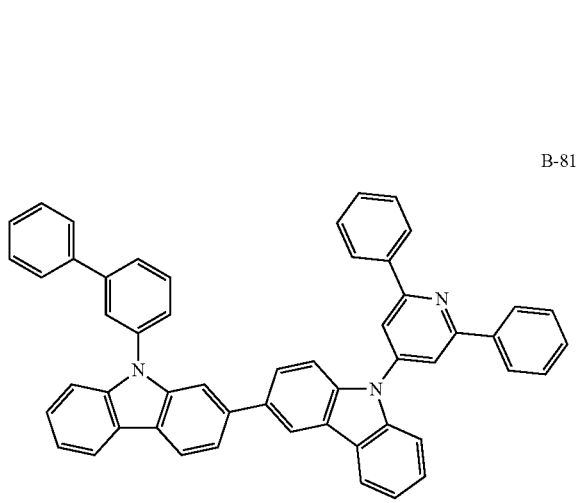
B-82
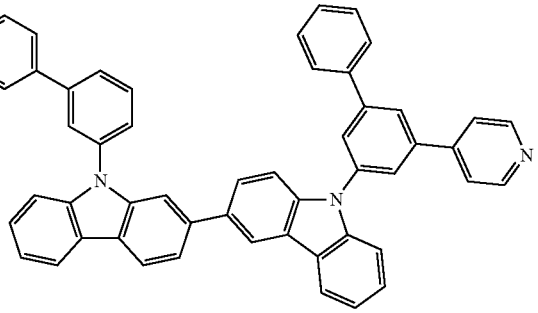
B-83
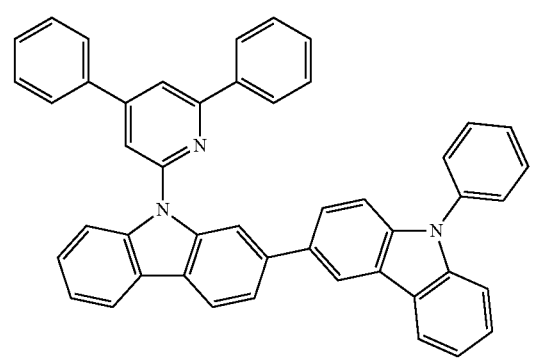
B-84
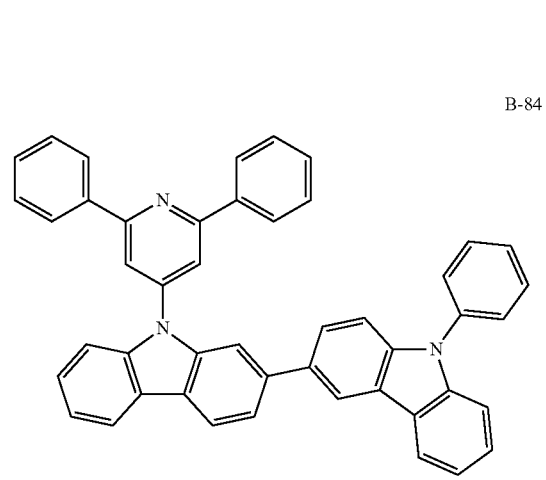
B-85
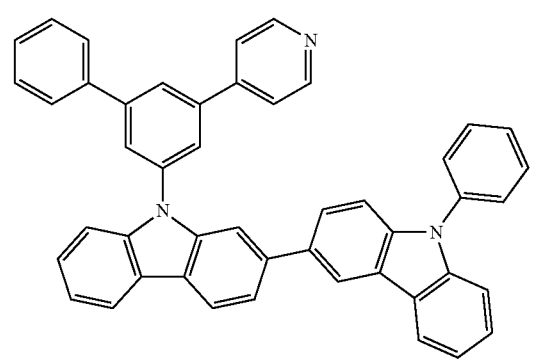

B-86
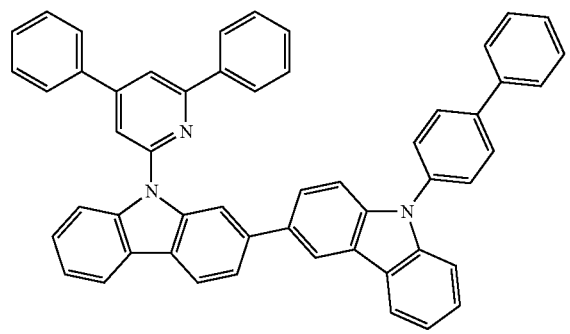
B-87
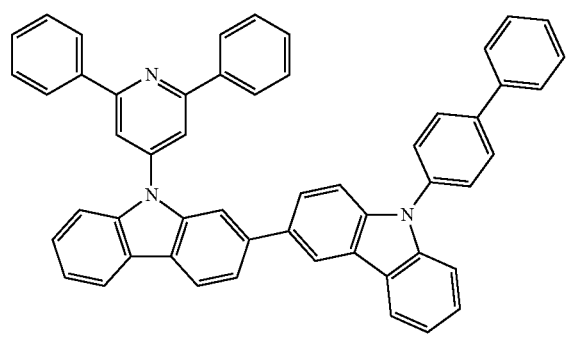
B-88
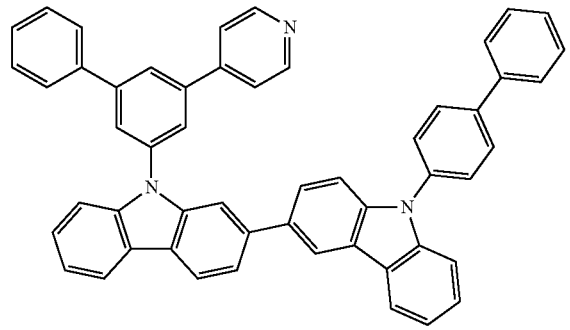
B-89
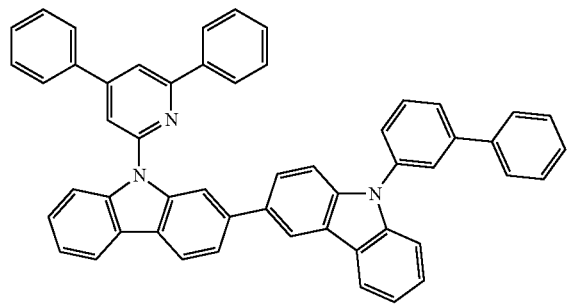
B-90
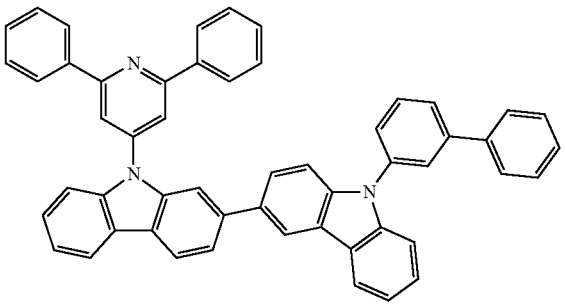
B-91
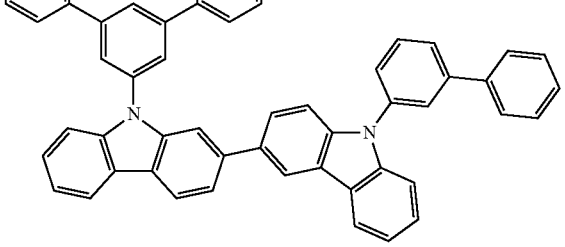
B-92
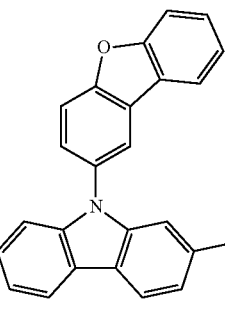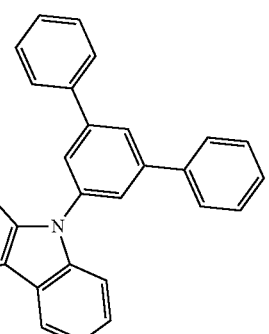
B-93
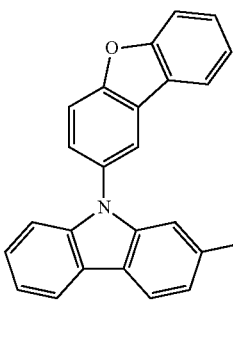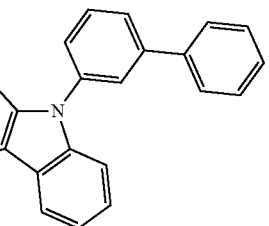

B-94
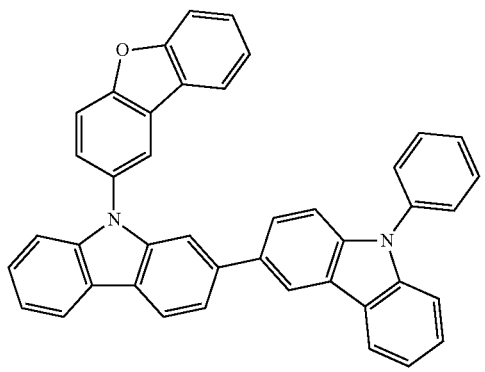
B-95
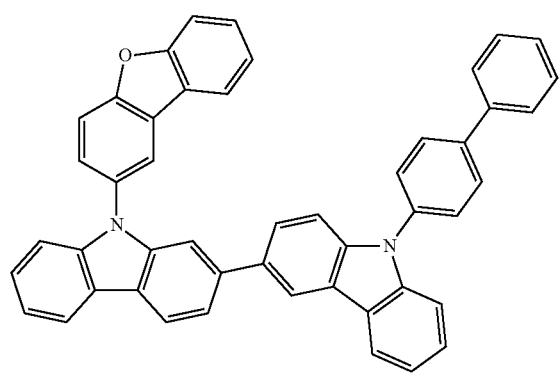
B-96
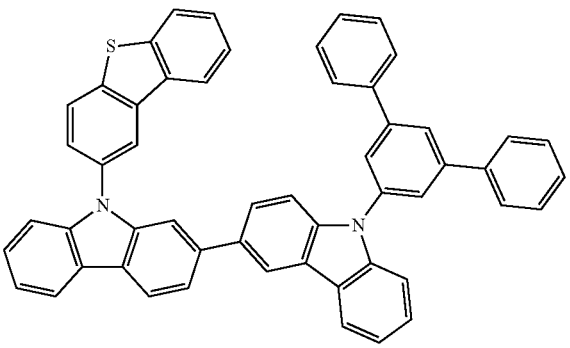
B-97
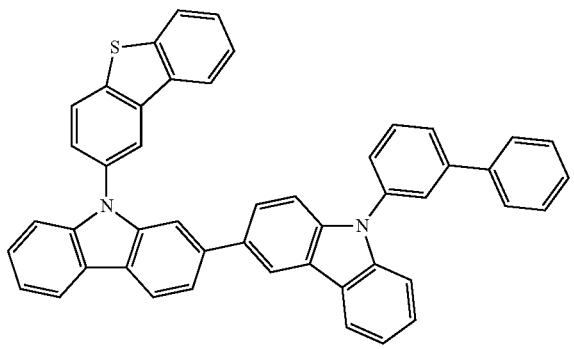
B-98
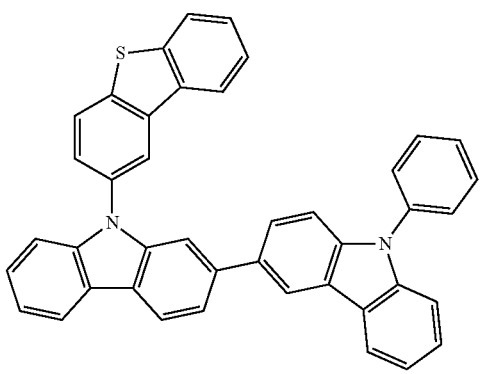
B-99
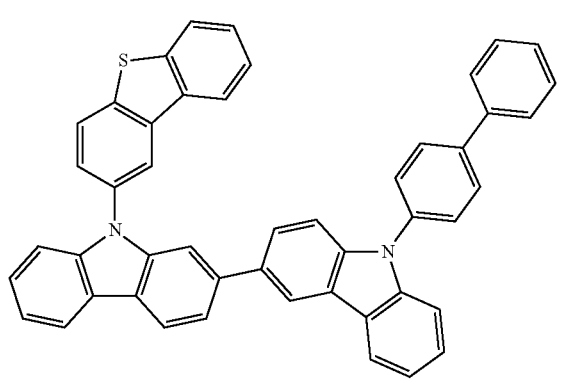
B-100
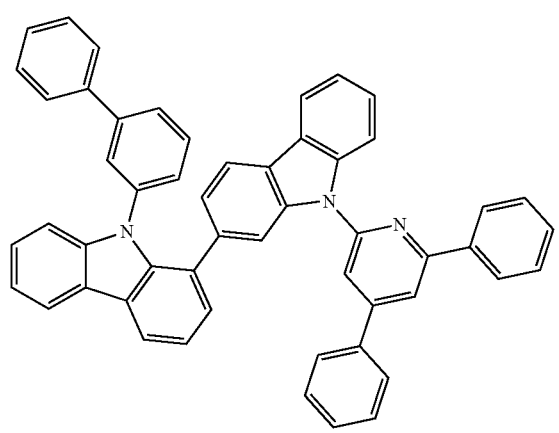
B-101
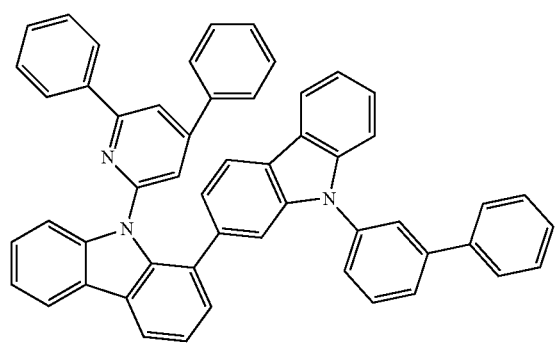

B-102
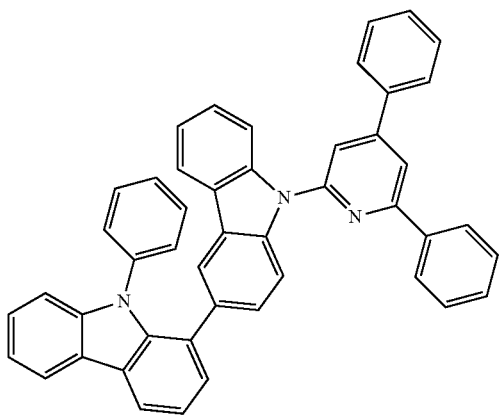
B-103
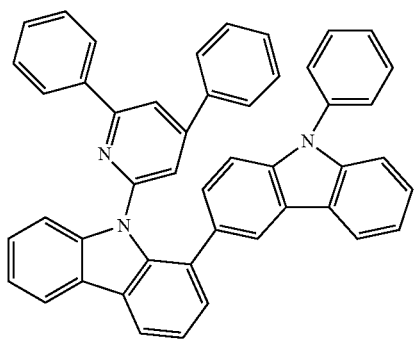
B-104
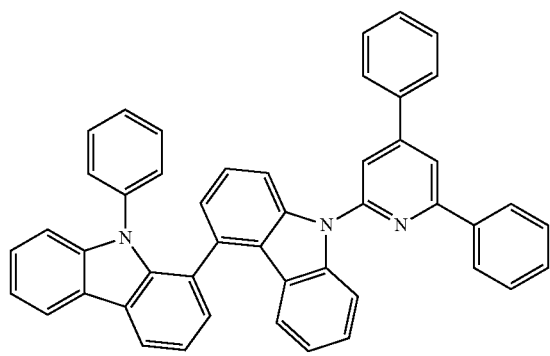
B-105
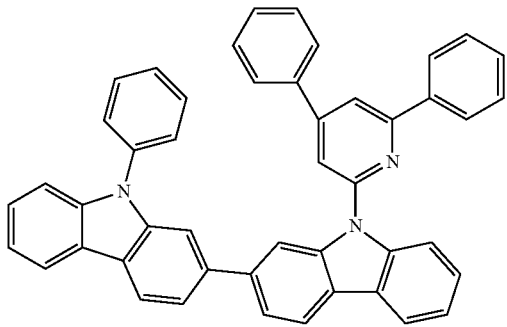
B-106
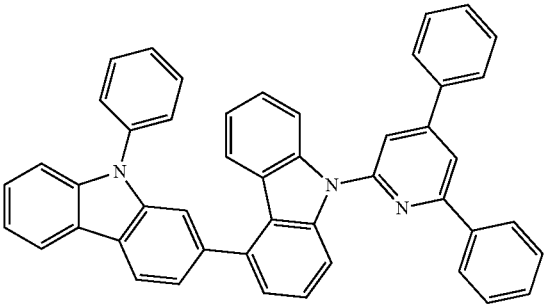
B-107
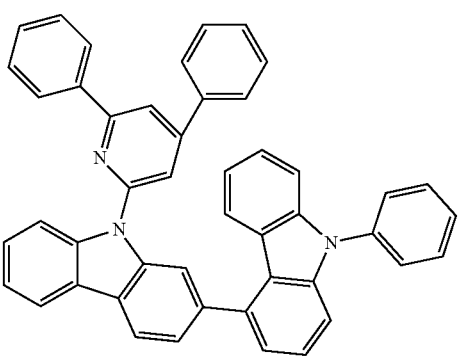
B-108
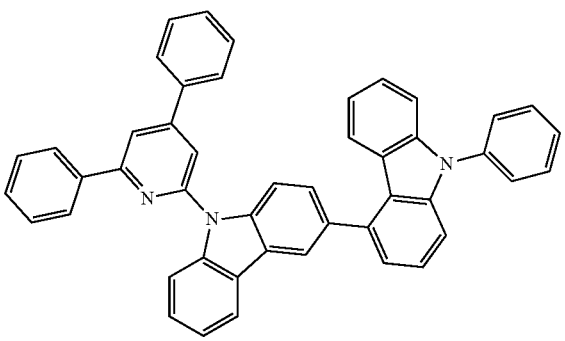
B-109
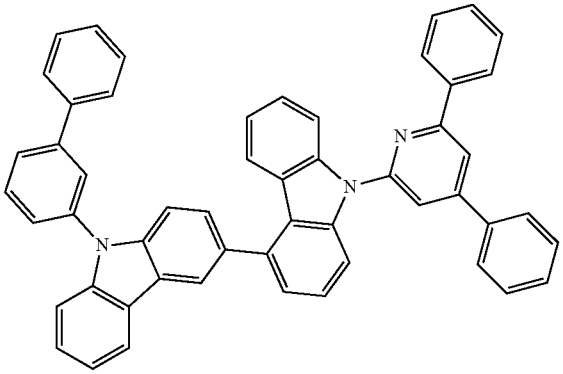

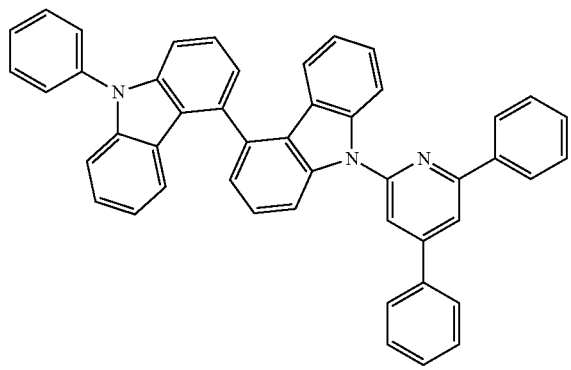

B-110

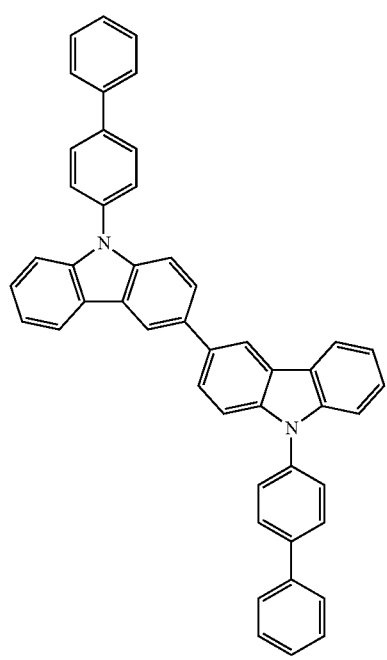

B-111

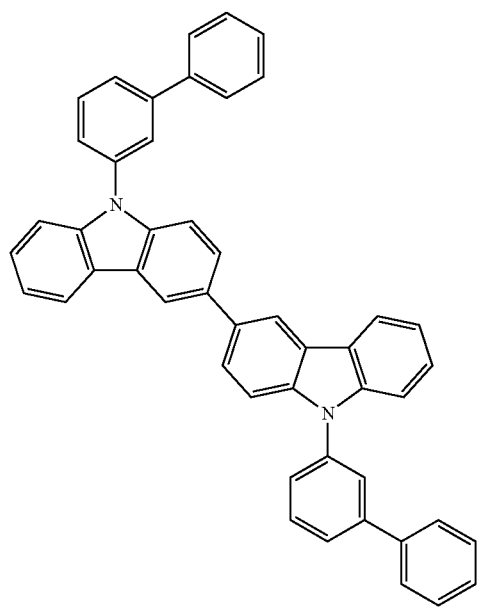

B-112

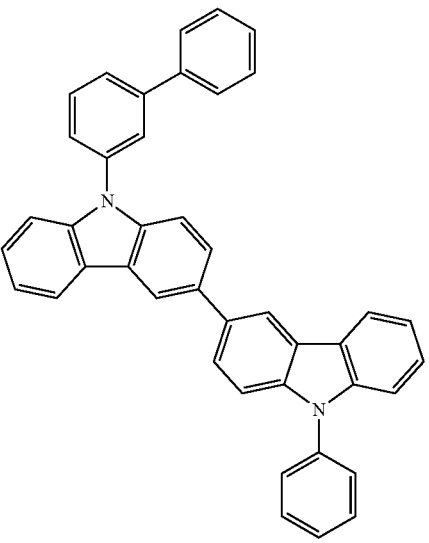

B-113

At least one or more kinds of the second organic compound may be used.

The above first and second organic compounds may be variously combined to prepare various organic alloys. For example the first organic compound may be at least one of compounds listed in the following Group A, and the second organic compound may be at least one of compounds listed in the following Group B, but they are not limited thereto.

[Group A]

A-33

A-60
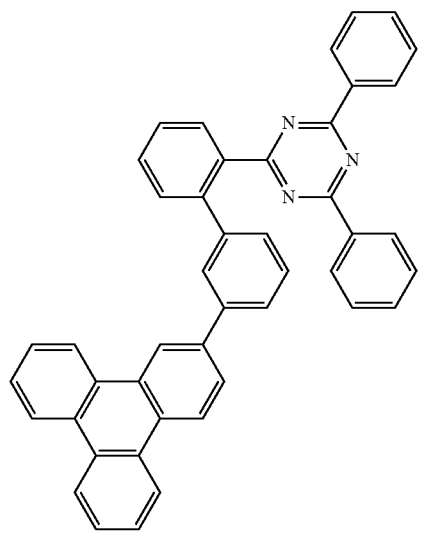
A-69
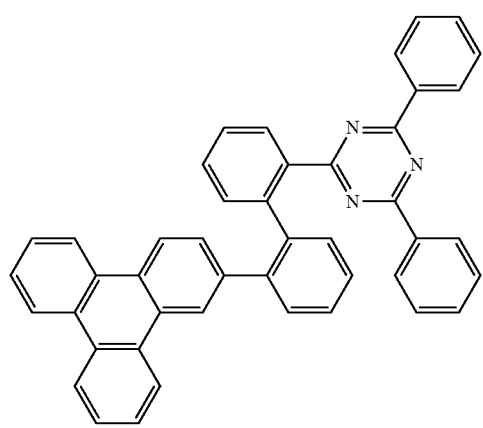
A-87
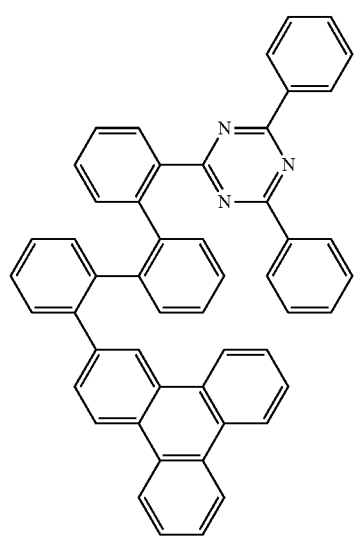
[Group B]
B-10
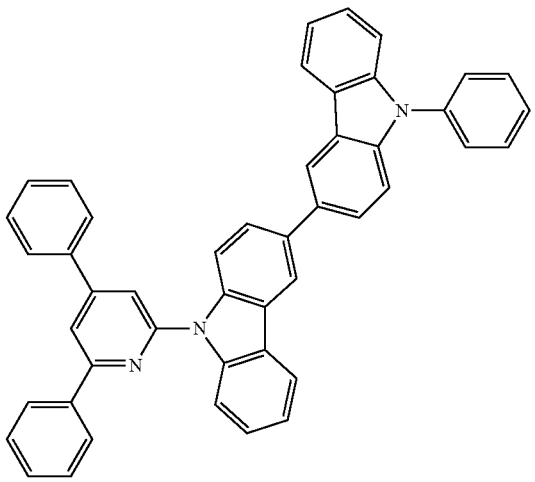
B-43
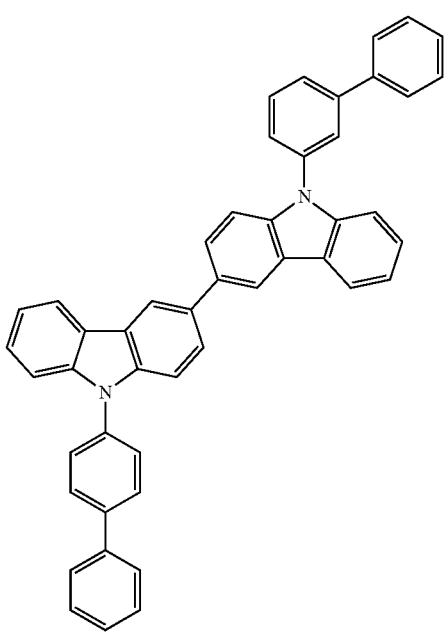
B-76
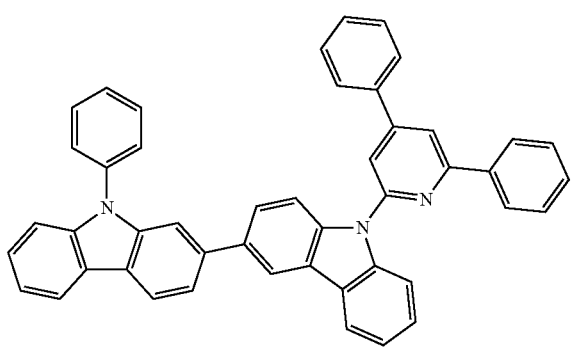

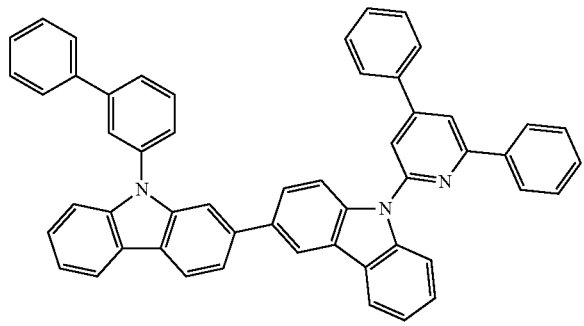

B-80

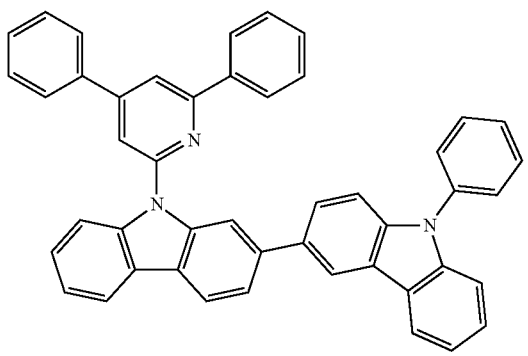

B-83

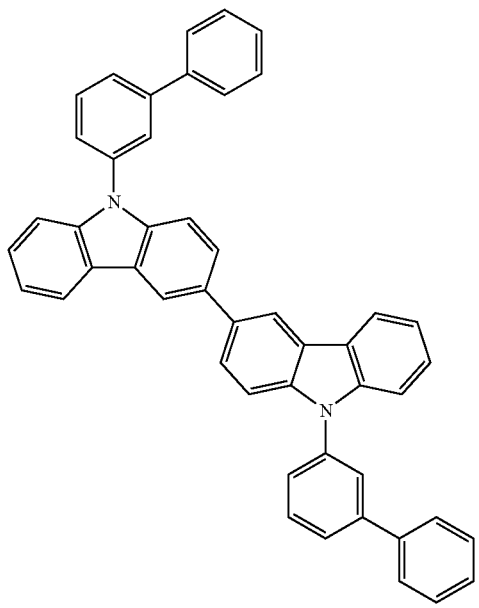

B-112

As described above, the first organic compound is a compound having relatively strong electron characteristics, the second organic compound is a compound having relatively strong hole characteristics, and they are pre-treated to form an organic alloy to increase mobility of electrons and holes and thus, to remarkably improve luminous efficiency compared with when the first compound or the second compound is used at alone.

When the single material having biased toward electron characteristics or biased toward hole characteristics is used to form an emission layer, excitons may be relatively more formed at an interface of an emission layer and the electron transport layer (ETL) or hole transport layer (HTL). As a result, the excitons in the emission layer may interact with charges at the interface of the electron transport layer (ETL) or the hole transport layer (HTL) and thus, cause a roll-off of sharply deteriorating efficiency and also, sharply deteriorate light emitting life-span characteristics. In order to solve this problem, the organic alloy of the first organic compound and the second organic compound is introduced into the emission layer to manufacture a device balancing carriers in the emission layer, so that a light emitting area may not be biased toward either the electron transport layer (ETL) or hole transport layer (HTL) and thus, remarkably improving roll-off and simultaneously life-span characteristics.

The organic alloy may be obtained by using the first organic compound and the second organic compound in a mole ratio, for example about 1:10 to about 10:1. As another examples, the organic alloy may be obtained by using the first organic compound and the second organic compound in a mole ratio of about 1:4 to about 4:1, or in a mole ratio of about 1:1.

Within the range, bipolar characteristics may be realized more efficiently and efficiency and life-span may be improved.

The organic alloy may be obtained by pre-treating the above first organic compound and second organic compound, or may be obtained by pre-treating at least one kind of an organic compound besides the above first organic compound and second organic compound.

The organic alloy may be used as an organic material for an organic optoelectric device, and may be used as, for example a light emitting material, a light absorbing material, a charge transport material, a charge injection material, a charge blocking material, or a combination thereof.

For example, the organic alloy may be used as a light emitting material for an organic optoelectric device. Herein, the organic alloy may be used as a host, and may further include at least one kind of a dopant. The dopant may be a red, green, or blue dopant, for example a phosphorescent dopant.

The dopant is mixed with the organic alloy in a small amount to cause light emission, and may be generally a material such as a metal complex that emits light by multiple excitation into a triplet or more. The dopant may be, for example an inorganic, organic, or organic/inorganic compound, and one or more kinds thereof may be used.

Examples of the phosphorescent dopant may be an organic metal compound including Ir, Pt, Os, Ti, Zr, Hf, Eu, Tb, Tm, Fe, Co, Ni, Ru, Rh, Pd, or a combination thereof. The phosphorescent dopant may be, for example a compound represented by the following Chemical Formula Z, but is not limited thereto.

$$L_2MX \qquad \text{[Chemical Formula Z]}$$

In the above Chemical Formula Z, M is a metal, and L and X are the same or different, and are a ligand to form a complex compound with M.

The M may be, for example Ir, Pt, Os, Ti, Zr, Hf, Eu, Tb, Tm, Fe, Co, Ni, Ru, Rh, Pd, or a combination thereof, and the L and X may be, for example a bidendate ligand.

The organic material may form a film using a dry film-forming method such as chemical vapor deposition or a solution process.

Hereinafter, an organic optoelectric device to which the organic material is applied is described.

The organic optoelectric device may be any device to convert electrical energy into photoenergy and vice versa without particular limitation, and may be, for example an organic photoelectric device, an organic light emitting diode, an organic solar cell, and an organic photo-conductor drum.

The organic optoelectric device includes an anode and a cathode facing each other, and at least one organic layer interposed between the anode and the cathode, wherein the organic layer includes the above organic material.

Herein, an organic light emitting diode as one example of an organic optoelectric device is described referring to drawings.

Figure 2:
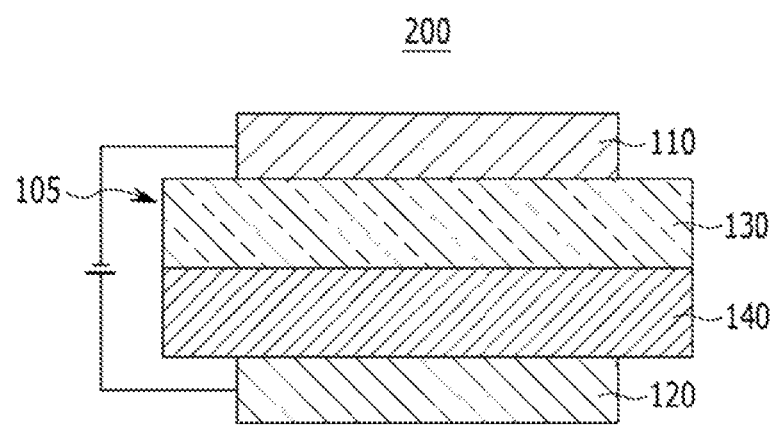

FIGS. 1 and 2 are cross-sectional views of each organic light emitting diode according to one embodiment.

Referring to FIG. 1, an organic light emitting diode 100 according to one embodiment includes an anode 120 and a cathode 110 facing each other and an organic layer 105 interposed between the anode 120 and cathode 110.

The anode 120 may be made of a conductor having a large work function to help hole injection, and may be for example metal, metal oxide and/or a conductive polymer. The anode 120 may be a metal such as nickel, platinum, vanadium, chromium, copper, zinc, gold, and the like or an alloy thereof; metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDOT), polypyrrole, and polyaniline, but is not limited thereto.

The cathode 110 may be made of a conductor having a small work function to help electron injection, and may be for example metal, metal oxide and/or a conductive polymer. The cathode 110 may be for example a metal or an alloy thereof such as magnesium, calcium, sodium, potassium, titanium, indium, yttrium, lithium, gadolinium, aluminum silver, tin, lead, cesium, barium, and the like; a multi-layer structure material such as LiF/Al, $LiO_2$/Al, LiF/Ca, LiF/Al and $BaF_2$/Ca, but is not limited thereto.

The organic layer 105 may include an emission layer 130 including the above organic material.

The emission layer 130 may include, for example the above organic material.

Referring to FIG. 2, an organic light emitting diode 200 further includes a hole auxiliary layer 140 as well as an emission layer 130. The hole auxiliary layer 140 may further increase hole injection and/or hole mobility between the anode 120 and emission layer 130 and block electrons. The hole auxiliary layer 140 may be, for example a hole transport layer (HTL), a hole injection layer (HIL), and/or an electron blocking layer (EBL), and may include at least one layer.

In one embodiment of the present invention, an organic light emitting diode may further include an electron transport layer (ETL), an electron injection layer (EIL), a hole injection layer (HIL), and the like, in an organic layer 105 in FIG. 1 or FIG. 2.

The organic light emitting diodes 100 and 200 may be manufactured by forming an anode or a cathode on a substrate, forming an organic layer in accordance with a dry coating method such as evaporation, sputtering, plasma plating, and ion plating; and forming a cathode or an anode thereon.

The organic light emitting diode may be applied to an organic light emitting diode (OLED) display.

MODE FOR INVENTION

Hereinafter, the embodiments are illustrated in more detail with reference to examples. These examples, however, are not in any sense to be interpreted as limiting the scope of the invention.

Preparation of Single Organic Compound

Synthesis of First Organic Compound: Compound A-33

Synthesis Example 1: Synthesis of Intermediate I-2

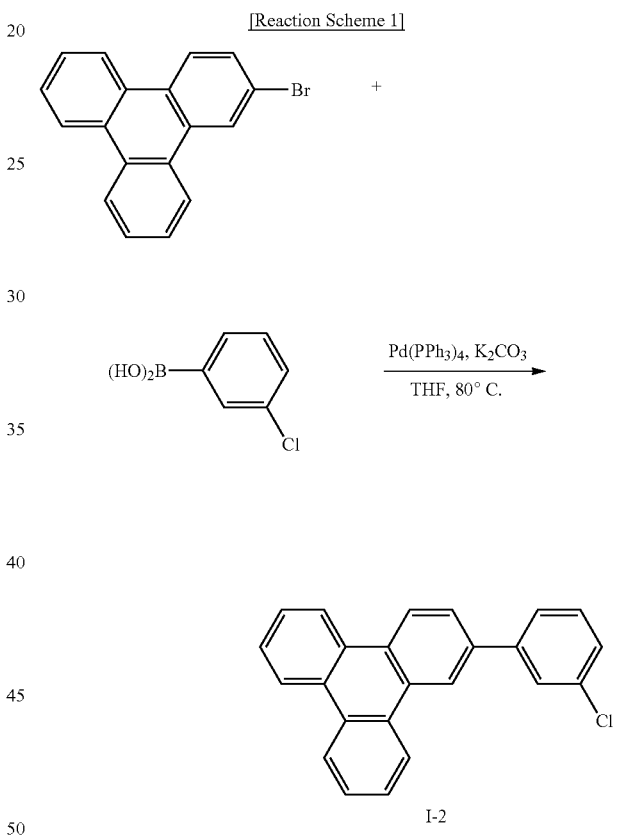

32.7 g (107 mmol) of 2-bromotriphenylene was dissolved in 0.3 L of tetrahydrofuran (THF) under a nitrogen atmosphere, 20 g (128 mmol) of 3-chlorophenylboronic acid and 1.23 g (1.07 mmol) of tetrakis(triphenylphosphine)palladium were added thereto, and the mixture was agitated. Subsequently, 36.8 g (267 mmol) of potassium carbonate saturated in water was added thereto, and the mixture was heated and refluxed at 80° C. for 24 hours. When the reaction was complete, water was added to the reaction solution, and the mixture was treated with dichloromethane (DCM) for extraction and with anhydrous $MgSO_4$ to remove moisture and then, filtered and concentrated under a reduced pressure. The obtained residue was separated and purified through flash column chromatography, obtaining 22.6 g (63%) of the compound I-2.

HRMS (70 eV, EI+): m/z calcd for C24H15Cl: 338.0862, found: 338.

Elemental Analysis: C, 85%; H, 5%

Synthesis Example 2: Synthesis of Intermediate I-3

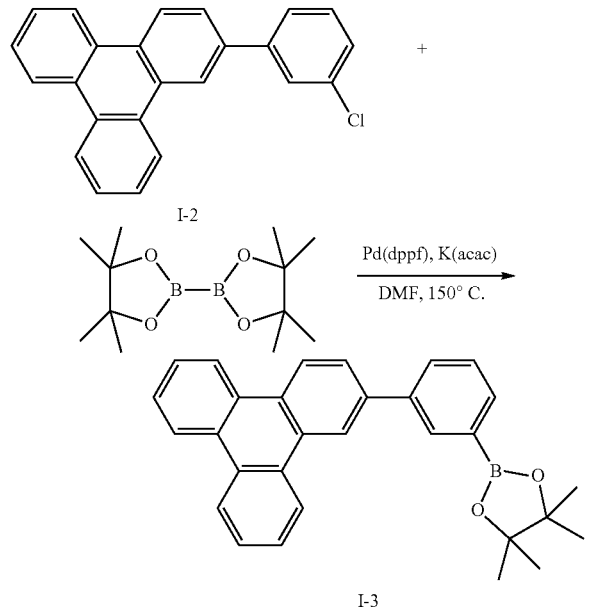

22.6 g (66.7 mmol) of the compound I-2 was dissolved in 0.3 L of dimethylformamide (DMF) under a nitrogen atmosphere, 25.4 g (100 mmol) of bis(pinacolato)diboron, 0.54 g (0.67 mmol) of (1,1'-bis(diphenylphosphine)ferrocene)dichloropalladium (II), and 16.4 g (167 mmol) of potassium acetate were added thereto, and the mixture was heated and refluxed at 150° C. for 48 hours. When the reaction was complete, water was added to the reaction solution, and the mixture was filtered and dried in a vacuum oven. The obtained residue was separated and purified through flash column chromatography, obtaining 18.6 g (65%) of a compound I-3.

HRMS (70 eV, EI+): m/z calcd for C30H27BO2: 430.2104, found: 430.

Elemental Analysis: C, 84%; H, 6%

Synthesis Example 3: Synthesis of Intermediate I-6

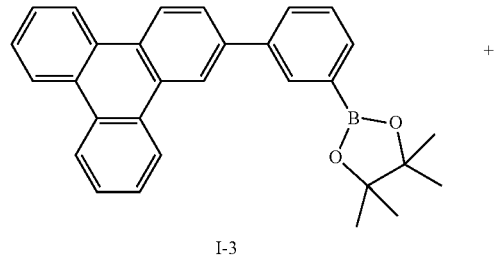

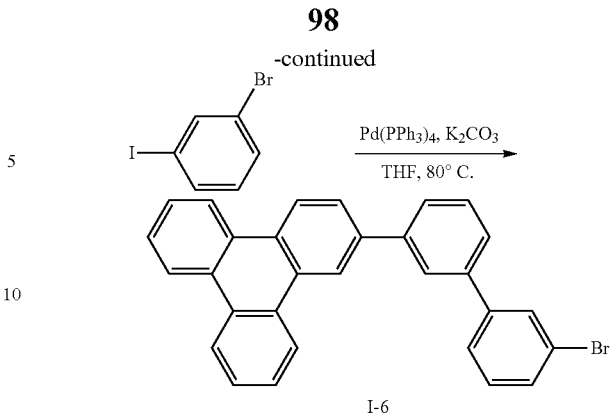

50 g (116 mmol) of the compound I-3 was dissolved in 0.5 L of tetrahydrofuran (THF) under a nitrogen atmosphere, 39.4 g (139 mmol) of 1-bromo-3-iodobenzene and 1.34 g (1.16 mmol) of tetrakis(triphenylphosphine) palladium were added thereto, and the mixture was agitated. Subsequently, 40.1 g (290 mmol) of potassium carbonate saturated in water was added thereto, and the mixture was heated and refluxed at 80° C. for 12 hours. When the reaction was complete, water was added to the reaction solution, and the mixture was treated dichloromethane (DCM) for extraction and treated with anhydrous MgSO4 to remove moisture and then, filtered and concentrated under a reduced pressure. The obtained residue was separated and purified through flash column chromatography, obtaining 42.6 g (80%) of the compound I-6.

HRMS (70 eV, EI+): m/z calcd for C30H19Br: 458.0670, found: 458.

Elemental Analysis: C, 78%; H, 4%

Synthesis Example 4: Synthesis of Intermediate I-7

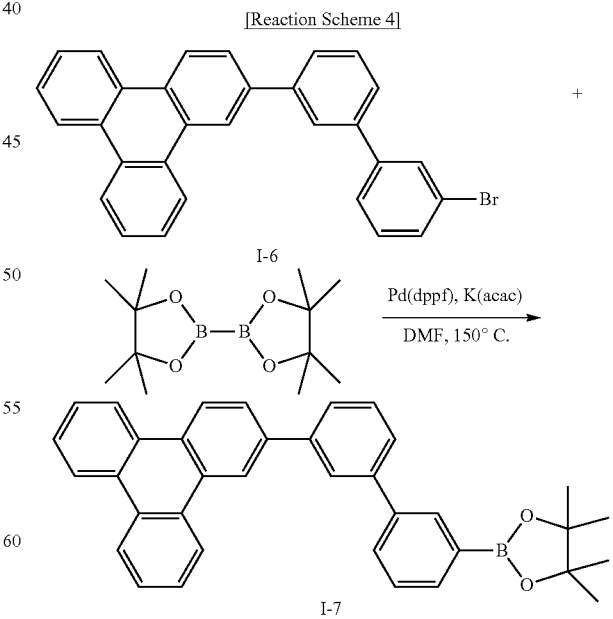

40 g (87.1 mmol) of the compound I-6 was dissolved in 0.3 L of dimethylformamide (DMF) under a nitrogen atmosphere, 26.5 g (104 mmol) of bis(pinacolato)diboron, 0.71 g (0.87 mmol) of (1,1'-bis(diphenylphosphine)ferrocene)dichloropalladium (II) and 21.4 g (218 mmol) of potassium acetate were added thereto, and the mixture was heated and refluxed at 150° C. for 26 hours. When the reaction was complete, water was added to the reaction solution, and the mixture was filtered and dried in a vacuum oven. The obtained residue was separated and purified through flash column chromatography, obtaining 34 g (77%) of the compound I-7.

HRMS (70 eV, EI+): m/z calcd for C36H31BO2: 506.2417, found: 506.

Elemental Analysis: C, 85%; H, 6%

Synthesis Example 5: Synthesis of Compound A-33

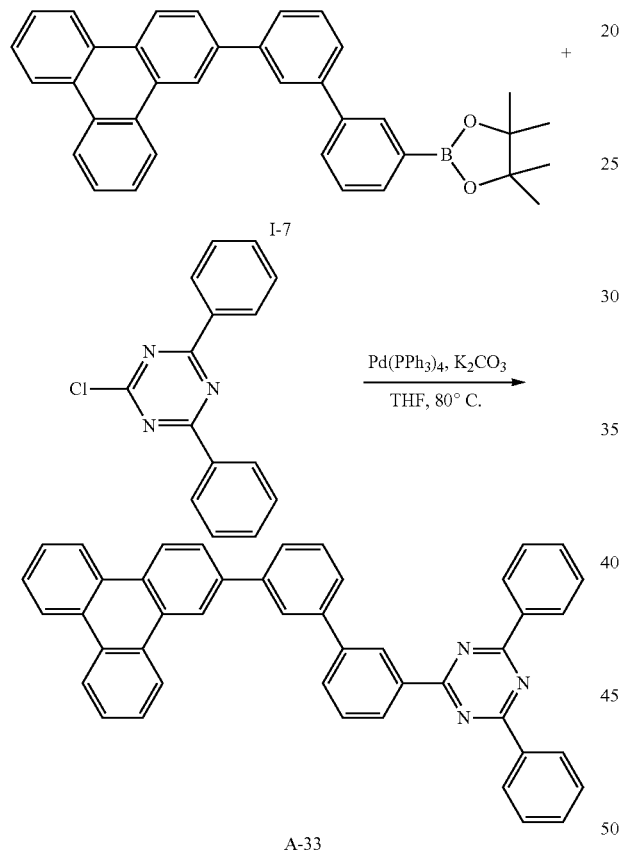

20 g (39.5 mmol) of the compound I-7 was dissolved in 0.2 L of tetrahydrofuran (THF) under a nitrogen atmosphere, 10.6 g (39.5 mmol) of 2-chloro-4,6-diphenyl-1,3,5-triazine and 0.46 g (0.4 mmol) of tetrakis(triphenylphosphine)palladium were added thereto, and the mixture was agitated. Subsequently, 13.6 g (98.8 mmol) of potassium carbonate saturated in water was added thereto, and the mixture was heated and refluxed at 80° C. for 23 hours. When the reaction was complete, water was added to the reaction solution, and the mixture was treated with dichloromethane (DCM) for extraction and with anhydrous MgSO4 to remove moisture and then, filtered and concentrated under a reduced pressure. The obtained residue was separated and purified through flash column chromatography, obtaining 17.9 g (74%) of the compound A-33.

HRMS (70 eV, EI+): m/z calcd for C45H29N3: 611.2361, found: 611.

Elemental Analysis: C, 88%; H, 5%

The compound A-33 had an evaporation temperature of about 226±10° C. under less than or equal to $10^{-3}$ Torr.

Synthesis Example 1 of Second Organic Compound: Compound B-10

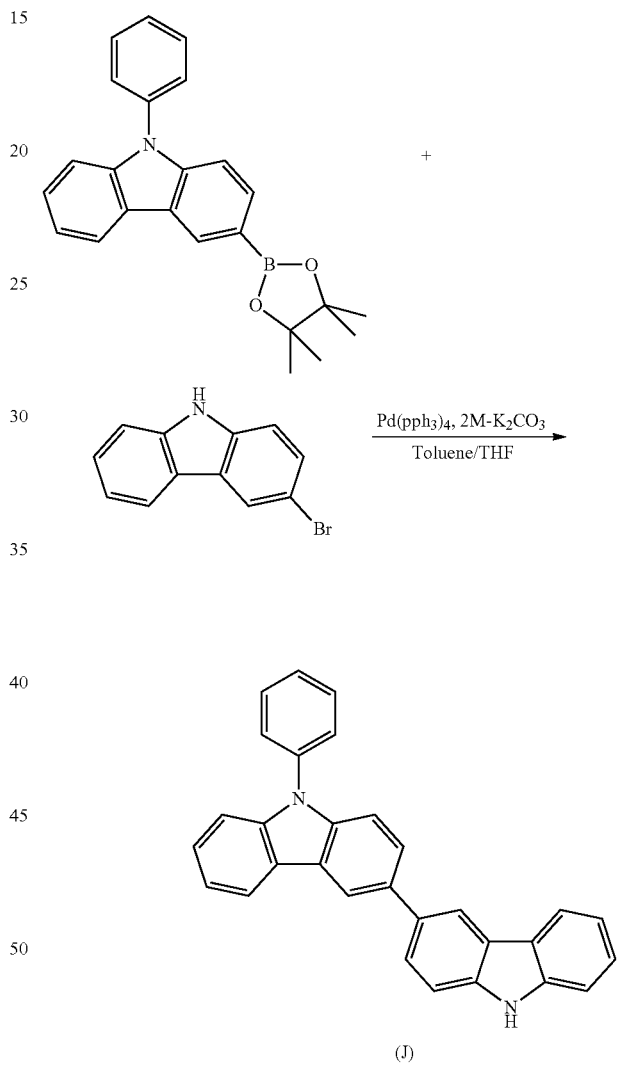

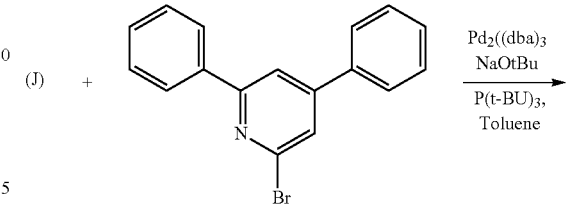

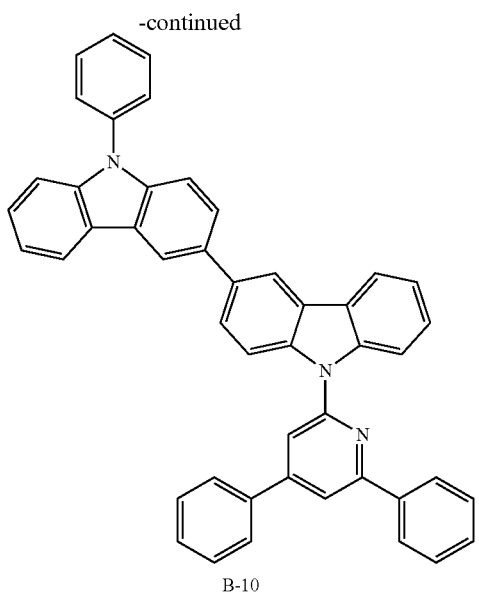

B-10

First Step: Synthesis of Compound J 26.96 g (81.4 mmol) of N-phenyl carbazole-3-boronic acid pinacolate, 23.96 g (97.36 mmol) of 3-bromo carbazole, and 230 mL of tetrahydrofuran were mixed with 100 ml of a 2 M-potassium carbonate aqueous solution, and the mixture was heated and refluxed under a nitrogen current for 12 hours. When the reaction was complete, a solid produced by pouring methanol to the reactant was filtered and dissolved in chlorobenzene again, activated carbon and anhydrous magnesium sulfate were added thereto, and the mixture was agitated. The solution was filtered and recrystallized by using chlorobenzene and methanol, obtaining 22.6 g of a compound J (a yield: 68%).

HRMS (70 eV, EI+): m/z calcd for C30H20N2: 408.16, found: 408.

Elemental Analysis: C, 88%; H, 5%

Second Step: Synthesis of Compound B-10

22.42 g (54.88 mmol) of the compound J, 20.43 g (65.85 mmol) of 2-bromo-4,6-diphenylpyridine, and 7.92 g (82.32 mmol) of tertiarybutoxysodium were dissolved in 400 ml of toluene, and 1.65 g (1.65 mmol) of palladium dibenzylideneamine and 1.78 g (4.39 mmol) of tri-tertiarybutylphosphine (P(t-Bu)₃) were added in a dropwise fashion. The reaction solution was heated 110° C. and agitated under a nitrogen current for 12 hours. When the reaction was complete, a solid produced by pouring methanol to the reactant was filtered and dissolved in chlorobenzene again, activated carbon and anhydrous magnesium sulfate were added thereto, and the mixture was agitated. The solution was filtered and recrystallized by using chlorobenzene and methanol, obtaining 28.10 g of a compound B-10 (a yield: 80%).

HRMS (70 eV, EI+): m/z calcd for C47H31N3: 637.25, found: 637.

Elemental Analysis: C, 89%; H, 5%

The compound B-10 had an evaporation temperature of about 225±10° C. under less than or equal to $10^{-3}$ Torr.

Synthesis Example 2 of Second Organic Compound: Compound B-43

[Reaction Scheme 7]

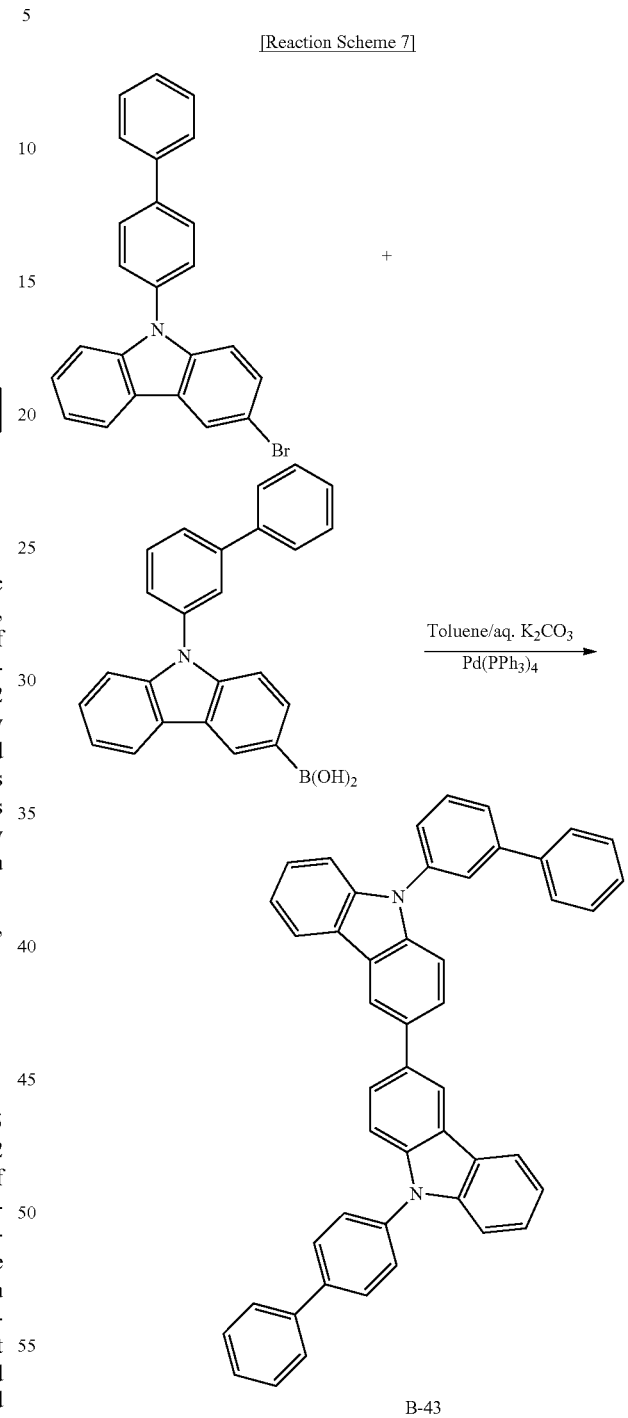

B-43

12.33 g (30.95 mmol) of biphenylcarbazolyl bromide, 12.37 g (34.05 mmol) of biphenylcarbazolylboronic acid, and 12.83 g (92.86 mmol) of potassium carbonate, and 1.07 g (0.93 mmmol) of tetrakis-(triphenylphosphine)palladium (0) were suspended in 120 ml of toluene and 50 ml of distilled water, and the suspended solution was refluxed and agitated for 12 hours. Subsequently, the reactant was extracted with dichloromethane and distilled water, and an organic layer obtained therefrom was filtered with silica gel. Subsequently, an organic solution therein was removed, and a solid product therefrom was recrystallized with dichloromethane and n-hexane, obtaining a compound B-43 18.7 g (a yield: 92%).

HRMS (70 eV, EI+): m/z calcd for C48H32N2: 636.26, found: 636.

Elemental Analysis: C, 91%; H, 5%

The compound B-43 had an evaporation temperature of about 232±10° C. under less than or equal to $10^{-3}$ Torr.

Example: Preparation of Organic Alloy

Example 1: Organic Alloy of Compound A-33 and Compound B-10

A powder-type organic alloy was obtained by putting the compound A-33 and the compound B-10 in a mole ratio of 1:1 in a vacuum chamber of less than or equal to $10^{-3}$ Torr, melting the compound A-33 and the compound B-10 by increasing temperature of the vacuum chamber, solidifying them by cooling down to room temperature of 25° C., and grinding the solid with a blender.

Example 2: Organic Alloy of Compound A-33 and Compound B-43

A powder-type organic alloy was obtained by putting the compound A-33 and the compound B-43 in a mole ratio of 1:1 in a vacuum chamber of less than or equal to $10^{-3}$ Torr, melting the compound A-33 and the compound B-43 by increasing temperature of the vacuum chamber, solidifying them by cooling down to room temperature of 25° C., and grinding the solid with a blender.

Comparative Example: Preparation of Single Compound and Simple Mixture

Comparative Example 1: Single Compound A-33

A powder-type compound A-33 was prepared by grinding the compound A-33 according to Synthesis Example 5 with a blender at room temperature (25° C.).

Comparative Example 2: Single Compound B-10

The powder-type compound B-10 was prepared by grinding the compound B-10 according to Synthesis Example 1 of a second organic compound at temperature (25° C.) with a blender.

Comparative Example 3: Simple Mixture of Compound A-33 and Compound B-10

The compound A-33 according to Synthesis Example 5 and the compound B-10 according to Synthesis Example 1 of a second organic compound were physically ground in a mole ratio of 1:1 with a blender, obtaining a simple mixture.

Comparative Example 4: Single Compound B-43

A powder-type compound B-43 was obtained by grinding the compound B-43 according to Synthesis Example 2 of a second organic compound at room temperature (25° C.) with a blender.

Comparative Example 5: Simple Mixture of Compound A-33 and Compound B-43

The compound A-33 according to Synthesis Example 5 and the compound B-43 according to Synthesis Example 1 of a second organic compound were physically ground in a mole ratio of 1:1 at room temperature (25° C.) with a blender, preparing a simple mixture.

Evaluation

Evaluation 1

Optical properties of the organic alloys according to Examples 1 and 2 and the organic materials according to Comparative Examples 1 to 5 were evaluated. The optical properties were evaluated by measuring photoluminescence (PL) spectrum of powders of the organic alloys according to Examples 1 and 2 and the organic materials according to Comparative Examples 1 to 5 with a Fluorescence spectrophotometer (F-4500, Hitachi). The powders were used as a sample, and herein, a solid sample holder of 650-0161 (Hitachi) was used as a PL holder.

Figure 3:
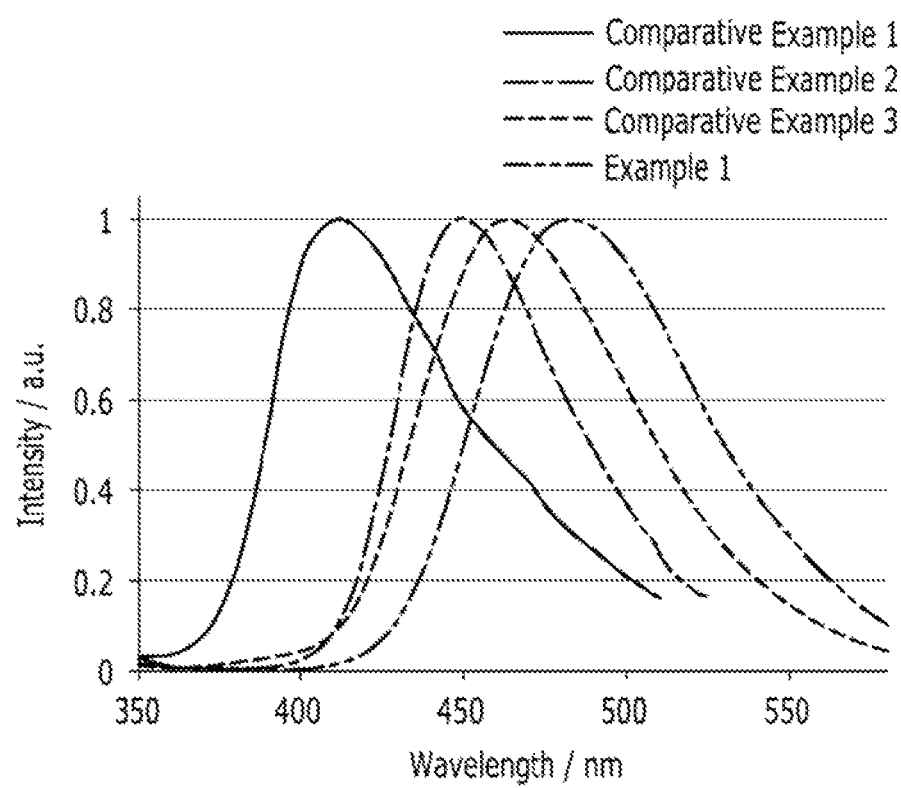
FIG. 3 is a graph showing light emitting characteristics of an organic alloy according to Example 1 and organic materials according to Comparative Examples 1 to 3 depending on a wavelength.
Figure 4:
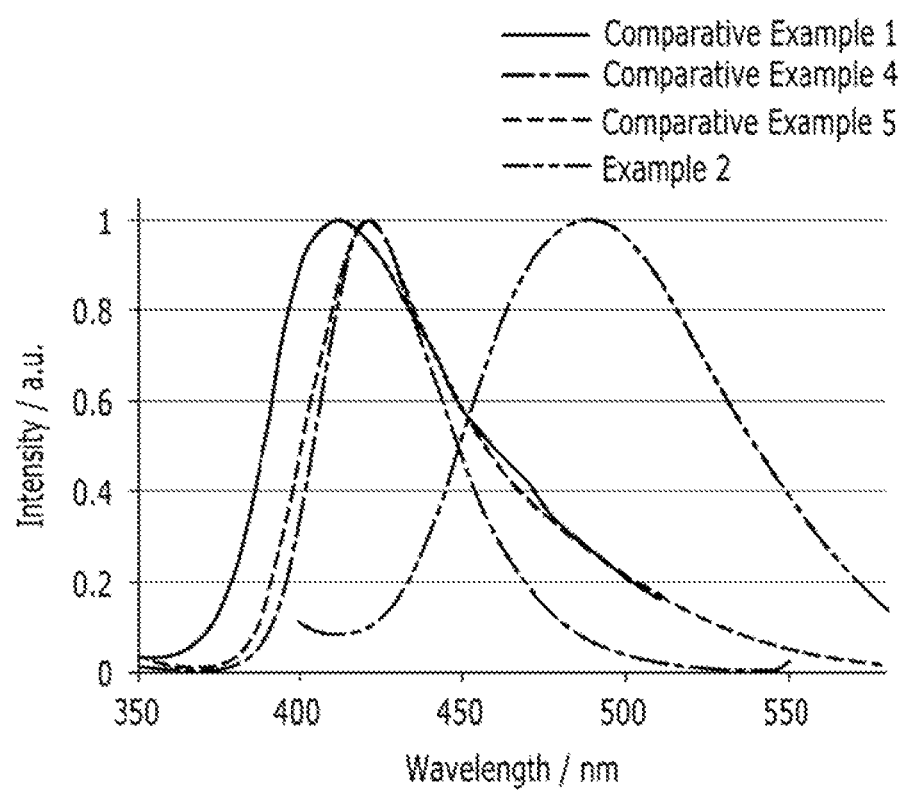
FIG. 4 is a graph showing light emitting characteristics of an organic alloy according to Example 2 and organic materials according to Comparative Examples 1, 4 and 5 depending on a wavelength.

The results are illustrated referring to FIGS. 3 and 4 and the following Tables 1 and 2.

FIG. 3 is a graph showing light emitting characteristics of the organic alloy according to Example 1 and the organic materials according to Comparative Examples 1 to 3 depending on a wavelength, and FIG. 4 is a graph showing light emitting characteristics of the organic alloy according to Example 2 and the organic materials according to Comparative Examples 1, 4, and 5 depending on a wavelength.

TABLE 1

| | Maximum light emitting wavelength | |
|---|---|---|
| | λmax (nm) | eV |
| Example 1 | 483 | 2.57 |
| Comparative Example 1 | 411 | 3.02 |
| Comparative Example 2 | 449 | 2.76 |
| Comparative Example 3 | 463 | 2.78 |

TABLE2

| | Maximum light emitting wavelength | |
|---|---|---|
| | λmax (nm) | eV |
| Example 2 | 488 | 2.55 |
| Comparative Example 1 | 411 | 3.02 |
| Comparative Example 4 | 420 | 2.95 |
| Comparative Example 5 | 421 | 2.95 |

Referring to FIGS. 3 and 4 and the Tables 1 and 2, the organic alloy of Example 1 showed different optical properties from the organic materials according to Comparative Examples 1 to 3, and the organic alloy of Example 2 showed different optical properties from the organic materials according to Comparative Examples 1, 4, and 5.

In particular, the organic alloy of Example 1 showed inherent optical properties differing from those of the first organic compound A-33 and the second organic compound B-10, for example, a maximum light emitting wavelength greater than or equal to about 20 nm moving toward a long wavelength, while the organic material of Comparative Example 3, that is, a simple mixture of the first organic compound A-33 and the second organic compound B-10, showed optical properties of the first organic compound A-33, the second organic compound B-10, or a combination thereof.

Likewise, the organic alloy of Example 2 showed inherent optical properties differing from those of the first organic compound A-33 and the second organic compound B-43, for example, a maximum light emitting wavelength greater than or equal to about 20 nm toward a long wavelength, while the organic material of Comparative Example 5, that is, a simple mixture of the first organic compound A-33 and the second organic compound B-43 showed optical properties of the first organic compound A-33, the second organic compound B-43, or a combination thereof.

In addition, the organic alloy according to Example 1 showed inherent energy level differing from those of the first organic compound A-33 and the second organic compound B-10, while the organic material of Comparative Example 3, that is, a mixture of the first organic compound A-33 and the second organic compound B-10, showed substantially similar energy level to that of the first organic compound A-33 or the second organic compound B-10.

Likewise, the organic alloy of Example 2 showed inherent energy level differing from those of first organic compound A-33 and the second organic compound B-43, while the organic material of Comparative Example 5, that is, a simple mixture of the first organic compound A-33 and the second organic compound B-43 showed substantially similar energy level to that of the first organic compound A-33 or the second organic compound B-43.

Evaluation 2

Thermodynamic characteristics of the organic alloys of Examples 1 and 2 and the organic materials of Comparative Examples 1 to 5 were evaluated. The thermodynamic characteristics of the organic alloys of Examples 1 and 2 and the organic materials of Comparative Examples 1 to 5 were measured through differential scanning calorimetry by using DSC1 (Mettler-Toledo Inc.).

The results are provided in Tables 3 and 4.

TABLE 3

| | Thermodynamic characteristics | | |
|---|---|---|---|
| | glass transition temperature (Tg, ° C.) | crystallization temperature (Tc, ° C.) | melting point (Tm, ° C.) |
| Example 1 | 122 | 215 | 261 |
| Comparative Example 1 | — | — | 287 |
| Comparative Example 2 | 133 | — | — |
| Comparative Example 3 | 133 | — | 255 |

TABLE 4

| | Thermodynamic characteristics | | |
|---|---|---|---|
| | glass transition temperature (Tg, ° C.) | crystallization temperature (Tc, ° C.) | melting point (Tm, ° C.) |
| Example 2 | 116 | 184 | 260 |
| Comparative Example 1 | — | — | 287 |
| Comparative Example 4 | 122 | — | — |
| Comparative Example 5 | 124 | — | 252 |

Referring to Tables 3 and 4, the organic alloy of Example 1 showed different thermodynamic characteristics from those of the organic materials of Comparative Examples 1 to 3, and the organic alloy of Example 2 showed different thermodynamic characteristics from the organic materials according to Comparative Examples 1, 4, and 5.

In particular, the organic alloy of Example 1 showed inherent thermodynamic characteristics differing from those of the first organic compound A-33, the second organic compound B-10, and a simple mixture thereof, while the organic material of Comparative Example 3, that is, a simple mixture of the first organic compound A-33 and the second organic compound B-10 showed substantially similar thermodynamic characteristics to those of the organic material of Comparative Example 2.

Likewise, the organic alloy of Example 2 showed different thermodynamic characteristics from those of the first organic compound A-33, the second organic compound B-43, and a simple mixture of the first organic compound A-33 and the second organic compound B-43, while the organic material of Comparative Example 5, a simple mixture of the first organic compound A-33 and the second organic compound B-43 showed substantially similar thermodynamic characteristics to those of the organic material of Comparative Example 4, that is, the second organic compound B-43.

Evaluation 3

Consistency of the thermodynamic characteristics of the organic alloy of Examples 1 and 2 and organic materials of Comparative Examples 3 and 5 was evaluated. The consistency of thermodynamic characteristics was evaluated by more than once measuring the thermodynamic characteristics of Evaluation 2 and seeing if the measurements were constant.

The results are illustrated referring to Tables 5 and 6.

TABLE 5

| | Comparative Example 3 | | | Example 1 | | | | |
|---|---|---|---|---|---|---|---|---|
| | #1 | #2 | #3 | #1 | #2 | #3 | #4 | #5 |
| Melting point (Tm, ° C.) | 259.9 | 255.2 | 280.1 | 260.7 | 261.4 | 260.1 | 261.3 | 261.3 |

TABLE 6

|  | Comparative Example 5 | | | Example 2 | | | | |
| --- | --- | --- | --- | --- | --- | --- | --- | --- |
|  | #1 | #2 | #3 | #1 | #2 | #3 | #4 | #5 |
| Melting point (Tm, ° C.) | 259.9 | 280.3 | 276.3 | 260.3 | 261.5 | 260.2 | 262.1 | 261.9 |

Referring to Tables 5 and 6, the organic alloys of Examples 1 and 2 showed constant melting points within an error range of ±5° C., especially, within an error range of ±2° C. over more than one measurement, while the organic materials of Comparative Examples 3 and 5 showed largely different melting points over the measurements, for example, within an error range of about 20° C. Accordingly, the organic alloys of Examples 1 and 2 showed more constant organic thermodynamic characteristics than a single organic compound or a simple mixture thereof.

Evaluation 4

Variation of the organic alloys according to Examples 1 and 2 with time during continuous process was evaluated.

The variation with time during continuous process was evaluated by continuously depositing the organic alloys of Examples 1 and 2 and the organic materials of Comparative Examples 3 and 5 on a glass substrate to form a plurality of films and examining if single organic compounds constantly maintained a ratio in each film through a high performance liquid chromatography (HPLC) analysis method. The variation with time during continuous process may be evaluated by seeing how much constantly a ratio among the components forming a film in a continuous process was managed.

The results are provided in Tables 7 and 8.

In the following Table 7, three samples of the organic alloy according to Example 1 were prepared and used to form each thin film by repeating three times a continuous process, and the thin films were respectively marked as Examples 1-1, 1-2, and 1-3, and in the following Table 8, two samples of the organic alloy according to Example 2 were prepared and used to form each thin film by three times or five times repeating a continuous process and the films were respectively marked as Examples 2-1 and 2-2.

TABLE 7

|  |  | Variation with time during continuous process | | | |
| --- | --- | --- | --- | --- | --- |
|  |  | A-33 (mol %) | B-10 (mol %) | A-33/B-10 | Variation ratio with time (%) |
| Example 1-1 | 1 | 52.2 | 47.8 | 1.09 | 2.67 |
|  | 2 | 52.6 | 47.4 | 1.11 |  |
|  | 3 | 52.8 | 47.2 | 1.12 |  |
| Example 1-2 | 1 | 53.3 | 46.7 | 1.14 | 1.90 |
|  | 2 | 53.5 | 46.5 | 1.15 |  |
|  | 3 | 53.8 | 46.2 | 1.16 |  |
| Example 1-3 | 1 | 53.1 | 46.9 | 1.13 | 2.90 |
|  | 2 | 53.7 | 46.3 | 1.16 |  |
|  | 3 | 53.8 | 46.2 | 1.16 |  |
| Comparative Example 3 | 1 | 50.7 | 49.3 | 1.03 | 11.02 |
|  | 2 | 53.4 | 46.6 | 1.14 |  |
|  | 3 | 53.6 | 46.4 | 1.16 |  |

TABLE 8

|  |  | Variation with time during continuous process | | | |
| --- | --- | --- | --- | --- | --- |
|  | sample No. | A-33 (mol %) | B-43 (mol %) | A-33/B-43 | Variation ratio with time (%) |
| Example 2-1 | 1 | 53.6 | 46.4 | 1.16 | 1.36 |
|  | 2 | 53.7 | 46.3 | 1.16 |  |
|  | 3 | 54.0 | 46.0 | 1.17 |  |
| Example 2-2 | 1 | 54.3 | 46.7 | 1.19 | 0.79 |
|  | 2 | 54.5 | 45.5 | 1.20 |  |
|  | 3 | 54.5 | 45.5 | 1.20 |  |
|  | 4 | 54.5 | 45.5 | 1.20 |  |
|  | 5 | 54.5 | 45.5 | 1.20 |  |
| Comparative Example 5 | 1 | 49.6 | 50.4 | 0.98 | 22.01 |
|  | 2 | 53.5 | 46.5 | 1.15 |  |
|  | 3 | 55.7 | 44.3 | 1.26 |  |

Referring to Tables 7 and 8, the films formed of the organic alloys according to Examples 1 and 2 showed almost constant ratio among single organic compounds, that is, A-33/6-10 or A-33/B-43 compared with the thin films formed of the organic materials according to Comparative Examples 3 and 5. Accordingly, a thin film formed of an organic alloy may be reproduced through a continuous process compared with a thin film formed of a simple mixture.

Manufacture of Organic Light Emitting Diode

Example 3

A glass substrate coated with a 1500 Å-thick ITO (Indium tin oxide) was cleaned with distilled water and an ultrasonic wave. When the glass substrate is cleaned with distilled water, glass substrate was ultrasonic wave-cleaned with a solvent such as isopropyl alcohol, acetone, methanol and the like and dried, and then, moved to a plasma cleaner, cleaned by using oxygen plasma for 10 minutes and to a vacuum depositor. This ITO transparent electrode was used as an anode, a 700 Å-thick hole injection layer (HIL) was formed on the ITO substrate by vacuum-depositing N4,N4'-diphenyl-N4,N4'-bis(9-phenyl-9H-carbazol-3-yl)biphenyl-4,4'-diamine (the compound A), and a hole transport layer (HTL) was formed by depositing 1,4,5,8,9,11-hexaazatriphenylene-hexacarbonitrile (HAT-CN) (the compound B) to be 50 Å thick and then, N-(biphenyl-4-yl)-9,9-dimethyl-N-(4-(9-phenyl-9H-carbazol-3-yl)phenyl)-9H-fluoren-2-amine (the compound C) to be 1020 Å thick on the injection layer. On the hole transport layer (HTL), a 400 Å-thick emission layer was formed by vacuum-depositing the organic alloy of Example 1 as a host doped with 10 wt % of tris(4-methyl-2,5-diphenylpyridine)iridium (III) (the compound D) as a dopant.

Subsequently, a 300 Å-thick electron transport layer (ETL) was formed on the emission layer by vacuum-depositing 8-(4-(4-(naphthalen-2-yl)-6-(naphthalen-3-yl)-1,3,5-triazin-2-yl)phenyl)quinoline (the compound E) and simultaneously hydroxyquinoline lithium (Liq) in a ratio of 1:1, and a cathode was formed on the electron transport layer (ETL) by sequentially vacuum-depositing Liq to be 15 Å thick and Al to be 1200 Å thick, manufacturing an organic light emitting diode.

The organic light emitting diode had a structure of five-story organic thin films and specifically, a structure of ITO/A 700 Å/B 50 Å/C 1020 Å/EML [organic alloy:D=X:10%] 400 Å/E:Liq 300 Å/Liq 15 Å/Al 1200 Å.

(X=weight ratio)

Example 4

An organic light emitting diode was manufactured according to the same method as Example 3 except for using the organic alloy of Example 2 instead of the organic alloy of Example 1.

Comparative Example 6

An organic light emitting diode was manufactured according to the same method as Example 3 except for using the organic material of Comparative Example 1, that is, the compound A-33 as a single host instead of the organic alloy of Example 1.

Comparative Example 7

An organic light emitting diode was manufactured according to the same method as Example 3 except for using the organic material of Comparative Example 2, that is, the compound B-10 as a single host instead of the organic alloy of Example 1.

Comparative Example 8

An organic light emitting diode was manufactured according to the same method as Example 3 except for using the organic material of Comparative Example 3, that is, a simple mixture of the compound A-33 and the compound B-10 instead of the organic alloy of Example 1.

Comparative Example 9

An organic light emitting diode was manufactured according to the same method as Example 3 except for using the organic material of Comparative Example 4, that is, the compound B-43 as a single host instead of the organic alloy of Example 1.

Comparative Example 10

An organic light emitting diode was manufactured according to the same method as Example 3 except for using the organic material of Comparative Example 5, that is, a simple mixture of the compound A-33 and the compound B-43 instead of the organic alloy of Example 1.

Evaluation 4

Luminous efficiency and life-span characteristics of the organic light emitting diodes according to Examples 3 and 4 and Comparative Examples 6 to 10 were evaluated.

The measurements were specifically performed in the following method, and the results were provided in the following Table 9 and Table 10.

(1) Measurement of Current Density Change Depending on Voltage Change

Current values flowing in the unit device of the manufactured organic light emitting diodes were measured for, while increasing the voltage from 0 V to 10 V using a current-voltage meter (Keithley 2400), and the measured current values were divided by an area to provide the results.

(2) Measurement of Luminance Change Depending on Voltage Change

Luminance of the manufactured organic light emitting diodes was measured for luminance, while increasing the voltage from 0 V to 10 V using a luminance meter (Minolta Cs-1000A).

(3) Measurement of Luminous Efficiency

Current efficiency (cd/A) at the same current density (10 mA/cm2) were calculated by using the luminance, current density, and voltages obtained from items (1) and (2).

(4) Measurement of Life-Span

Luminance ($cd/m^2$) was maintained at 6000 $cd/m^2$ and a time at current efficiency (cd/A) decreases to 97% was measured.

TABLE 9

| | Host | Luminous efficiency (cd/A) | Life-spanT97 (h) |
|---|---|---|---|
| Example3 | A-33 + B-10 organic alloy | 47.7 | 450 |
| Comparative Example6 | A-33 | 31.1 | 150 |
| Comparative Example7 | B-10 | 34.8 | 10 |
| Comparative Example8 | A-33 + B-10 simple mixture | 45.1 | 350 |

TABLE 10

| | Host | Luminous efficiency (cd/A) | Life-spanT97 (h) |
|---|---|---|---|
| Example4 | A-33 + B-43 organic alloy | 47.8 | 900 |
| Comparative Example6 | A-33 | 31.1 | 150 |
| Comparative Example9 | B-43 | 2.6 | 10 |
| Comparative Example10 | A-33 + B-43 simple mixture | 44.0 | 720 |

Referring to Tables 9 and 10, the organic light emitting diode of Example 3 showed equivalent or improved luminous efficiency and life-span characteristics compared with the organic light emitting diodes of Comparative Examples 6 to 8, and the organic light emitting diode of Example 4 showed equivalent or improved luminous efficiency and life-span characteristics compared with the organic light emitting diodes of Comparative Examples 6, 9, and 10. Accordingly, an organic light emitting diode using the organic alloy turned out to have equivalent or improved performance compared with an organic light emitting diode using a single organic compound or a simple mixture thereof.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

DESCRIPTION OF SYMBOLS 100, 200: organic light emitting diode
105: organic layer
110: cathode
120: anode
130: emission layer
140: hole auxiliary layer

The invention claimed is:

1. A method of manufacturing an organic light emitting device, the method comprising:
    providing an anode and a cathode, and forming an organic layer between the anode and the cathode, wherein the forming the organic layer includes:
    (a) heat-treating a first organic host compound and a second organic host compound together, and solidifying the heat-treated first and second organic host compounds through cooling to obtain a solidified host organic material, and
    (b) dry coating the solidified organic host material and a dopant to form the organic layer, the dry coating including one or more of evaporation, sputtering, plasma plating, and ion plating,
    wherein:
    the heat-treating of (a) is performed by subliming the first organic host compound and the second organic host compound, and
    a difference between evaporation temperatures of the first organic host compound and the second organic host compound is less than or equal to 20° C. as determined at a same pressure at less than or equal to $10^{-3}$ torr, wherein the evaporation temperatures of the respective first and second organic host compounds are determined as a temperature at which the respective one of the first and second organic host compounds deposits on a substrate at a rate of rate of about 0.5 to about 2 Å/sec under a vacuum of less than or equal to about $10^{-3}$ Torr.

2. The method of claim 1, wherein a maximum light emitting wavelength of the solidified organic host material is different from maximum light emitting wavelengths of the first organic host compound, the second organic host compound, and an untreated mixture of the first organic host compound and the second organic host compound, the maximum light emitting wavelengths being determined at a same condition.

3. The method of claim 1, further comprising: grinding the solidified organic host material to form a powdered organic host material, wherein the dry coating is performed using the powdered organic host material.

4. The method of claim 1, wherein the first organic host compound and the second organic host compound are included in a mole ratio of 1:10 to 10:1.

5. The method of claim 1, wherein the first organic host compound and the second organic host compound are included in a mole ratio of 1:1.

6. The method of claim 1, wherein the difference between evaporation temperatures of the first organic host compound and the second organic host compound is 0° C. to 10° C. as determined at a same pressure at less than or equal to $10^{-3}$ torr.

7. The method of claim 2, wherein the maximum light emitting wavelength of the solidified organic host material is shifted greater than or equal to 20 nm compared with the maximum light emitting wavelength of the untreated mixture of the first organic host compound and the second organic host compound.

8. The method of claim 2, wherein the solidified organic host material has a color with a longer wavelength region than wavelength regions of the first organic host compound, the second organic host compound, and the untreated mixture of the first organic host compound and the second organic host compound.

9. The method of claim 2, wherein the solidified organic host material has a different melting point (Tm) than melting points of the first organic host compound, the second organic host compound, and the untreated mixture of the first organic host compound and the second organic host compound.

10. The method of claim 9, wherein the solidified organic host material has a constant melting point (Tm).

11. The method of claim 1, wherein the solidified organic host material is present as a solid at room temperature.

12. The method of claim 1, wherein (a) is performed by:
    putting the first organic host compound and the second organic host compound in a mole ratio of 1:1 in a vacuum chamber at less than or equal to $10^{-3}$ Torr;
    subliming the first organic host compound and the second organic host compound by increasing temperature of the vacuum chamber; and
    solidifying the sublimed first and second organic host compounds through cooling to a temperature of 25° C. to yield the solidified organic host material.

13. The method of claim 1, wherein the organic layer includes an emission layer, and the emission layer includes the dry coated organic host material.

14. The method of claim 1, wherein the first organic host compound has electron characteristics, and the second organic host compound has hole characteristics.

15. The method of claim 1, wherein:
    the first organic host compound is represented by Chemical Formula 1, and the second organic host compound is represented by Chemical Formula 2,

[Chemical Formula 1]

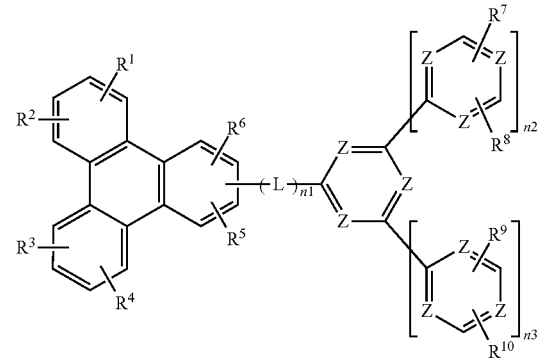

wherein, in Chemical Formula 1,
Z is independently N or $CR^a$,
at least one of Z is N,
$R^1$ to $R^{10}$ and $R^a$ are independently hydrogen, deuterium, a substituted or unsubstituted C1 to C10 alkyl group, a substituted or unsubstituted C6 to C12 aryl group, or a combination thereof,
L is a substituted or unsubstituted phenylene group, a substituted or unsubstituted biphenylene group or a substituted or unsubstituted terphenylene group, n1 to n3 are independently 0 or 1, and
n1+n2+n3≥1,

[Chemical Formula 2]

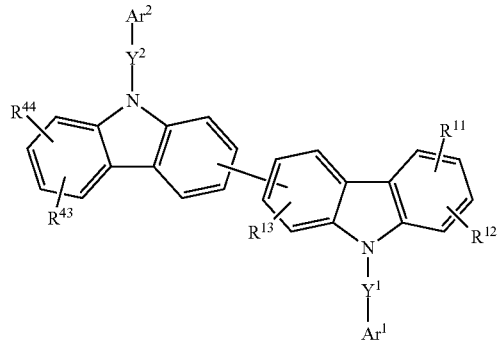

wherein, in Chemical Formula 2, $Y^1$ and $Y^2$ are independently a single bond, a substituted or unsubstituted C6 to C30 arylene group, a substituted or unsubstituted C2 to C30 heterocyclic group, or a combination thereof, $Ar^1$ and $Ar^2$ are independently substituted or unsubstituted C6 to C30 aryl group, a substituted or unsubstituted C2 to C30 heterocyclic group, or a combination thereof, and $R^{11}$ to $R^{13}$ and $R^{43}$ to $R^{44}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof.

16. The method of claim 15, wherein:

the first organic host compound is selected from Group A, and the second organic host compound is selected from Group B,

[Group A]

A-33

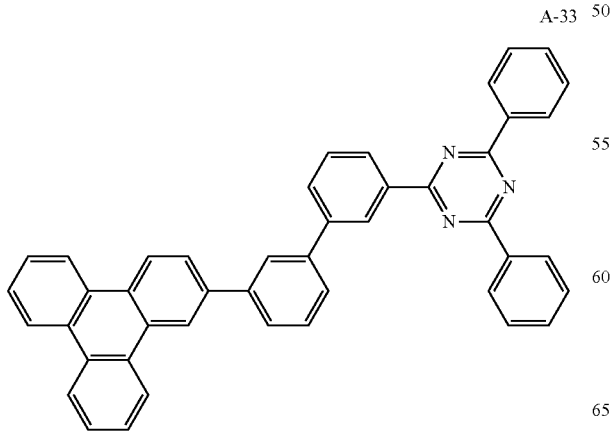

A-60

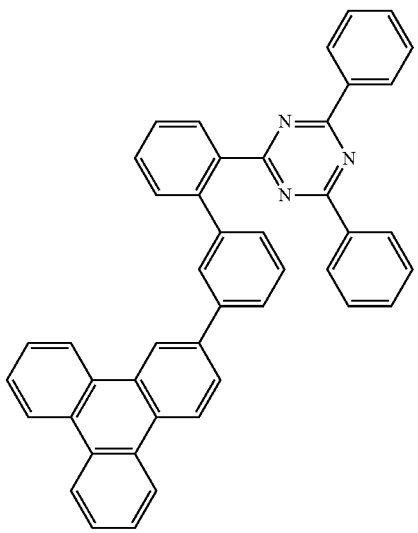

A-69

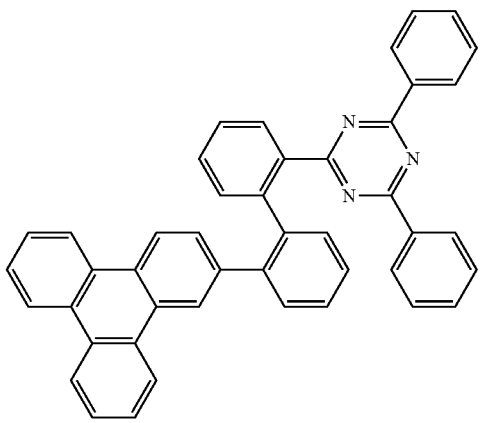

A-87

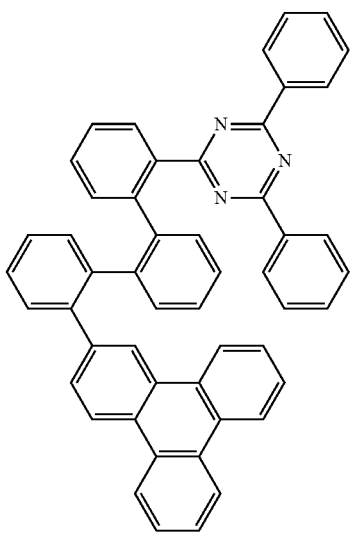

[Group B]

B-10
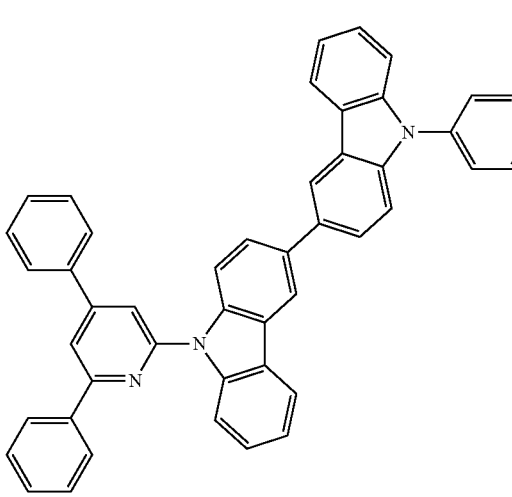

B-13
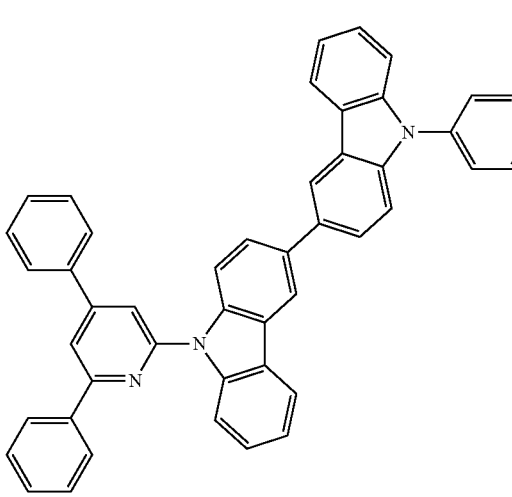

B-76
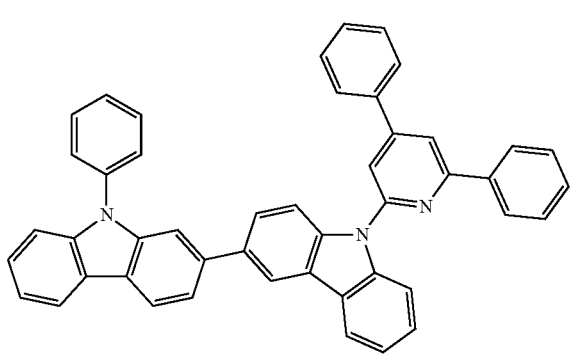

B-80
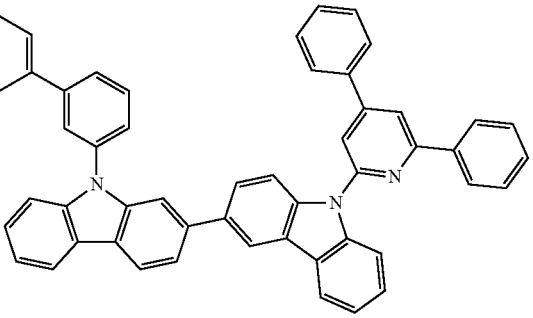

B-83
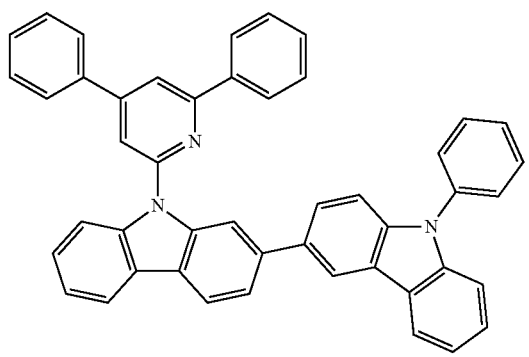

B-112
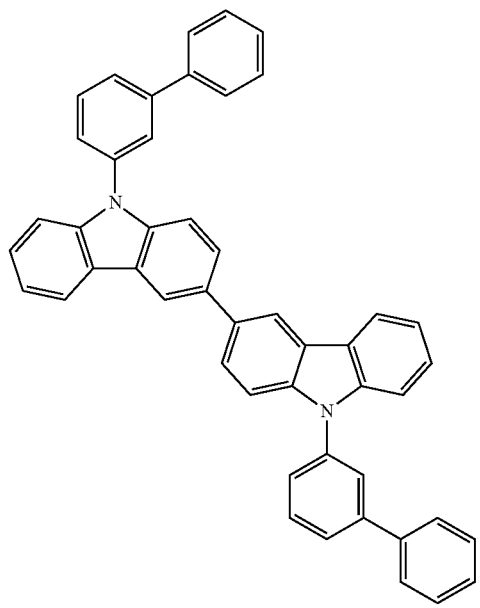

17. An organic light emitting device manufactured by the method of claim 1.

18. A display device comprising the organic light emitting device of claim 17.

19. A method of manufacturing an organic light emitting device, the method comprising:
  providing an anode and a cathode, and forming an organic layer between the anode and the cathode, wherein the forming the organic layer includes:
  (a) heat-treating a first organic host compound and a second organic host compound together, and solidifying the heat-treated first and second organic host compounds through cooling to obtain a solidified organic host material, and (b) dry coating the solidified organic host material and a dopant to form the organic layer, the dry coating including one or more of evaporation, sputtering, plasma plating, and ion plating, wherein:

the heat-treating of (a) is performed by subliming the first organic host compound and the second organic host compound, the first organic host compound is selected from Group A, and the second organic host compound is selected from Group B,

[Group A]

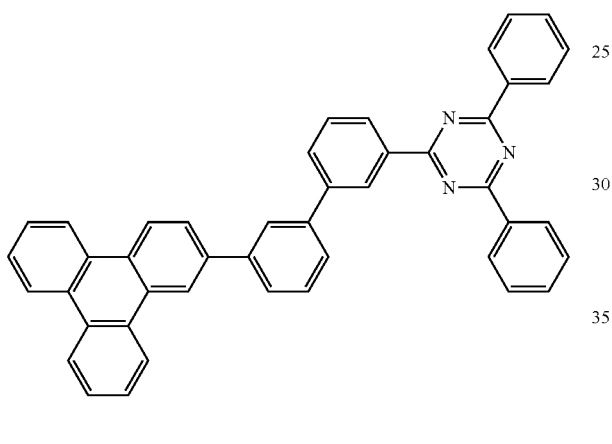

A-33

A-60

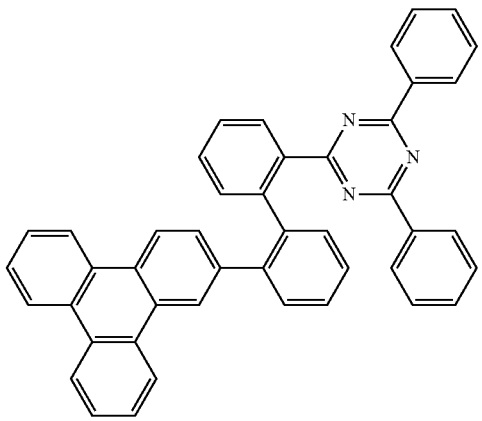

A-69

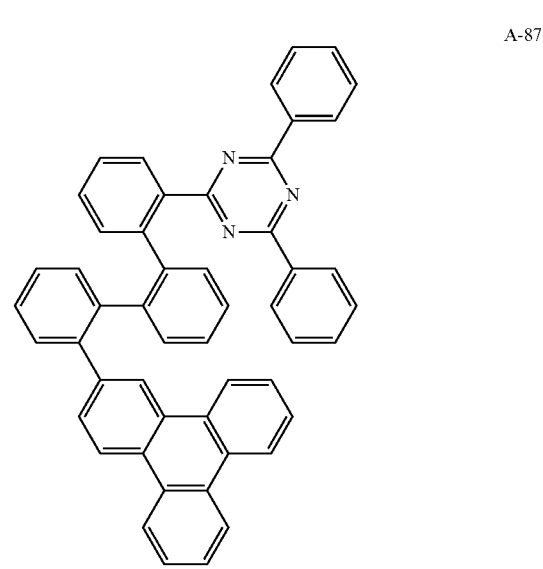

A-87

[Group B]

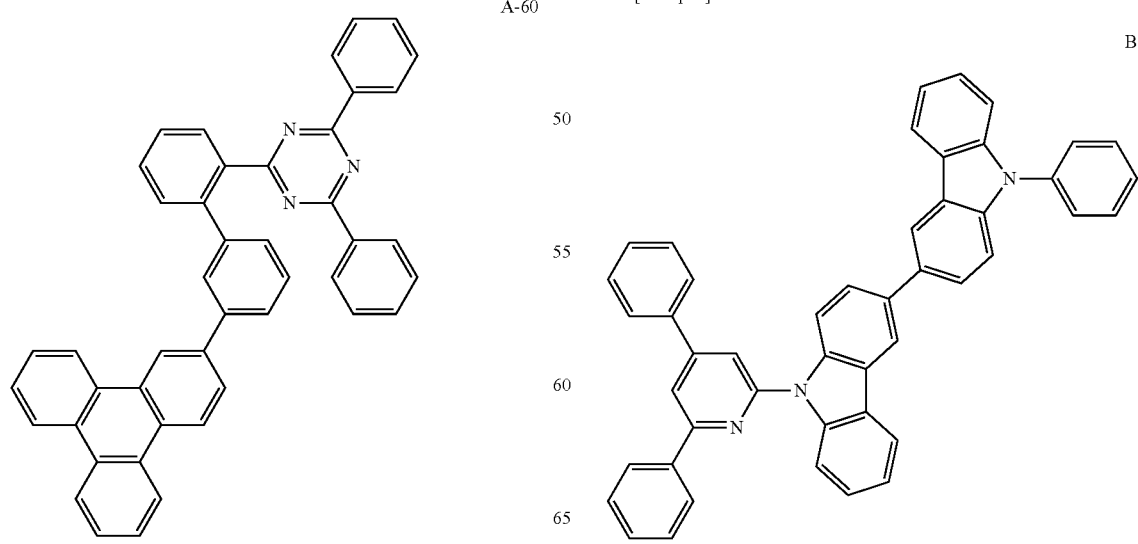

B-10

B-13
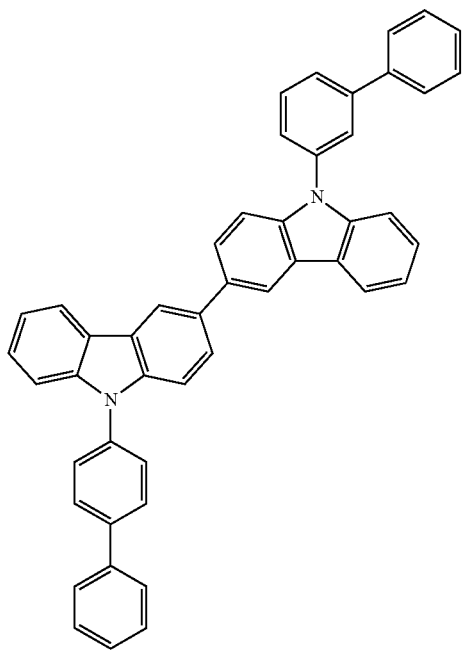
B-83
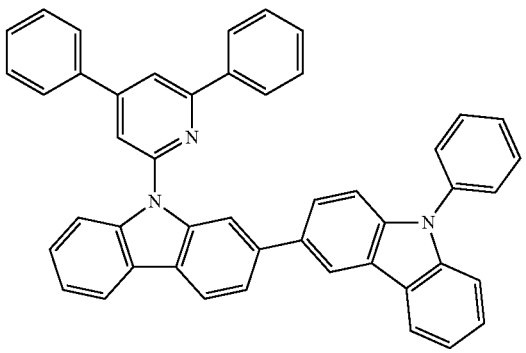
B-76
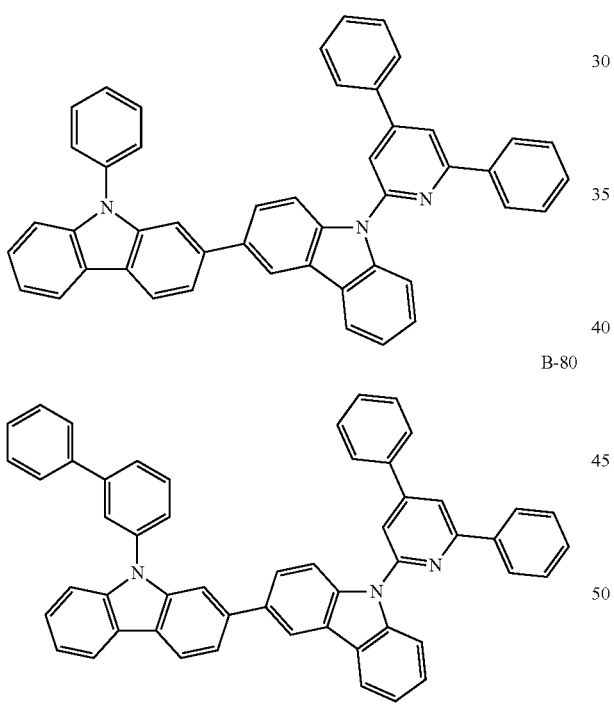
B-112
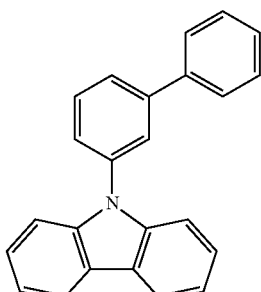
B-80
* * * * *